(12) United States Patent
Kim et al.

(10) Patent No.: US 11,340,663 B2
(45) Date of Patent: May 24, 2022

(54) FOLDABLE DISPLAY DEVICE

(71) Applicant: Samsung Electronics Co., Ltd., Suwon-si (KR)

(72) Inventors: Jong Yoon Kim, Suwon-si (KR); Jung Jin Kim, Suwon-si (KR); Young Sun Park, Yongin-si (KR); Chung Keun Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/313,399

(22) Filed: May 6, 2021

(65) Prior Publication Data
US 2021/0255672 A1    Aug. 19, 2021

Related U.S. Application Data

(63) Continuation of application No. 16/990,369, filed on Aug. 11, 2020, now Pat. No. 11,061,445, which is a
(Continued)

(30) Foreign Application Priority Data

Nov. 28, 2017  (KR) .................. 10-2017-0159793
Feb. 26, 2018  (KR) .................. 10-2018-0023001

(51) Int. Cl.
*G06F 1/16*      (2006.01)
*H05K 5/02*      (2006.01)
(Continued)

(52) U.S. Cl.
CPC .......... *G06F 1/1681* (2013.01); *G06F 1/1616* (2013.01); *G06F 1/1641* (2013.01);
(Continued)

(58) Field of Classification Search
CPC .... G06F 1/1681; G06F 1/1616; G06F 1/1641; G06F 1/1652; H05K 5/0226; H04M 1/0268; H04M 1/022
See application file for complete search history.

(56) References Cited

U.S. PATENT DOCUMENTS 7,032,984 B2   4/2006  Kim et al.
7,311,366 B2   12/2007 Kim et al.
(Continued)

FOREIGN PATENT DOCUMENTS

CN    1383503 A    12/2002
CN    201781516 U   3/2011
(Continued)

OTHER PUBLICATIONS

International Search Report dated Feb. 22, 2019, issued in International Application No. PCT/KR2018/014637.
(Continued)

*Primary Examiner* — Nidhi Thaker
(74) *Attorney, Agent, or Firm* — Jefferson IP Law, LLP

(57) ABSTRACT

An electronic device is provided. The electronic device includes two housing structures, a hinge structure, and a flexible display, the hinge structure includes a first saw-toothed spur gear, a second saw-toothed spur gear, a third saw-toothed spur gear, a fourth saw-toothed spur gear, a first guide structure fixed to the first housing structure and rotated by the gears, and a second guide structure fixed to the second housing structure and rotated in an opposite direction of the first guide structure, the first guide structure is rotated about a first axis formed from a bottom surface of the flexible display upwards, and the second guide structure is rotated about a second axis that is spaced apart from the first axis and is formed from the bottom surface of the flexible display.

22 Claims, 41 Drawing Sheets

Related U.S. Application Data continuation of application No. 16/199,743, filed on Nov. 26, 2018, now Pat. No. 10,775,852.

(51) Int. Cl.
*H04M 1/02* (2006.01)
*H05K 5/00* (2006.01)

(52) U.S. Cl.
CPC .......... *G06F 1/1652* (2013.01); *H04M 1/022* (2013.01); *H04M 1/0268* (2013.01); *H05K 5/0226* (2013.01); *G06F 1/1679* (2013.01); *G06F 2203/04102* (2013.01); *H04M 1/0216* (2013.01); *H05K 5/0017* (2013.01)

(56) References Cited

U.S. PATENT DOCUMENTS

| | | | |
|---|---|---|---|
| 8,493,730 B2 | 7/2013 | Shim et al. | |
| 9,164,547 B1 | 10/2015 | Kwon et al. | |
| 9,173,288 B1 | 10/2015 | Kim | |
| 9,179,559 B1 | 11/2015 | Kim | |
| 9,204,565 B1* | 12/2015 | Lee | E05D 3/022 |
| 9,268,372 B1 | 2/2016 | Hsu | |
| 9,294,597 B2 | 3/2016 | Tan et al. | |
| 9,348,450 B1 | 5/2016 | Kim | |
| 9,442,533 B2 | 9/2016 | Lee et al. | |
| 9,600,035 B2 | 3/2017 | Park et al. | |
| 9,609,095 B2 | 3/2017 | Chuang | |
| 9,677,308 B1* | 6/2017 | Chen | G06F 1/1681 |
| 9,683,398 B2 | 6/2017 | Chuang | |
| 9,720,447 B2 | 8/2017 | In-Sung et al. | |
| 9,760,126 B2 | 9/2017 | Shin et al. | |
| 9,801,290 B2 | 10/2017 | Ahn | |
| 9,823,706 B2 | 11/2017 | Chen et al. | |
| 9,952,631 B2 | 4/2018 | Xin et al. | |
| 9,983,424 B2 | 5/2018 | Kim et al. | |
| 10,000,955 B2 | 6/2018 | Shang | |
| 10,028,395 B2* | 7/2018 | Chen | H05K 5/0217 |
| 10,133,303 B2 | 11/2018 | Park et al. | |
| 10,227,808 B2 | 3/2019 | Siddiqui | |
| 10,429,896 B2 | 10/2019 | Kuramochi | |
| 10,495,941 B2 | 12/2019 | Hashimoto et al. | |
| 10,727,435 B2 | 7/2020 | Kim et al. | |
| 2002/0104769 A1* | 8/2002 | Kim | G06F 1/1637 206/320 |
| 2006/0138913 A1 | 6/2006 | Kim et al. | |
| 2011/0063783 A1* | 3/2011 | Shim | G06F 1/1681 361/679.01 |
| 2014/0213324 A1 | 7/2014 | Tan et al. | |
| 2015/0153780 A1* | 6/2015 | Maatta | G06F 1/1656 361/679.27 |
| 2016/0048174 A1 | 2/2016 | Hsu | |
| 2016/0062412 A1* | 3/2016 | Park | G06F 1/1616 361/679.27 |
| 2016/0070306 A1 | 3/2016 | Shin et al. | |
| 2016/0097227 A1* | 4/2016 | Hsu | F16B 1/00 16/354 |
| 2016/0138310 A1 | 5/2016 | Chuang | |
| 2016/0165024 A1 | 6/2016 | Tan et al. | |
| 2016/0187934 A1 | 6/2016 | Lee et al. | |
| 2016/0205792 A1 | 7/2016 | Ahn | |
| 2016/0222707 A1 | 8/2016 | Chuang | |
| 2016/0357052 A1 | 12/2016 | Kim et al. | |
| 2017/0023985 A1 | 1/2017 | Xin et al. | |
| 2017/0131741 A1 | 5/2017 | In-Sung et al. | |
| 2017/0145725 A1 | 5/2017 | Siddiqui | |
| 2017/0235337 A1 | 8/2017 | Vic et al. | |
| 2017/0257961 A1 | 9/2017 | Chen et al. | |
| 2017/0275935 A1 | 9/2017 | Shang | |
| 2017/0317309 A1 | 11/2017 | Yang et al. | |
| 2018/0210496 A1* | 7/2018 | Lin | H04M 1/0214 |
| 2018/0239394 A1 | 8/2018 | Vic et al. | |
| 2018/0335679 A1 | 11/2018 | Hashimoto et al. | |
| 2019/0036068 A1 | 1/2019 | Kim et al. | |
| 2019/0086965 A1 | 3/2019 | Kuramochi | |
| 2019/0158644 A1 | 5/2019 | Tan et al. | |
| 2020/0321551 A1 | 10/2020 | Kim et al. | |

FOREIGN PATENT DOCUMENTS

| | | | |
|---|---|---|---|
| CN | 204515586 U | 7/2015 | |
| CN | 105448194 A | 3/2016 | |
| CN | 105830140 A | 8/2016 | |
| CN | 106205385 A | 12/2016 | |
| CN | 106252378 A | 12/2016 | |
| CN | 106371499 A | 2/2017 | |
| CN | 106683572 A | 5/2017 | |
| CN | 107170373 A | 9/2017 | |
| CN | 206584255 U | 10/2017 | |
| CN | 107358874 A | 11/2017 | |
| EP | 3 109 847 A1 | 12/2016 | |
| EP | 3 174 034 A1 | 5/2017 | |
| JP | 5801607 B2 | 10/2015 | |
| KR | 10-2014-0050504 A | 4/2014 | |
| KR | 10-2014-0091271 A | 7/2014 | |
| KR | 10-2014-0091272 A | 7/2014 | |
| KR | 10-2014-0091274 A | 7/2014 | |
| KR | 10-2015-0096946 A | 8/2015 | |
| KR | 10-2016-0027625 A | 3/2016 | |
| KR | 10-2016-0027626 A | 3/2016 | |
| KR | 10-2016-0083608 A | 7/2016 | |
| KR | 10-2016-0087972 A | 7/2016 | |
| KR | 10-2016-0121350 A | 10/2016 | |
| KR | 10-2017-0033626 A | 3/2017 | |
| KR | 10-2017-0077096 A | 7/2017 | |
| KR | 10-1834793 B1 | 3/2018 | |
| KR | 10-2019-0033447 A | 3/2019 | |
| WO | 2016/140524 A1 | 9/2016 | |
| WO | WO-2016140524 A1 * | 9/2016 | H04M 1/02 |

OTHER PUBLICATIONS

European Search Report dated Apr. 25, 2019, issued in European Patent Application No. 18208821.1.
European Search Report dated Nov. 24, 2020; European Appln. No. 20186978.1-1203.
English translation of Chinese Office Action dated Feb. 23, 2021; Chinese Appln. No. 202010770909.0.
Indian Office Action dated Mar. 25, 2021; Indian Appln. No. 202047008620.
Chinese Office Action with English translation dated May 8, 2021; Chinese Appln. No. 201811432452.1.
European Search Report dated Sep. 27, 2021; European Appln. No. 20 186 978.1-1203.
Korean Office Action with English translation dated Sep. 29, 2021; Korean Appln. No. 10-2020-0067153.
European Search Report dated Oct. 18, 2021; European Appln. No. 21179532.3-1203.
Chinese Office Action with English translation dated Jan. 24, 2022; Chinese Appln. No. 201811432452.1.

* cited by examiner

<931>

<933>

FOLDABLE DISPLAY DEVICE

CROSS-REFERENCE TO RELATED APPLICATION(S)

This application is a continuation application of prior application Ser. No. 16/990,369, filed on Aug. 11, 2020, which is a continuation application of prior application Ser. No. 16/199,743, filed on Nov. 26, 2018, which has issued as U.S. Pat. No. 10,775,852 on Sep. 15, 2020 and is based on and claims priority under 35 U.S.C § 119(a) of a Korean Patent Application number 10-2018-0023001, filed on Feb. 26, 2018 and a Korean Patent Application number 10-2017-0159793, filed on Nov. 28, 2017, in the Korean Intellectual Property Office, the disclosure of each of which is incorporated by reference herein its entirety.

BACKGROUND

1. Field

The disclosure relates to a foldable display device.

2. Description of Related Art

A portable electronic device, such as a smartphone, may provide various functions, such as voice communication, playback of videos, and search through the internet, based on various kinds of applications. The user may intend to use the above-mentioned functions through a wider screen. However, as the screen becomes larger, portability may deteriorate. Accordingly, according to the related art, a foldable portable electronic device that may enhance portability by utilizing a foldable structure as illustrated in FIG. 23 has been suggested.

FIG. 23 is a view illustrating an example of a foldable electronic device according to the related art.

Referring to FIG. 23, the foldable electronic device according to the related art may include a display 2360, housings 2311 and 2312, and hinge parts 2321 and 2322.

The display 2360 is configured such that the center of the display 2360 is foldable. The housings 2311 and 2312 are configured to surround an outskirt of the display 2360, and electronic elements related to driving of the display 2360 may be positioned in the interiors of the housings 2311 and 2312. The hinge parts 2321 and 2322 are disposed at the central lateral sides of the housings 2311 and 2312 to support the first housing 2311 and the second housing 2312 while the display 2360 is unfolded to 180 degrees or is folded to 0 degrees again.

The above information is presented as background information only to assist with an understanding of the disclosure. No determination has been made, and no assertion is made, as to whether any of the above might be applicable as prior art with regard to the disclosure.

SUMMARY

The above-mentioned foldable electronic device according to the related art may have a structure in which the hinge parts 2321 and 2322 are disposed on side surfaces of the central seam of the first housing 2311 and the second housing 2312. Then, because the centers of rotation of the hinge parts 2321 and 2322 are located below the display while the hinge parts 2321 and 2322 support the first housing 2311 and the second housing 2312, the display is introduced into the housings when being folded. Accordingly, because the hinge parts 2321 and 2311 cannot be located below the display and accordingly are disposed on side surfaces of the display to have a specific width or more and a specific extent or more, partial areas (e.g., bezels) of the housings, which surround an outskirt of the display 2360 may unnecessarily increase.

Further, according to the foldable electronic device according to the related art, it is difficult to deal with the external appearance of the electronic device when the change of the extended length of the display is coped with by multiple joints.

Aspects of the disclosure are to address at least the above-mentioned problems and/or disadvantages and to provide at least the advantages described below. Accordingly, an aspect of the disclosure is to provide a foldable display device that may minimize the size of a bezel area by disposing a hinge structure below a display.

Another aspect of the disclosure is to provide a foldable display device that may make an external appearance thereof appealing through one hinge housing.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first housing structure and a second housing structure, wherein the first housing structure includes a first surface and a second surface that is opposite to the first surface, wherein the second housing structure includes a third surface and a fourth surface that is opposite to the third surface, and wherein the first housing structure and the second housing structure are foldable with respect to each other, and the third surface faces the first surface in a folded state and the first surface and the third surface may face the same direction in an unfolded state, a hinge structure connecting a first peripheral part of the first housing structure to a second peripheral part of the second housing structure, and a flexible display layer extending across at least a portion of the first surface and at least a portion of the third surface and being foldable in the first peripheral part and the second peripheral part or an adjacent area of the first peripheral part and the second peripheral part, wherein the hinge structure includes a first shaft including a first saw-toothed spur gear that rotates about a first axis that is parallel to the first surface, a second shaft including a second saw-toothed spur gear that rotates about a second axis that is parallel to the first axis, a third saw-toothed spur gear engaged with the first saw-toothed spur gear to be rotatable, a fourth saw-toothed spur gear engaged with the second saw-toothed spur gear and the third saw-toothed spur gear to be rotatable, a first guide structure fixed to the first housing structure and including a first curved opening having a first saw-toothed inner spur gear that is engaged with the first saw-toothed spur gear and is not engaged with any one of the second saw-toothed spur gear, the third saw-toothed spur gear, and the fourth saw-toothed spur gear, and configured to rotate about a third axis (or a first imaginary axis) that is parallel to the first axis, and a second guide structure fixed to the second housing structure and including a second curved opening having a second saw-toothed inner spur gear that is engaged with the second saw-toothed spur gear and is not engaged with any one of the first saw-toothed spur gear, the third saw-toothed spur gear, and the fourth saw-toothed spur gear, and configured to rotate about a fourth axis (or a second imaginary axis) that is parallel to the first axis and offset from the first imaginary axis.

In accordance with another aspect of the disclosure, a foldable display device is provided. The foldable display device includes a first housing, a second housing, a display disposed on the first housing and the second housing, a hinge structure coupled to a side of the first housing and a side of the second housing and disposed under the display, and a hinge housing surrounding the hinge structure, wherein the hinge structure includes center brackets having an semielliptical shape, a first inner bracket gear configured to be rotatable along a first curve through a first main gear on first sides of the center brackets, and a second inner bracket gear configured to be rotatable along a second curve through a second main gear on second sides opposite to the first sides of the center brackets.

In accordance with another aspect of the disclosure, a foldable display device is provided. The foldable display device includes a display, a first housing supporting an upper area or an area of one side of the center of the display, a second housing supporting a lower area or an area of another side opposite to said one side of the center of the display, and a hinge structure disposed between the first housing and the second housing and configured to be coupled to the first housing and the second housing and disposed under the display, wherein the hinge structure has a first rotation axis (or a first imaginary rotation axis) about which the first housing is rotated and a second rotation axis (or a second imaginary rotation axis) about which the second housing is rotated, wherein the first rotation axis and the second rotation axis are spaced apart from a bottom surface of the display by a specific height.

The foldable display device according to various embodiments of the disclosure may minimize a bezel area that surround a display while a hinge structure is disposed under the display. In correspondence, the foldable display device of the disclosure may maximize the extent of the display as compared with the size of the display.

Further, the foldable display device according to various embodiments may have an appealing external appearance.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
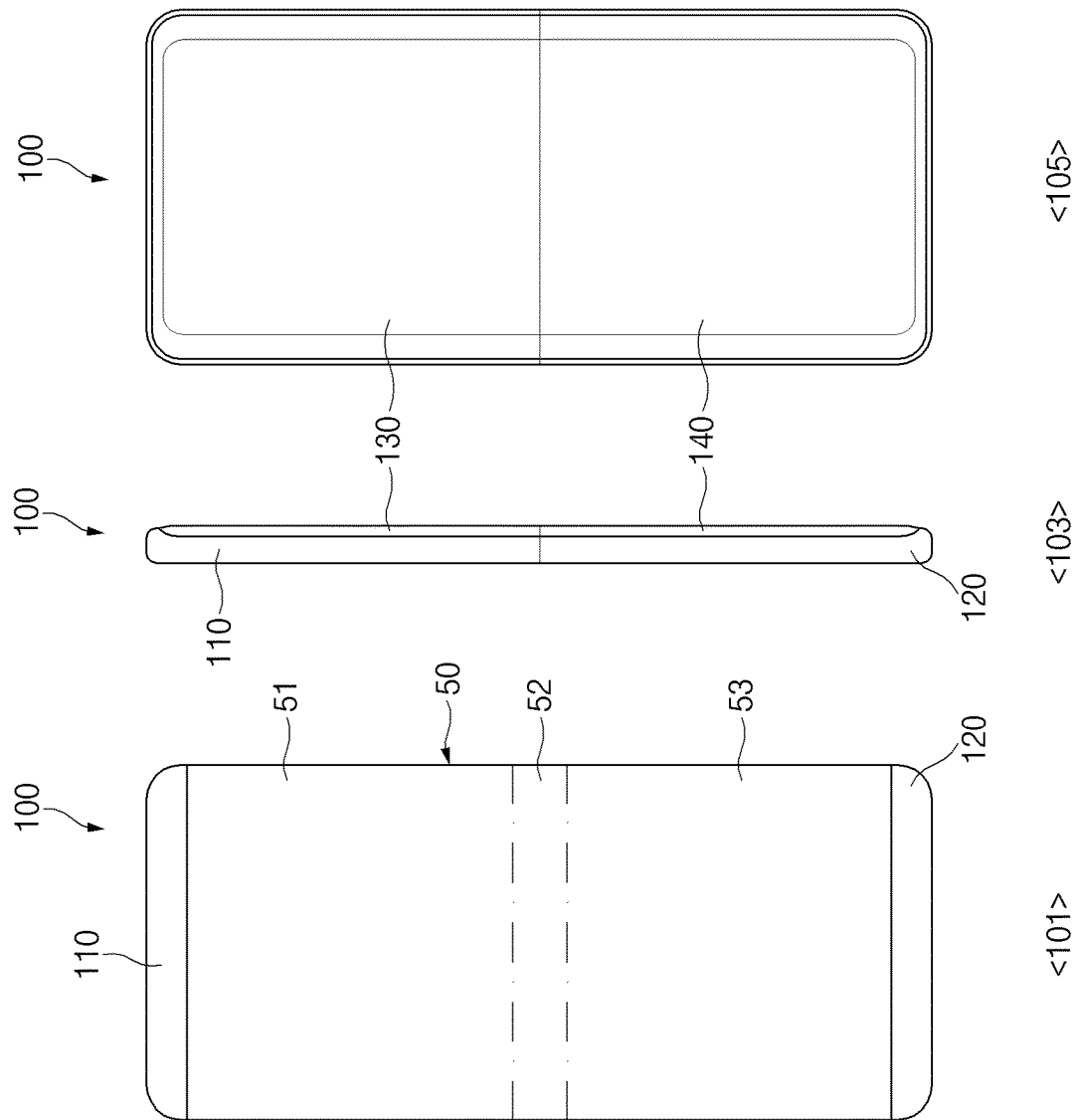
FIG. 1 is a view illustrating an example of an external appearance of a foldable display device according to various embodiments of the disclosure.

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the disclosure, the expressions "have," "may have," "include" and "comprise," or "may include" and "may comprise" used herein indicate existence of corresponding features (e.g., components such as numeric values, functions, operations, or parts) but do not exclude presence of additional features.

In the disclosure, the expressions "A or B," "at least one of A or/and B," or "one or more of A or/and B," and the like may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be. In contrast, when an element (for example, a first element) is referred to as being "directly coupled with/to" or "directly connected to" another element (for example, a second element), it should be understood that there are no intervening element (for example, a third element).

According to the situation, the expression "configured to" used herein may be used as, for example, the expression "suitable for," "having the capacity to," "designed to," "adapted to," "made to," or "capable of." The term "configured to (or set to)" must not mean only "specifically designed to" in hardware. Instead, the expression "a device configured to" may mean that the device is "capable of" operating together with another device or other components. CPU, for example, a "processor configured to (or set to) perform A, B, and C" may mean a dedicated processor (e.g., an embedded processor) for performing a corresponding operation or a generic-purpose processor (e.g., a central processing unit (CPU) or an application processor (AP)) which may perform corresponding operations by executing one or more software programs which are stored in a memory device.

Terms used in this specification are used to describe specified embodiments of the disclosure and are not intended to limit the scope of the disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal format unless expressly so defined herein in various embodiments of the disclosure. In some cases, even if terms are terms which are defined in the specification, they may not be interpreted to exclude embodiments of the t disclosure.

An electronic device according to various embodiments of the disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

Hereinafter, electronic devices according to an embodiment of the disclosure will be described with reference to the accompanying drawings. The term "user" used herein may refer to a person who uses an electronic device or may refer to a device (e.g., an artificial electronic device) that uses an electronic device.

Figure 2:
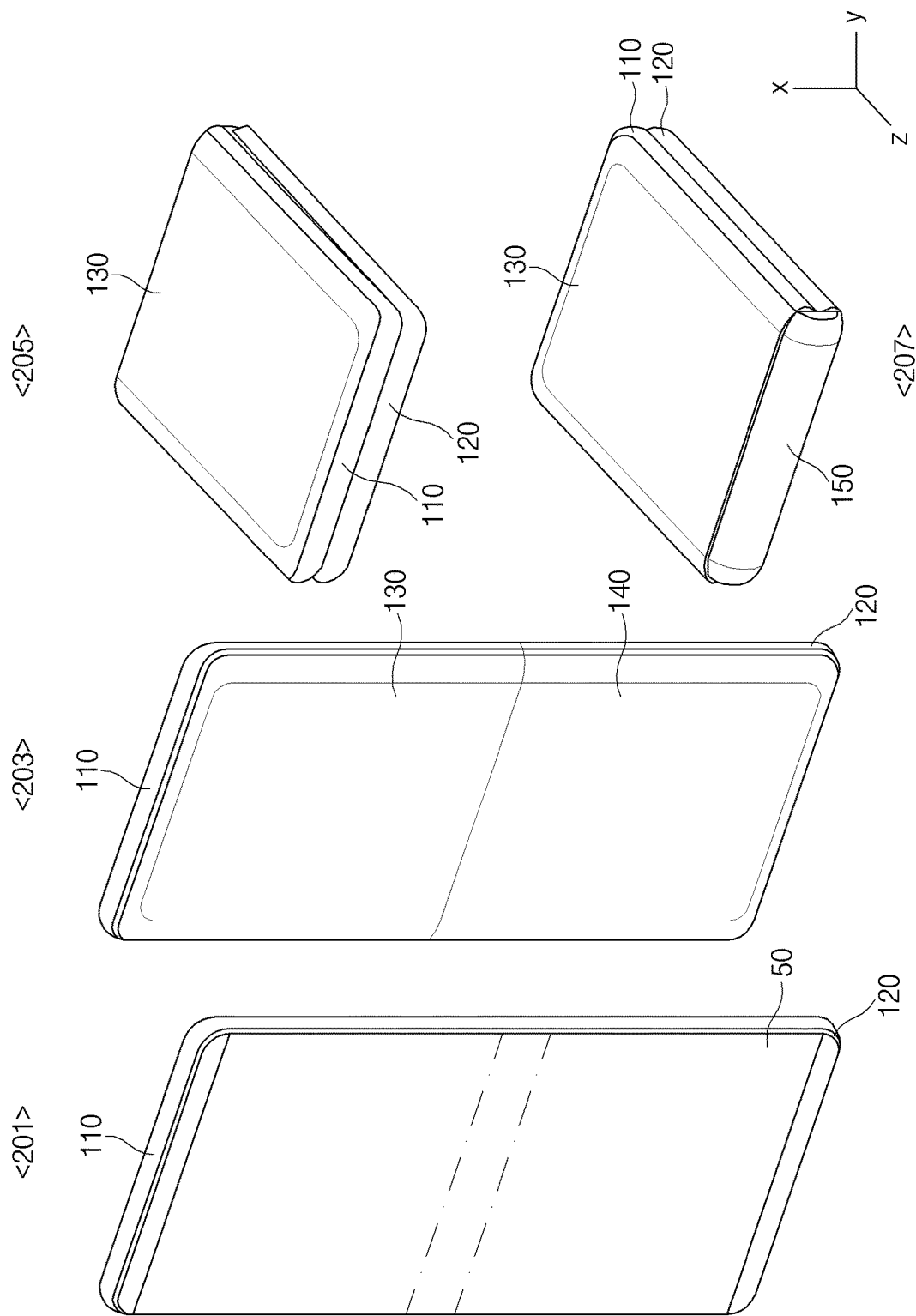
FIG. 2 is a view illustrating an example of a hinge state of a foldable display device according to various embodiments of the disclosure.
Figure 3:
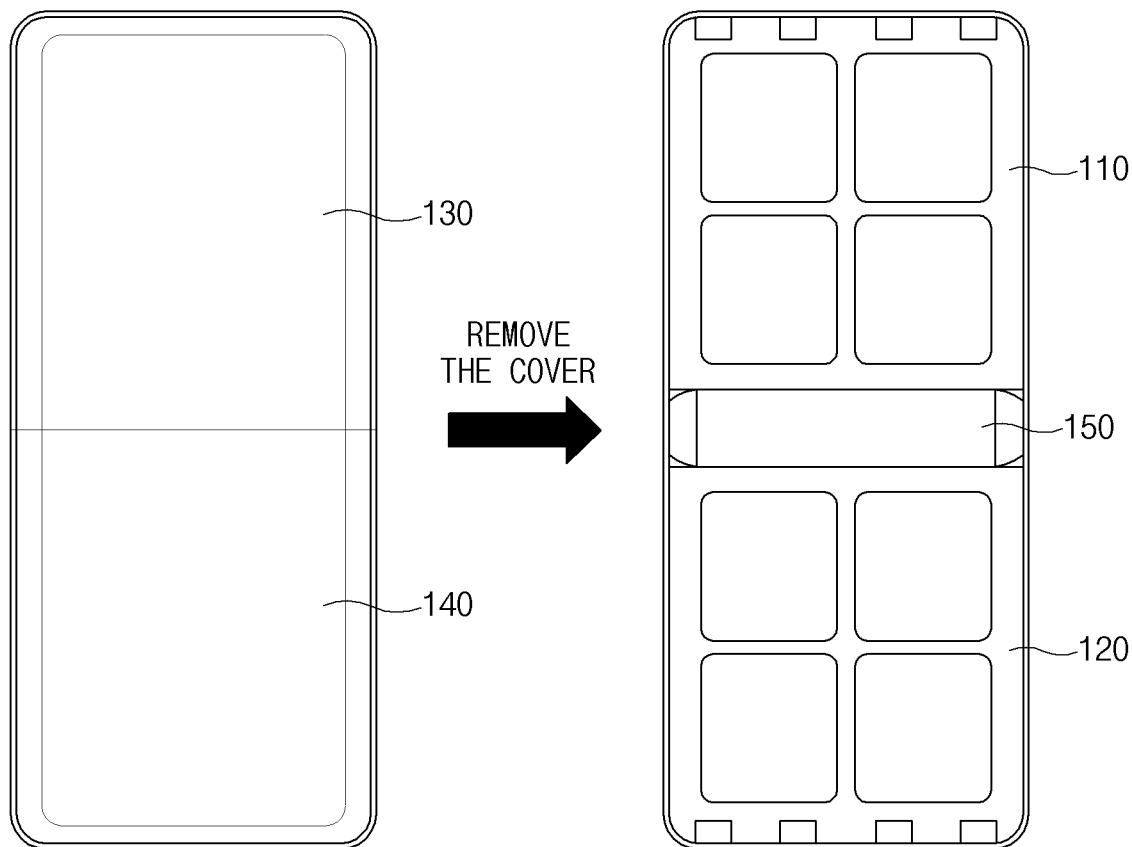
FIG. 3 is a view illustrating an example of a coupling state of a housing and a cover of a foldable display device according to various embodiments of the disclosure.

FIG. 1 is a view illustrating an example of an external appearance of a foldable display device (or foldable flexible display device, or flexible display device) according to various embodiments of the disclosure. FIG. 2 is a view illustrating an example of a hinge state of a foldable display device according to various embodiments of the disclosure. FIG. 3 is a view illustrating an example of a coupling state of a housing and a cover of a foldable display device according to various embodiments of the disclosure.

Referring to FIGS. 1 to 3, a foldable flexible display device 100 according to an embodiment may include a first housing 110 (or a first frame, a first bracket, or a first case), a second housing 120 (or a second frame, a second bracket, or a second case), a display 50 (e.g., a flexible display), a first cover 130, a second cover 140, and a hinge housing 150 (or a hinge frame, a hinge bracket, or a hinge case) in which a hinge structure is disposed. Referring to FIG. 1, state 101 corresponds to a view illustrating a front surface of the foldable flexible display device 100 in a flat state (or an unfolding state or a state in which an angle of a central portion of the display 50 is 0 degrees or 180 degrees), state 103 corresponds to a view illustrating one side surface of the foldable flexible display device 100 in the flat state, and state 105 corresponds to a view illustrating a rear surface of the foldable flexible display device 100 in the flat state. Referring to FIG. 2, state 201 corresponds to a perspective view illustrating a front surface of the foldable flexible display device 100 in the flat state, state 203 corresponds to a view illustrating a rear surface of the foldable flexible display device 100 in the flat state, and states 205 and 207 correspond to views illustrating front and rear surfaces of the foldable flexible display device 100 in a folding state. Referring to FIG. 3, an unfolding state 107 corresponds to a view illustrating a rear surface of the foldable flexible display device 100 in the flat state, and state 109 corresponds to a view illustrating a state in which a cover on the rear surface of the foldable flexible display device 100 is removed in the flat state.

According to various embodiments, the first housing 110 may be disposed to be continuous with the second housing 120 (e.g., when the display 50 is unfolded to be flat) or may be disposed to be parallel to (or to face) the second housing 120 (e.g., when the display 50 is folded) according to the disposition of the first housing 110. The first housing 110, for example, may be at least partially formed of a metallic material or a nonmetallic material, and may have a specific strength to support the display 50. At least a portion of an upper area 51 and a central area 52 of the display 50 may be disposed at a portion of the front surface of the first housing 110. At least a portion of the inside of the first housing 110 may be provided such that the interior thereof is empty or may be provided such that the interior thereof is empty after the first housing 110 is coupled to the first cover 130 so that electronic elements (e.g., a printed circuit board, a battery, and the like) that are necessary for driving the display 50 may be disposed in the empty space. According to various embodiments, the first housing 110 may be configured such that an upper end of the first housing 110 surrounds an upper periphery of the display 50.

According to various embodiments, the second housing 120 may be disposed to be continuous with the first housing 110 (e.g., when the display 50 is unfolded to be flat) or may be disposed to be parallel to the first housing 110 (e.g., when the central portion of the display 50 is folded) according to the disposition of the first housing 110. The second housing 120 may be formed of the same material as the first housing 110. As the second housing 120 is configured to be symmetrical vertically to the first housing 110, a lower area 53 and a lower portion of a central area 52 of the display 50 may be disposed on the front surface of the second housing 120. At least a portion of the inside of the second housing 120 may be configured such that the interior thereof is empty similarly to the first housing 110 or may be configured such that the interior thereof is empty after the second housing 120 is coupled to the second cover 140 so that electronic elements that are necessary for driving the display 50 may be disposed. According to various embodiments, the second housing 120 may be configured such that a lower end of the second housing 120 surrounds a lower side of the display 50.

According to various embodiments, the hinge housing 150 may be covered by one side of the first housing 110 and the second housing 120 or be exposed to the outside according to a folding state of the foldable flexible display device 100. For example, as illustrated in states 201 and 203, when the first housing 110 and the second housing 120 are disposed vertically to be continuous with each other, the hinge housing 150 may be covered by the first housing 110 and the second housing 120. As illustrated in states 205 and 207, when the first housing 110 and the second housing 120 are disposed to face each other, the hinge housing 150 may be disposed to be exposed to the outside from sides of the first housing 110 and the second housing 120. The thickness (e.g., the Z axis thickness of FIG. 2) of the hinge housing 150 is similar to or smaller than the thickness defined by the first cover 130 and the first housing 110 or the thickness defined by the second cover 140 and the second housing 120 so that a friction may be prevented from being generated between the hinge housing 150 and the covers 130 and 140 during a hinge operation.

According to various embodiments, a first housing 110 (or a first housing structure, or a first frame structure) may include a first surface and a second surface that is opposite to the first surface, and a second housing 120 (or a second housing structure, or a second frame structure) may include a third surface and a fourth surface that is opposite to the third surface. The first housing 110 and the second housing 120 may be folded with respect to each other, and at least a portion of the third surface faces the first surface in a folding state and the first surface and the third surface may face the same direction in an unfolding state. The hinge structure may connect a first peripheral part of the first housing 110 and a second peripheral part of the second housing 120. The display 50 (or a flexible display layer) may extend across at least a portion of the first surface and at least a portion of the third surface and may be folded in the first peripheral part and the second peripheral part or an adjacent area of the first peripheral part and the second peripheral part.

According to various embodiments, the display 50 may include an upper area 51, a central area 52, and a lower area 53 that are continuous. The central area 52 may include a specific area that is located at an inner central portion of the central area 52 while the display 50 is folded. The upper area 51 may be attached and fixed to the first housing 110. The lower area 53 may be attached and fixed to the second housing 120. The central area 52 may be disposed not to be fixed (or attached) to the first housing 110 and the second housing 120. Accordingly, while the display 50 is folded or unfolded, the central area 52 may move because it is not fixed onto the first housing 110 and the second housing 120.

According to various embodiments, as illustrated in FIG. 3, the first cover 130 may be disposed to cover the first housing 110 on the rear surface of the first housing 110. The first cover 130 may be disposed to cover a portion of the hinge housing (e.g., an upper end portion of the hinge housing) disposed between the first housing 110 and the second housing 120. The corners of the first cover 130 may be rounded. The first cover 130 may have an empty interior or may form an empty space with the first housing 110 while being coupled to the first housing 110. For example, the first cover 130 may have a structure in which a rectangular bottom surface and side walls at an upper end or left and right sides of the bottom surface are formed.

According to various embodiments, as illustrated in state 107 of FIG. 3, the second cover 140 may be disposed to cover the second housing 120 on the rear surface of the second housing 120 below the first cover 130. The second cover 140 may be disposed to cover a remaining part of the hinge housing (e.g., a lower end of the hinge housing), a portion of which is covered by the first cover 130. The corners of the second cover 140 may be rounded similarly to the first cover 130. The second cover 140 may have an empty interior or may form an empty space with the second housing 120 while being coupled to the second housing 120. In this regard, the second cover 140 may have a structure in which a rectangular bottom surface and side walls at a lower end and left and right sides of the bottom surface are formed.

According to various embodiments, the foldable flexible display device 100 may be configured such that the display 50 may be unfolded while the first housing 110 and the second housing 120 are disposed vertically to be continuous as illustrated in states 201 and 203 or such that the display 50 may be folded while the front surface (e.g., the first surface) of the first housing 110 and the front surface (a surface on which the display 50 is disposed or the third surface) of the second housing 120 are folded with respect to each other to face each other inwards. The foldable flexible display device 100 according to an embodiment may minimize bezels of the housings 110 and 120 because the hinge structure is disposed below the display 50. For example, if necessary, the foldable flexible display device 100 according to an embodiment may be configured such that a side surface bezel thereof is removed.

Figure 4:
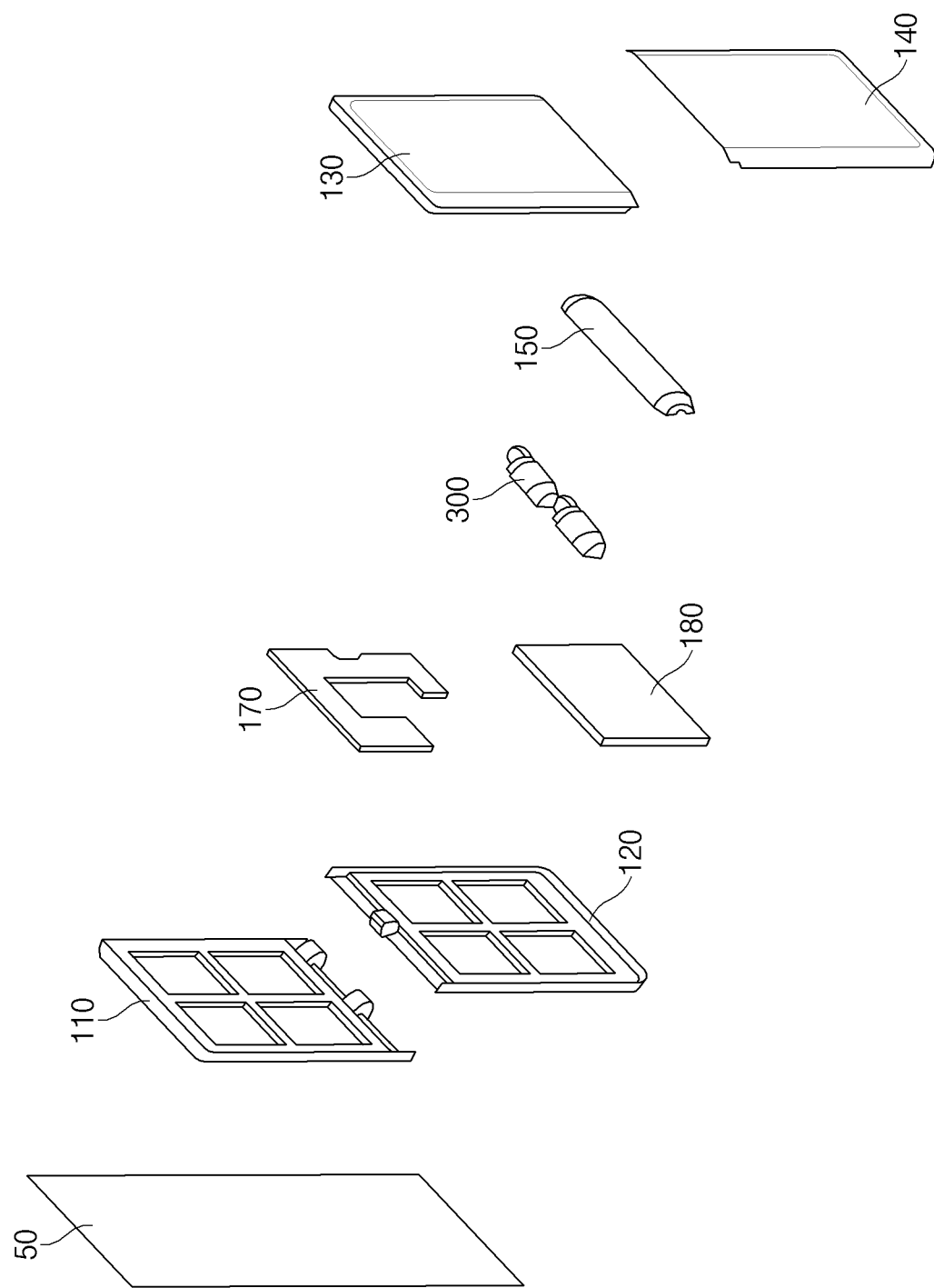
FIG. 4 is an exploded perspective view of a foldable display device according to various embodiments of the disclosure.

FIG. 4 is an exploded perspective view of a foldable display device according to various embodiments of the disclosure.

Referring to FIG. 4, a foldable flexible display device 100 according to an embodiment may include a display 50, a first housing 110, a second housing 120, a printed circuit board 170, a battery 180, a hinge structure 300 (or a hinge unit, a hinge part, or a hinge module), a hinge housing 150, a first cover 130, and a second cover 140.

According to various embodiments, the display 50, the first housing 110, the second housing 120, the hinge housing 150, the first cover 130, and the second cover 140 may have substantially the same forms or functions as those of the display, the first housing, the second housing, the hinge housing, the first cover, and the second cover, which have been described with reference to FIGS. 1 to 3.

According to various embodiments, the printed circuit board 170 may be disposed between the first housing 110 and the first cover 130. Alternatively, the printed circuit board 170 may be disposed between the second housing 120 and the second cover 140. Alternatively, a plurality of printed circuit boards 170 may be provided, and at least one of the printed circuit boards 170 may be disposed at at least one of between the first housing 110 and the first cover 130 and between the second housing 120 and the second cover 140. Various electronic elements that are necessary for driving of the foldable flexible display device 100 may be disposed in the printed circuit board 170. For example, at least one processor, a memory, a communication circuit, an antenna, a microphone, a speaker, a camera, or the like may be mounted in the printed circuit board 170.

According to various embodiments, the battery 180 may be disposed between the second housing 120 and the second cover 140. The battery 180 may supply electric power that is necessary for driving of the foldable flexible display device 100. According to an embodiment, the battery 180 may supply electric power to the printed circuit board disposed between the first housing 110 and the first cover 130 through a wire provided on one side of the hinge housing 150.

According to various embodiments, at least one hinge structure 300 may be positioned in and fixed to the hinge housing 150. Although a form in which one hinge structure 300 is disposed has been exemplified in the illustrated drawings, the disclosure is not limited thereto. For example, a larger number of hinge structures may be disposed according to the size of the foldable flexible display device. The hinge structure 300 may include inner bracket gears that rotate in opposite directions by an external pressure with respect to center brackets (or central bodies) that fix main gears (e.g., saw-toothed spur gears or saw-toothed inner spur gears) disposed at the center of the hinge structure 300, and bracket housings.

Figure 5:
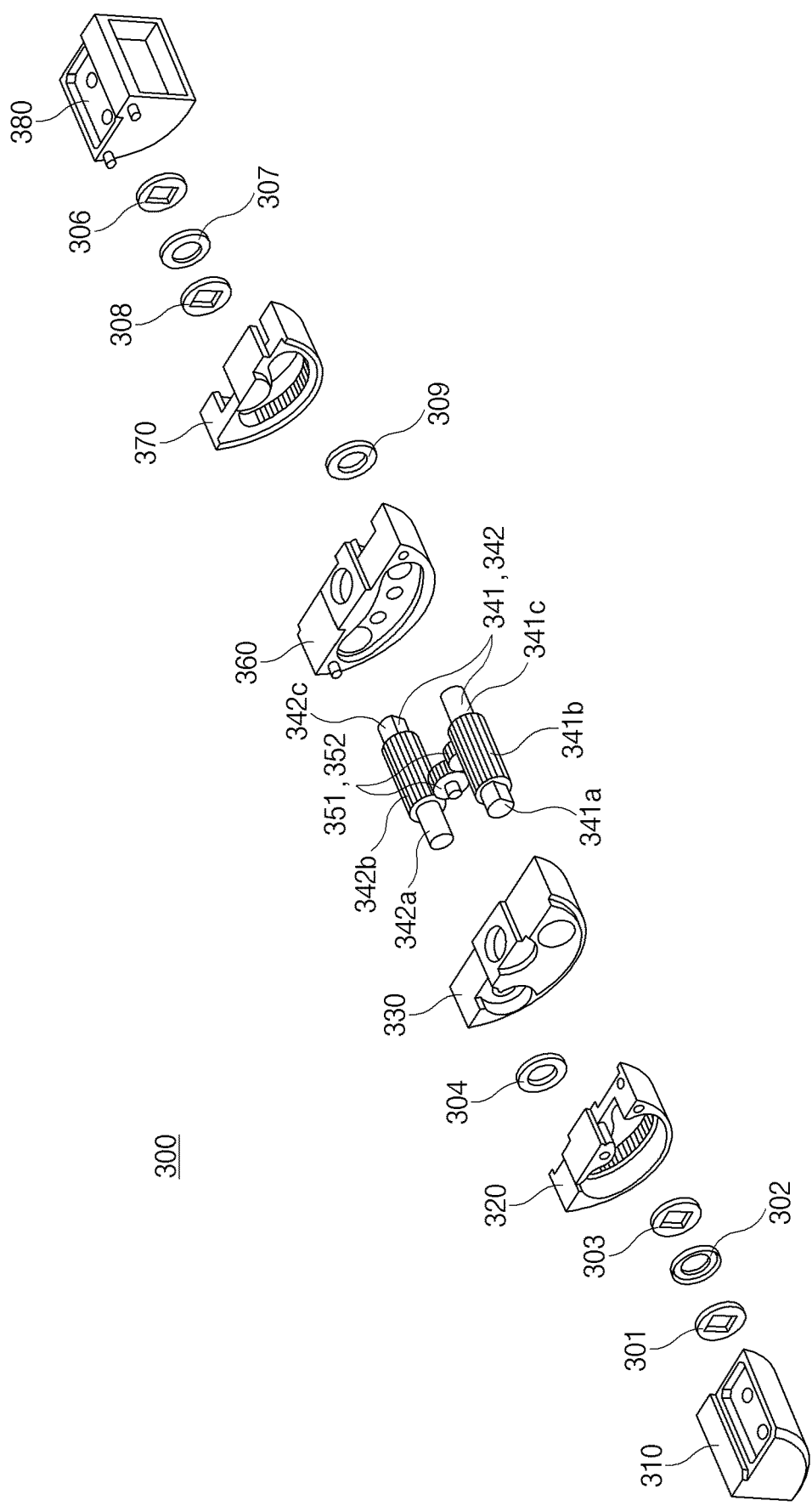
FIG. 5 is a view illustrating an example of an exploded perspective view of a hinge structure of a foldable display device according to various embodiments of the disclosure.
Figure 6:
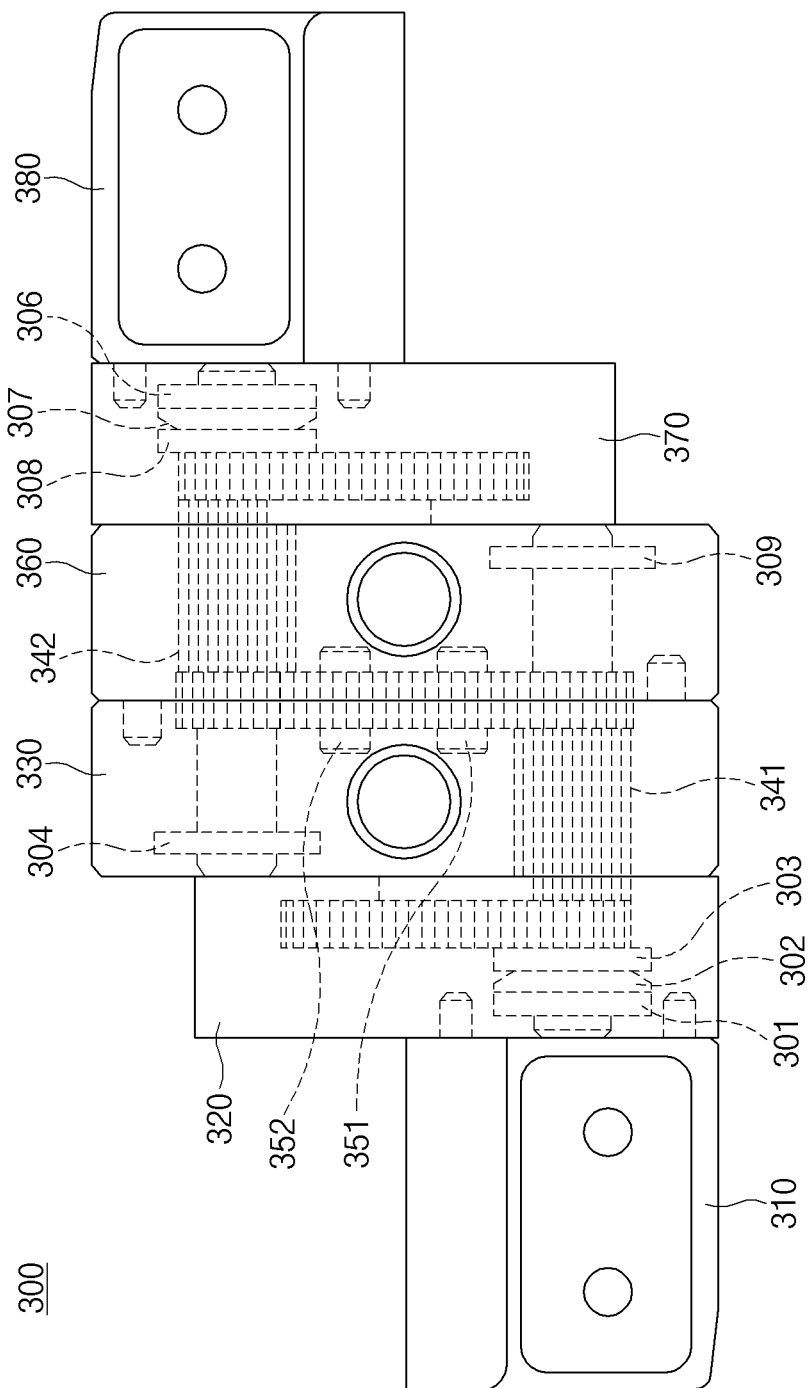
FIG. 6 is a view illustrating a coupling state of a hinge structure of a foldable display device according to various embodiments of the disclosure.

FIG. 5 is a view illustrating an example of an exploded perspective view of a hinge structure of a foldable display device according to various embodiments of the disclosure. FIG. 6 is a view illustrating a coupling state of a hinge structure of a foldable display device according to various embodiments of the disclosure.

Referring to FIGS. 5 and 6, at least a portion of a hinge structure 300 according to an embodiment may include a first bracket housing 310, first housing washer rings 301 and 303, a first plate spring 302, a first inner bracket gear 320, a first gear washer ring 304, a first center bracket 330, a first main gear 341 (e.g., a saw-toothed spur gear), a first shaft gear 351 (e.g., a saw-toothed spur gear), a second shaft gear 352 (e.g., a saw-toothed spur gear), a second main gear 342 (e.g., a saw-toothed spur gear), a second center bracket 360, a second gear washer ring 309, a second inner bracket gear 370, a second plate spring 307, second housing washer rings 306 and 308, and a second bracket housing 380.

According to various embodiments, the first bracket housing 310 may be disposed adjacently to the first inner bracket gear 320 and may be fixed to the first inner bracket gear 320. For example, at least one protuberance is provided on a right side of the first bracket housing 310, and the at least one protuberance may be inserted into and fixed to a recess provided in the first inner bracket gear 320. The first bracket housing 310 may have an arc-shaped cross-section having a specific included angle (e.g., the right angle). An upper end of the first bracket housing 310, for example, may be coupled (e.g., screw-coupled) to the second housing 120. A side of the first bracket housing 310 may be coupled (e.g., magnet-coupled) to the first housing 110. Accordingly, the first bracket housing 310 may rotate while the second housing 120 performs a hinge operation, and may be magnet-coupled to the first housing 110 while the first housing 110 and the second housing 120 are disposed in parallel. The first bracket housing 310 may be separated from the first housing 110 while the first housing 110 and the second housing 120 contact each other. A curved part of the first bracket housing 310 may be disposed to face the interior of the hinge housing 150. Although the first bracket housing 310 may be formed of a material (e.g., a metallic material) having a specific strength, the first bracket housing 310 of the disclosure is not limited by the material.

According to various embodiments, the first housing washer rings 301 and 303 may be disposed between the first bracket housing 310 and the first inner bracket gear 320. The first plate spring 302 may be disposed between the first housing washer rings 301 and 303. The first housing washer rings 301 and 303 and the first plate spring 302 may be fixed to the first inner bracket gear 320 by a rivet. According to various embodiments, the rivet may be replaced by another fixing member, such as a nut or an E-shaped ring. The first housing washer rings 301 and 303 and the first plate spring 302 may be positioned in a recess provided on one side of the first inner bracket gear 320. At least one hole that passes through the first inner bracket gear 320 may be provided inside the recess. A portion of the first main gear 341 that passes through the first center bracket 330 and the second center bracket 360 may be disposed in the at least one hole.

According to various embodiments, the first bracket housing 310 may be fixed to a first side (e.g., the left side of FIG. 6) of the first inner bracket gear 320, and the first center bracket 330 may be disposed on a second side (e.g., the right side of FIG. 6). The first inner bracket gear 320 may rotate along a side surface of the first center bracket 330. The first inner bracket gear 320 may have a semi-elliptical shape, and an internal gear engaged with the first main gear 341 may be provided inside the first inner bracket gear 320. The internal gear may have a semi-elliptical arc shape. The material of the first inner bracket gear 320 may be a metallic material of a specific strength. For example, the first inner bracket gear 320 may be formed of the same material as that of the first bracket housing 310. The material of the first inner bracket gear 320, which is described in various embodiments, are not limited to the above-mentioned metallic material.

According to various embodiments, the first gear washer ring 304 may be disposed between the first inner bracket gear 320 and the first center bracket 330. For example, the first gear washer ring 304 may be positioned in a recess (or a hole) provided in the first center bracket 330. One side of the second main gear 342 that passes through the first center bracket 330 and the second center bracket 360 may be inserted into the first gear washer ring 304.

According to various embodiments, the first center bracket 330 may be disposed between the first inner bracket gear 320 and the second center bracket 360. The first center bracket 330 may be larger than the first inner bracket gear 320, and may have a semielliptical shape. A hole, into which a portion of the first main gear 341 is inserted, and a hole, into which a portion of the second main gear 342 is inserted, may be disposed in the first center bracket 330. A hole extending vertically may be disposed at the center of the first center bracket 330 (e.g., from the center of a flat upper end to a lower end of the semielliptical shape). A boss provided in the hinge housing 150 may be inserted into the vertically extending hole.

According to various embodiments, the first main gear 341 (or a first shaft) may pass through the first center bracket 330 and the second center bracket 360. One side of the first main gear 341 may be disposed in an internal gear provided in the first inner bracket gear 320. The first main gear 341 may protrude to the left side of the first inner bracket gear 320. The first main gear 341 may include a first left through-part 341a that passes through the first housing washer rings 301 and 303 and the first plate spring 302, a first gear pattern part 341b which is continuous with the first left through-part 341a, one side of which is engaged with the internal gear of the first inner bracket gear 320, and another side opposite to said one side of which is enmeshed with the first shaft gear 351, and a first right through-part 341c which passes through a hole provided in the second center bracket 360 and with which the second gear washer ring 309 is fitted (or inserted). The first left through-part 341a, the first gear pattern part 341b, and the first right through-part 341c of the first main gear 341 are classified according to functions and locations thereof, and the first left through-part 341a, the first gear pattern part 341b, and the first right through-part 341c of the first main gear 341 may have a continuous structure.

According to various embodiments, one side of the first shaft gear 351 may be enmeshed with the gear pattern part provided in the first main gear 341, and another side opposite to said one side of the first shaft gear 351 may be enmeshed with the second shaft gear 352. Accordingly, while the first main gear 341 rotates, the first shaft gear 351 may transmit a rotational force to the second shaft gear 352. The first shaft gear 351 may be disposed inside a cavity formed when the first center bracket 330 and the second center bracket 360 are coupled to each other.

According to various embodiments, one side of the second shaft gear 352 may be enmeshed with the gear pattern part provided in the second main gear 342, and another side opposite to said one side of the second shaft gear 352 may be enmeshed with the first shaft gear 351. The second shaft gear 352 may transmit a rotational force to the first shaft gear 351 while the second main gear 342 rotates. The second shaft gear 352 may be disposed inside a cavity formed when the first center bracket 330 and the second center bracket 360 are coupled to each other. According to various embodiments, in order to reduce the thickness of a set of the display device, the sizes and the numbers of the idle gears (e.g., the first shaft gears 351 and the second shaft gears 352) may be changed.

Accordingly, the display device of the disclosure is not limited by the number and sizes of the shaft gears. For example, the first shaft gear 351 and the second shaft gear 352 may have a specific small size or less to reduce the thickness of the set of the display device. Accordingly, the display device may have a hinge structure including two first shaft gears and two second shaft gears. The size of the two first shaft gears or the two second shaft gears may be a half of the one first shaft gear or the one second shaft gear. Alternatively, the hinge structure of the display device may include three first shaft gears and three second shaft gears.

According to various embodiments, the second main gear 342 (or a second shaft) may have a form that is substantially the same as that of the first main gear 341, and, for example, may include a second right through-part 342c which passes through a right side of the second inner bracket gear 370 and with which the second housing washer rings 306 and 308 and the second plate spring 307 are fitted, a second gear pattern part 342b, one side of which is enmeshed with an internal gear of the second inner bracket gear 370 and another side opposite to said one side of which is enmeshed with the second shaft gear, and a second left through-part 342a, which passes through the hole provided in the first center bracket 330 and with which the first gear washer ring 304 is fitted. The leftward or rightward direction of the above-mentioned through-parts is with reference to the illustrated drawings, and may be differently named according to the change of the disposition direction.

According to various embodiments, the second center bracket 360 may be disposed between the first center bracket 330 and the second inner bracket gear 370. The second center bracket 360 has a shape (e.g., a semielliptical shape that is larger than the second inner bracket gear 370) that is substantially the same as the first center bracket 330. The second center bracket 360 may have a through-hole, through which the first main gear 341 and the second main gear 342 passes. The second center bracket 360 has a hole that vertically extends from the flat upper end to the lower end thereof for boss-coupling of the hinge housing 150.

According to various embodiments, the second gear washer ring 309 may be positioned in a recess provided in the second center bracket 360 while being coupled to an end of the first left through-part 341c of the first main gear.

According to various embodiments, the second inner bracket gear 370 may be disposed between the second center bracket 360 and the second bracket housing 380. The shape and the material of the second inner bracket gear 370 may be substantially the same as the shape and the material of the first inner bracket gear 320, which have been described above. For example, the second inner bracket gear 370 may have a size that is smaller than that of the second center bracket 360, and may have a semielliptical shape. An internal gear that is enmeshed with the second main gear 342 may be disposed in a specific area of the second inner bracket gear 370.

According to various embodiments, the second housing washer rings 306 and 308 and the second plate spring 307 may be positioned in a recess (or a hole) provided on one side of the second inner bracket gear 370 and may be coupled to the second right through-part 342c of the second main gear 342. The second plate spring 307 may be disposed between the second housing washer rings 306 and 308 to apply a leftward/rightward elastic force to the second housing washer rings 306 and 308.

According to various embodiments, the second bracket housing 380 may have substantially the same shape and material as the first bracket housing 310, and may be disposed to be opposite to the first bracket housing 310. For example, the second bracket housing 380 may be fixed to one side of the second inner bracket gear 370. The second bracket housing 380 may include a curved part, an outer peripheral surface of which has a specific curvature. An upper end of the ends of the curved part may be coupled (e.g., screw-coupled) to the first housing 110. A side of the ends of the curved part may be coupled (e.g., magnet-coupled) to the second housing 120.

Figure 7:
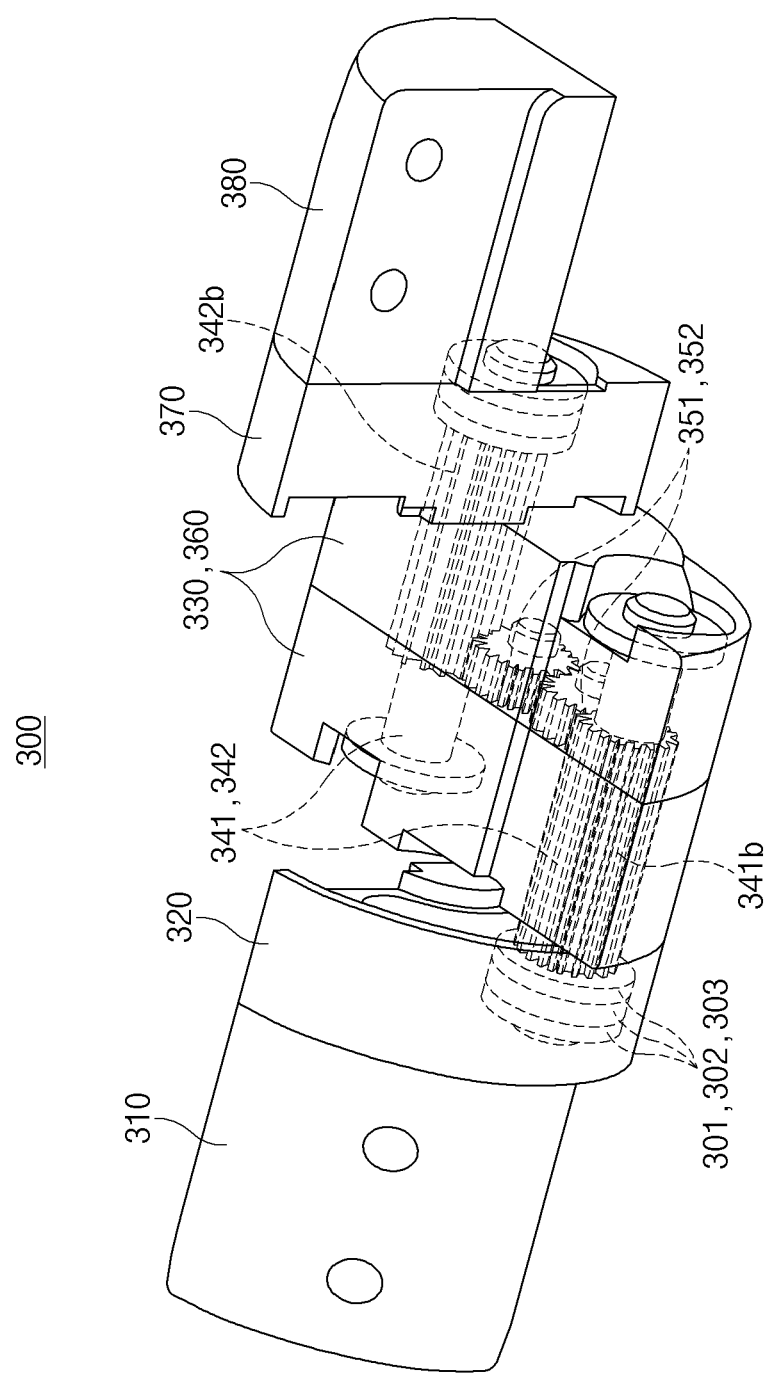
FIG. 7 is a view illustrating a rotation state of a hinge structure of a foldable display device according to various embodiments of the disclosure.

FIG. 7 is a view illustrating a rotation state of a hinge structure of a foldable display device according to various embodiments of the disclosure.

Referring to FIGS. 5 to 7, the hinge structure 300 according to an embodiment may be disposed such that side surfaces (e.g., a right side of the first center bracket 330 and a left side of the second center bracket 360 with reference to the drawing) of the first center bracket 330 and the second center bracket 360 face each other. The first main gear 341 may pass through holes of the holes of the first center bracket 330 and the second center bracket 360, which are provided on the lower side of FIG. 7. One side of the first gear pattern part 341b of the first main gear 341 may be enmeshed with the internal gear of the first inner bracket gear 320. The second main gear 342 may passes through holes of the holes of the first center bracket 330 and the second center bracket 360, which are provided on the upper side of FIG. 7, and one side of the second gear pattern part 342b of the second main gear 342 may be enmeshed with the internal gear of the second inner bracket gear 370. The first bracket housing 310 may be coupled to the left side of the first inner bracket gear 320, and the second bracket housing 380 may be coupled to the right side of the second inner bracket gear 370.

According to various embodiments, an external pressure may be applied to the first housing 110 or the second housing 120 with reference to a state in which the first bracket housing 310 is coupled to the second housing 120 and the second bracket housing 380 is coupled to the first housing 110 so that the first housing 110 and the second housing 120 may be folded in a direction in which they face each other. In this case, as illustrated, the first bracket housing 310 and the first inner bracket gear 320 may be rotated by a first angle (e.g., 90 degrees) in a first direction from an initial state with respect to the first center bracket 330. Similarly, the second bracket housing 380 and the second inner bracket gear 370 may be rotated by a first angle (e.g., 90 degrees) in a second direction from the initial state with respect to the second center bracket 360. The first direction and the second direction may be opposite to each other.

Figure 8:
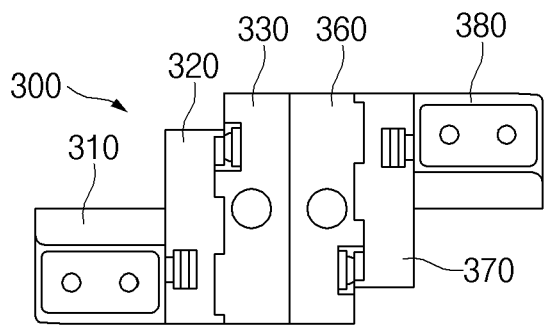
FIG. 8 is a view illustrating an example of forms of elements related to center brackets of a foldable display device according to various embodiments of the disclosure.
Figure 8:
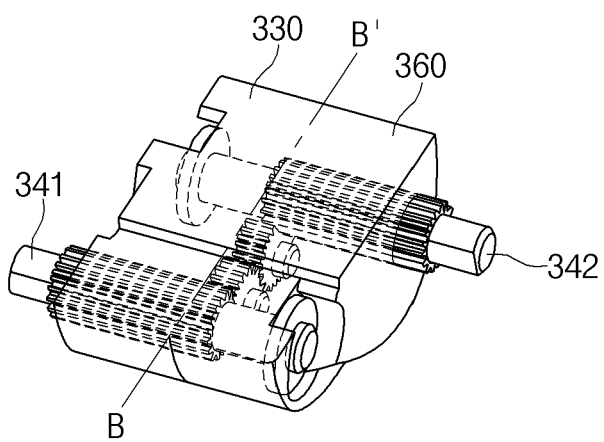
Figure 8:
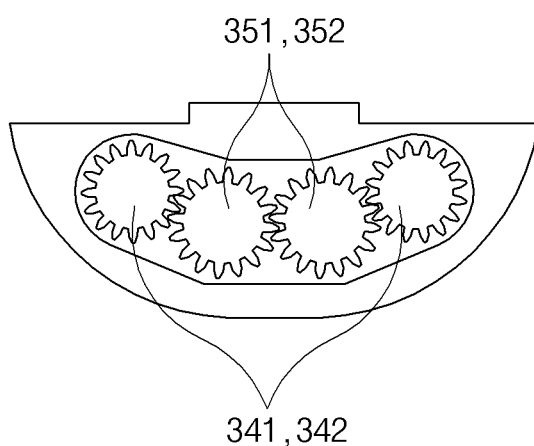
Figure 8:
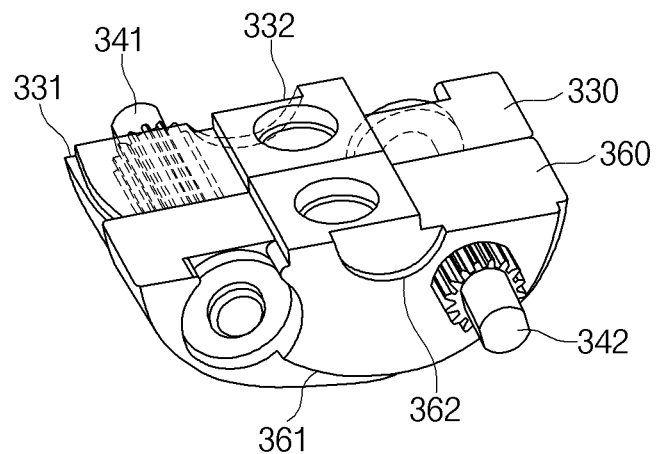

FIG. 8 is a view illustrating an example of forms of elements related to center brackets of a foldable display device according to various embodiments of the disclosure.

Referring to FIG. 8, as mentioned above, the hinge structure 300 according to an embodiment may include a first bracket housing 310, a first inner bracket gear 320, a first center bracket 330, a second center bracket 360, a second inner bracket gear 370, and a second bracket housing 380.

In the illustrated drawing, state 801 corresponds to a view illustrating only the center brackets 330 and 360, the main gears 341 and 342, and the shaft gears 351 and 352. The first main gear 341 and the second main gear 342 may pass through the first center bracket 330 and the second center bracket 360.

According to various embodiments, state 803 corresponds to a view taken along B-B' in state 801. As illustrated, the first shaft gear 351 enmeshed with the first main gear 341 and the second shaft gear 352 enmeshed with the second main gear 342 and the first shaft gear 351 may be disposed in a central cavity formed when the center brackets 330 and 360 are coupled to each other. In the above-mentioned structure, if the first main gear 341 may be rotated in a first direction (e.g., the clockwise direction), the first shaft gear 351 may be rotated in a second direction (e.g., the counterclockwise direction), the second shaft gear 352 enmeshed with the first shaft gear 351 may be in turn rotated in the first direction, and the second main gear 342 enmeshed with the second shaft gear 352 may be rotated in the second direction. As mentioned above, the first main gear 341 and the second main gear 342 may be rotated in opposite directions within a limited range by the first shaft gear 351 and the second shaft gear 352.

According to various embodiments, state 805 corresponds to a view illustrating outskirts of the first center bracket 330 and the second center bracket 360 in more detail. For example, a first left rail 331 and a second left rail 332 may be formed on one side surface (e.g., a left surface) of the first center bracket 330. A portion of an outer peripheral surface of the first inner bracket gear 320 may be positioned on the first left rail 331, and the first left rail 331 functions to guide rotation of the outer peripheral surface of the first inner bracket gear 320 while the first inner bracket gear 320 rotates. A portion of a protuberance provided at a semicircular central portion of the first inner bracket gear 320 may be positioned on the second left rail 332, and the second left rail 332 functions to guide rotation of the protuberance of the central portion of the first inner bracket gear 320 while the first inner bracket gear 320 rotates.

According to various embodiments, for example, a first right rail 361 and a second right rail 362 may be formed on one side surface (e.g., a right surface) of the second center bracket 360. A portion of an outer peripheral surface of the second inner bracket gear 370 may be positioned on the first right rail 361, and the first right rail 361 functions to guide rotation of the outer peripheral surface of the second inner bracket gear 370 while the second inner bracket gear 370 rotates. A portion of a protuberance provided at a semicircular central portion of the second inner bracket gear 370 may be positioned on the second right rail 362, and the second right rail 362 functions to guide rotation of the outer peripheral surface of the second inner bracket gear 370 while the second inner bracket gear 370 rotates.

Figure 9A:
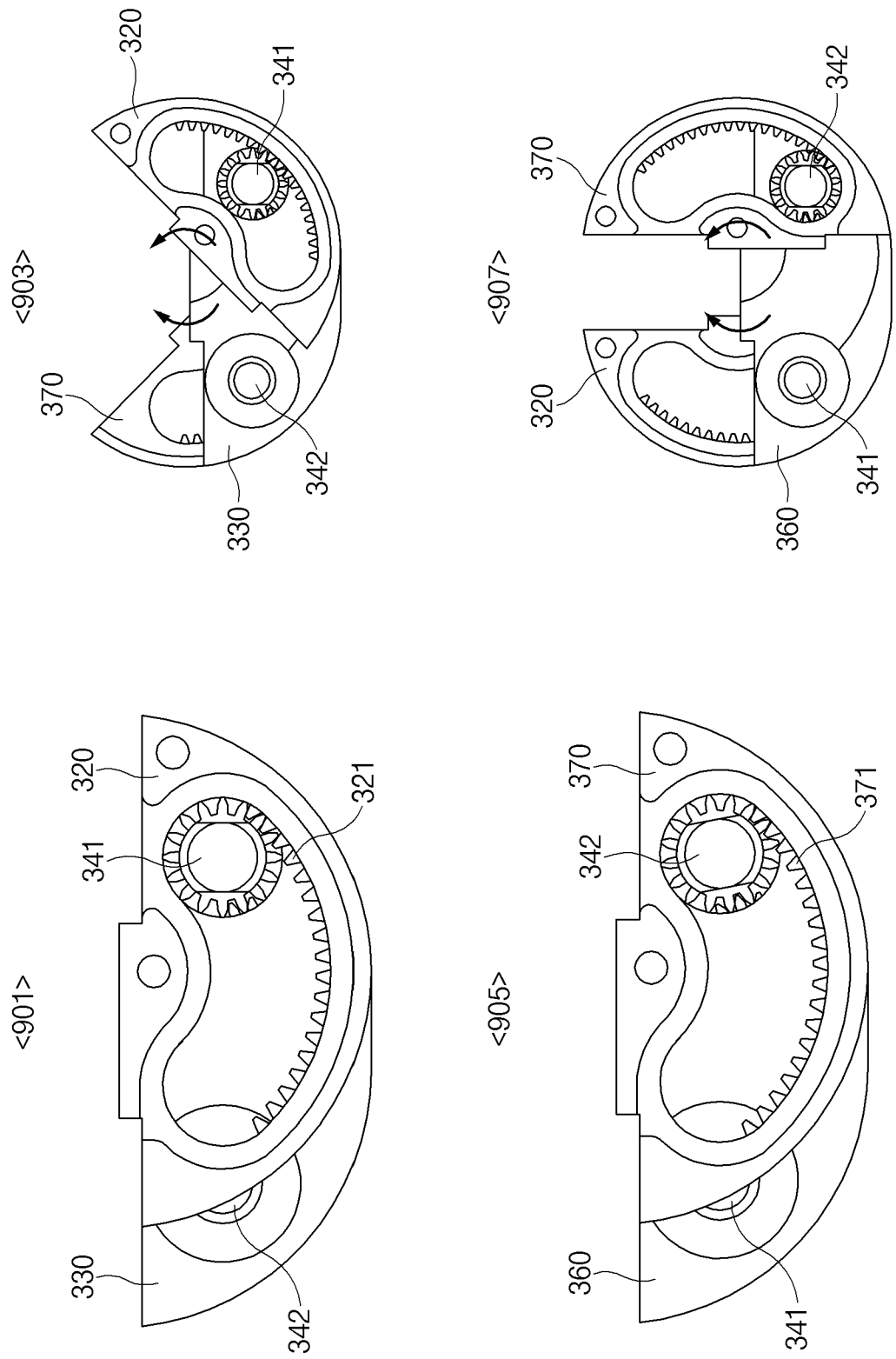
FIGS. 9A, 9B, and 9C are views illustrating an example of operation states of center brackets and inner bracket gears of a hinge structure according to various embodiments of the disclosure.
Figure 9B:
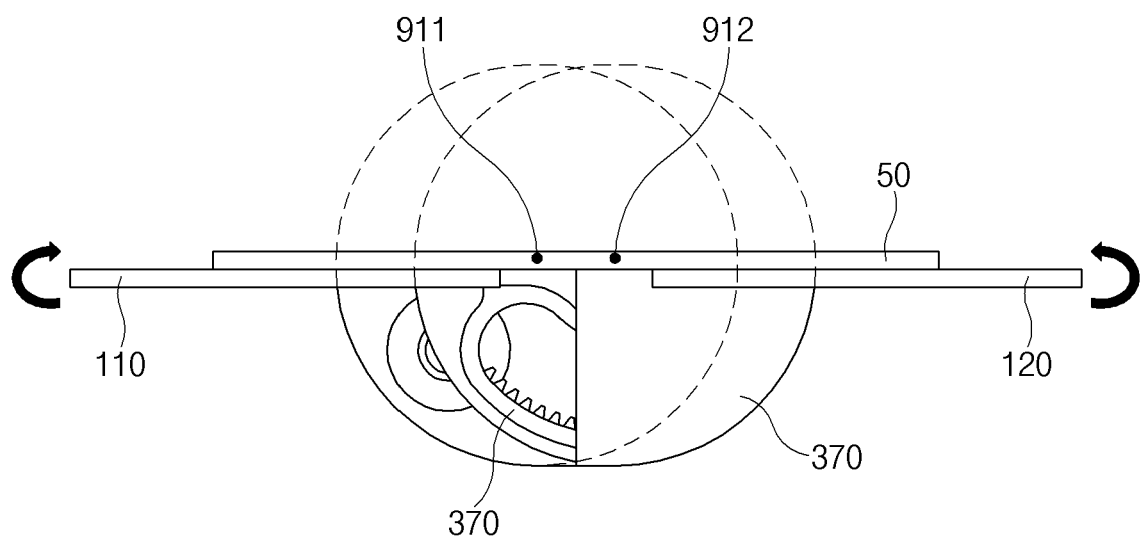
Figure 9C:
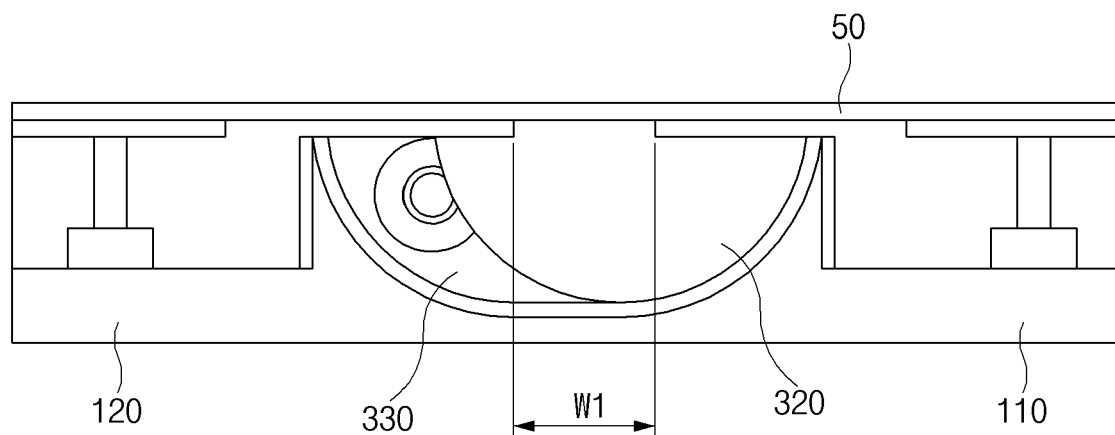
Figure 9C:
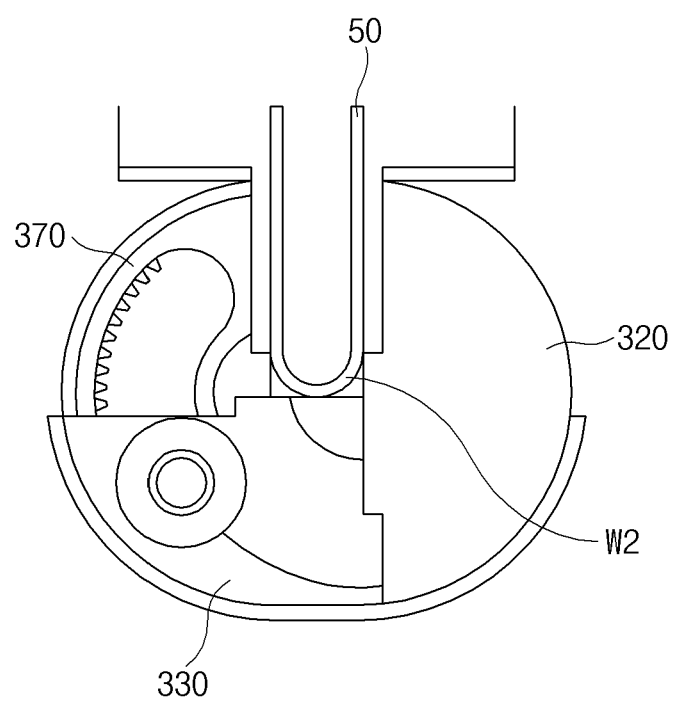

FIGS. 9A, 9B, and 9C are views illustrating an example of operation states of center brackets and inner bracket gears of a hinge structure according to various embodiments of the disclosure.

Referring to FIG. 9A, state 901 may include a state in which at least a portion of the hinge structure is viewed with respect to a direction in which the first inner bracket gear 320 is disposed when the foldable flexible display device is in a flat state, and state 903 may include a state in which at least some configurations of the hinge structure is viewed with reference to a direction in which the first inner bracket gear 320 is disposed when the foldable flexible display device is in a folding state of a first angle (e.g., 90 degrees). State 905 may include a state in which at least a portion of the hinge structure is viewed with respect to a direction in which the second inner bracket gear 370 is disposed when the foldable flexible display device is in a flat state, and state 907 may include a state in which at least a portion of the hinge structure is viewed with reference to a direction in which the second inner bracket gear 370 is disposed when the foldable flexible display device is in a folding state of a second angle (e.g., an angle by which the hinge structures face each other). Referring to FIG. 9C, state 931 corresponds to a view illustrating an area W1 in which the display 50 is not attached to the first housing 110 and the second housing 120 in a state in which the display 50 of the foldable flexible display device is unfolded flat. Referring to FIG. 9C, state 933 corresponds to a view illustrating an area W2 in which the display 50 is not attached to the first housing 110 and the second housing 120 in a state in which the display 50 of the foldable flexible display device is folded.

Referring to FIGS. 9A, 9B, and 9C, a coupling form of the center brackets and the inner bracket gears of the hinge structure may include a form in which the first inner bracket gear 320 is disposed at a side of the first center bracket 330 according to a view angle as illustrated in state 901. The gear pattern part of the first main gear 341 may pass through the first center bracket 330 and be enmeshed with the internal gear 321 of the first inner bracket gear 320. The internal gear 321 may be formed on one side, for example, at a bottom of a curved hole (e.g., an end of which is round such that the main gear may be inserted into the curved hole as a part of an arc) provided on one side of the first inner bracket gear 320. In the description, it has been exemplified that the internal gear 321 is formed at a portion of the bottom of the first inner bracket gear 320, but the disclosure is not limited thereto. When a force is applied to the first inner bracket gear 320 (or the first bracket housing 310 and the first housing 110 coupled to the first inner bracket gear 320) in a first direction (e.g., a clockwise direction with reference to the illustrated drawing), as illustrated in state 903, the first inner bracket gear 320 may be inclined at a first angle (e.g., 45 degrees) with respect to a longitudinal center line of the first center bracket 330. When the first inner bracket gear 320 is inclined at the first angle, the same rotation is transmitted to the second inner bracket gear 370, and the second inner bracket gear 370 may be inclined at the first angle with respect to the center line of the first center bracket 330 (or the center line of the second center bracket 360).

According to various embodiments, the first inner bracket gear 320 (or the second inner bracket gear 370) may be formed to be smaller than the first center bracket 330 (or the second center bracket 360) while having a semielliptical shape, and as illustrated in FIG. 9B, the imaginary rotational center axes 911 and 912 of the first inner bracket gear 320 may be located above the first center bracket 330 as the first inner bracket gear 320 (or the second inner bracket gear 370) rotates at a point that deviates from the center line of the first center bracket 330 (or the second center bracket 360).

According to various embodiments, state 905 corresponds to a view illustrating a shape of the second inner bracket gear 370 coupled to the second center bracket 360. A portion of the gear pattern part of the second main gear 342 that deviates rightwards from the longitudinal center line of the second center bracket 360 is enmeshed with the internal gear 371 of the second inner bracket gear 370 and may be rotated by an external force. For example, when a force that is stronger than in state 903 is continuously applied, as illustrated in state 907, the second inner bracket gear 370 may be disposed in parallel to the longitudinal center line of the second center bracket 360. As the second inner bracket gear 370 rotates, the first inner bracket gear 320 may be rotated in a direction that is opposite to the rotational direction of the second inner bracket gear 370. Accordingly, as illustrated, the flat surfaces of the first inner bracket gear 320 and the second inner bracket gear 370 may be disposed in parallel to the longitudinal center lines of the center brackets 330 and 360 (or perpendicularly to the transverse center lines of the center brackets 330 and 360).

As described above, as the first inner bracket gear 320 and the second inner bracket gear 370 are coupled at locations that are spaced apart from the centers of the center brackets 330 and 360 (e.g., locations that deviate to right peripheries or right peripheries of the center brackets 330 and 360) through the first main gear 341 and the second main gear 342, as illustrated in FIG. 9B, the imaginary rotational center axes 911 and 912 may be located at a specific height from the surfaces of the first housing 110 and the second housing 120 to the upper side (or a specific height from the rear surface of the display 50 to the upper side, a specific height from the upper surface of the display 50 to the lower side, or a specific height to the upper side of the transverse center lines of the center brackets 330 and 360) when the first main gear 341 and the second main gear 342 rotate. Alternatively, the imaginary rotational center axes 911 and 912 may be formed above the bottom surface of the lowermost end surface of the display 50 when viewed from the top toward the lower side with reference to the illustrated drawing.

According to various embodiments, the shapes and sizes of the internal gears 321 and 371 of the first inner bracket gear 320 and the second inner bracket gear 370 may be adjusted for locations at which the first inner bracket gear 320 and the second inner bracket gear 370 have to be disposed in parallel to the center brackets 330 and 360 and locations at which the first inner bracket gear 320 and the second inner bracket gear 370 have to be disposed at 90 degrees with respect to the center brackets 330 and 360. Alternatively, the sizes of the curved holes of the rounded shapes, into which the main gear may be inserted, and the numbers and sizes of the furrows and threads of the internal gears 321 and 371 of the first inner bracket gear 320 and the second inner bracket gear 370 may vary according to the center brackets 330 and 360.

According to various embodiments, as illustrated in state 907, the shapes of the internal gears of the foldable flexible display device 100 may restrict maximum rotation widths of the inner bracket gears 320 and 370. For example, the shapes of the internal gears may be restricted such that the inner bracket gears 320 and 370 rotate within 90 degrees with respect to the transverse center lines of the center brackets 330 and 360. Then, as the inner bracket gears 320 and 370 deviate to the left and right sides of the center brackets 330 and 360, a gap of a specific size may be formed between the inner bracket gears 320 and 370 in a state in which the first housing 110 and the second housing 120 are folded to face each other. The gap of the specific size may always maintain a bending degree of a central area of the display 50 at a constant value. For example, the central area of the display 50 may be bent to have a U shape (or a water drop shape) in a state in which the first housing 110 and the second housing 120 are folded. As the display 50 is bent in a U shape, the display 50 may be less stressed as the number of stress points (e.g., a point of inflection) occurring in the central area of the display 50 is smaller than in another form (e.g., a display that is folded in a water drop form or a pot form). Accordingly, the foldable flexible display device 100 according to the disclosure may have a relatively long life span.

Figure 10:
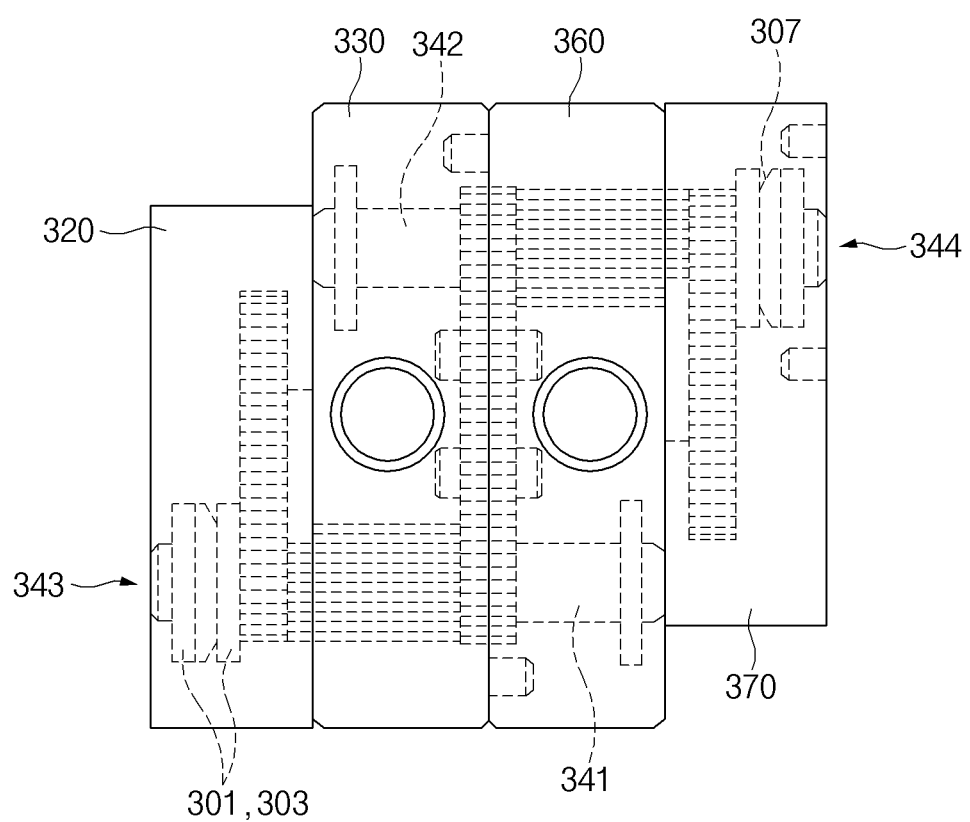
FIG. 10 is a view illustrating an example of a rivet coupling form of a hinge structure according to various embodiments of the disclosure.
Figure 11:
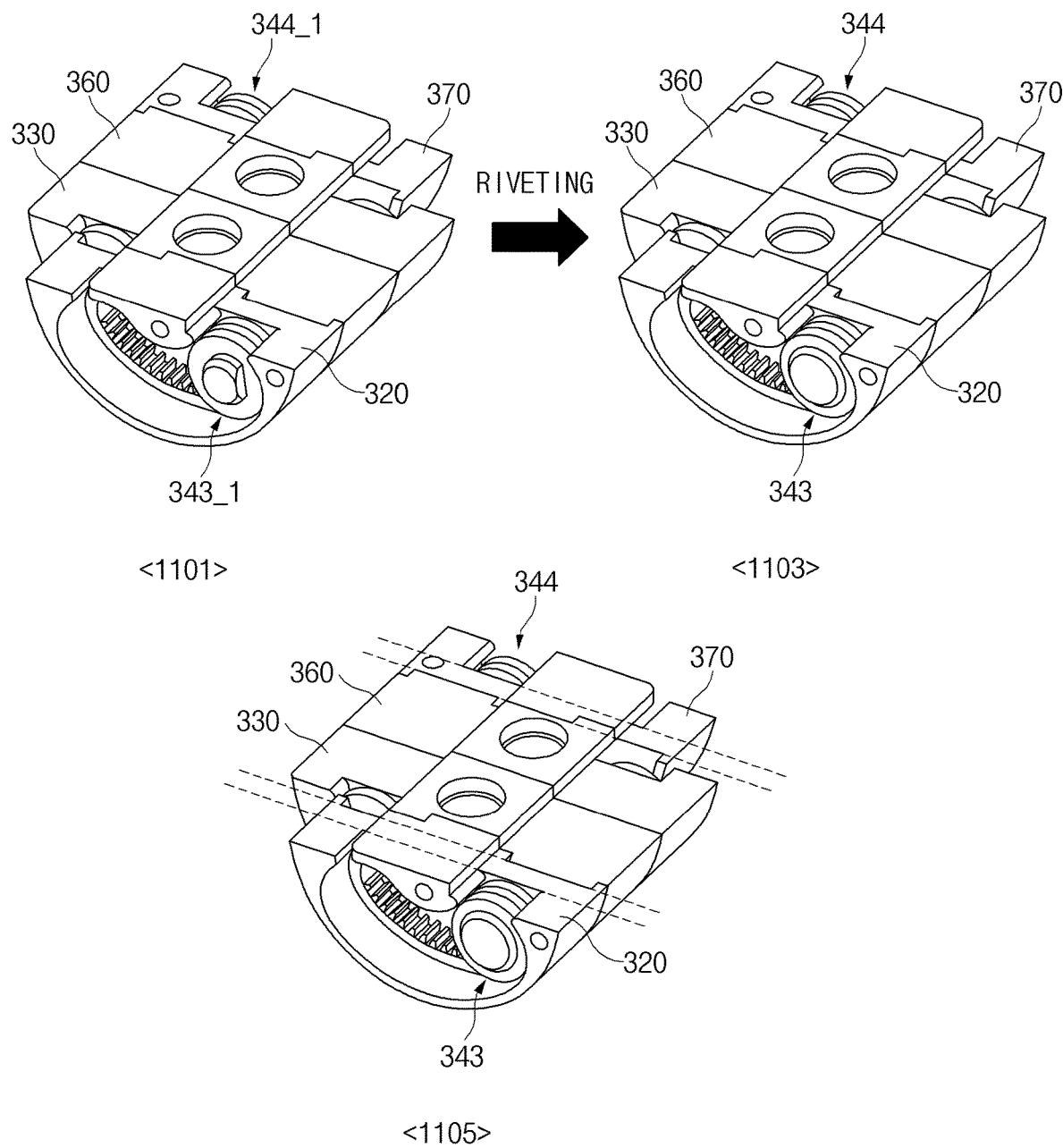
FIG. 11 is a view illustrating an example of formation of a rivet of a hinge structure according to various embodiments of the disclosure.

FIG. 10 is a view illustrating an example of a rivet coupling form of a hinge structure according to various embodiments of the disclosure. FIG. 11 is a view illustrating an example of formation of a rivet of a hinge structure according to various embodiments of the disclosure.

Referring to FIGS. 5, 10, and 11, as illustrated, the hinge structure 300 may include a first bracket housing 310, a first center bracket 330, a second center bracket 360, and a second bracket housing 380, and may include a first main gear 341 and a second main gear 342 that pass through the first center bracket 330 and the second center bracket 360.

According to various embodiments, first housing washer rings 301 and 303 and a first plate spring may be disposed in a first left through-part 341a of the first main gear 341 and a first rivet 343 may be disposed at an end of the first left through-part 341a so that the first main gear 341 may be fixed to the first inner bracket gear 320.

According to various embodiments, second housing washer rings and a second plate spring 307 may be disposed in a second right through-part 342c of the second main gear 342 and a second rivet 344 may be disposed at an end of the second right through-part 342c so that the second main gear 342 may be fixed to the second inner bracket gear 370.

According to various embodiments, a first surface (e.g., a right surface in the illustrated drawing) of the first center bracket 330 and a first surface (e.g., a left surface in the illustrated drawing) of the second center bracket 360 may be disposed to face each other. As illustrated in state 1101, a first shaft gear 351 and a second shaft gear 352 may be disposed between the first center bracket 330 and the second center bracket 360. The first main gear 341 and the second main gear 342 may pass through the first center bracket 330 and the second center bracket 360. Then, the first main gear 341 may be enmeshed with the first shaft gear 351 and the second main gear 342 may be enmeshed with the second shaft gear 352. A first rivet structure 343_1 may be inserted into an end of the first left through-part 341a of the first main gear 341, and a second rivet structure 344_1 may be inserted into an end of the second right through-part 342c of the second main gear 342.

According to various embodiments, as illustrated in state 1103, the first rivet 343 may be formed by applying a specific force to the first rivet structure 343_1 and the second rivet 344 may be formed by applying a specific force to the second rivet structure 344_1.

According to various embodiments, a plate spring may be disposed between the housing washer rings at ends of the through-parts of the main gears 341 and 342. Accordingly, if the first rivet 343 and the second rivet 344 are fixed to ends of the through-parts of the main gears 341 and 342, an elastic force of the plate spring may be applied to the housing washer rings. Accordingly, as illustrated in state 1105, the inner bracket gears 320 and 370 may move alongside surfaces of the center brackets 330 and 360, and as an elastic force due to compression of the plate spring may be applied to the inner bracket gears 320 and 370, frictional forces (a frictional forces between the inner bracket gears 320 and 370 and the center brackets 330 and 360) may increase. In the illustrated drawing, a width of a dotted line indicates a surface to which a pressure due to an elastic force of the plate spring is applied. The above-mentioned structure may function to hold the peripheral structures such that the first housing 110 and the second housing 120 may be prevented from being loosened while performing hinge operations.

Figure 12:
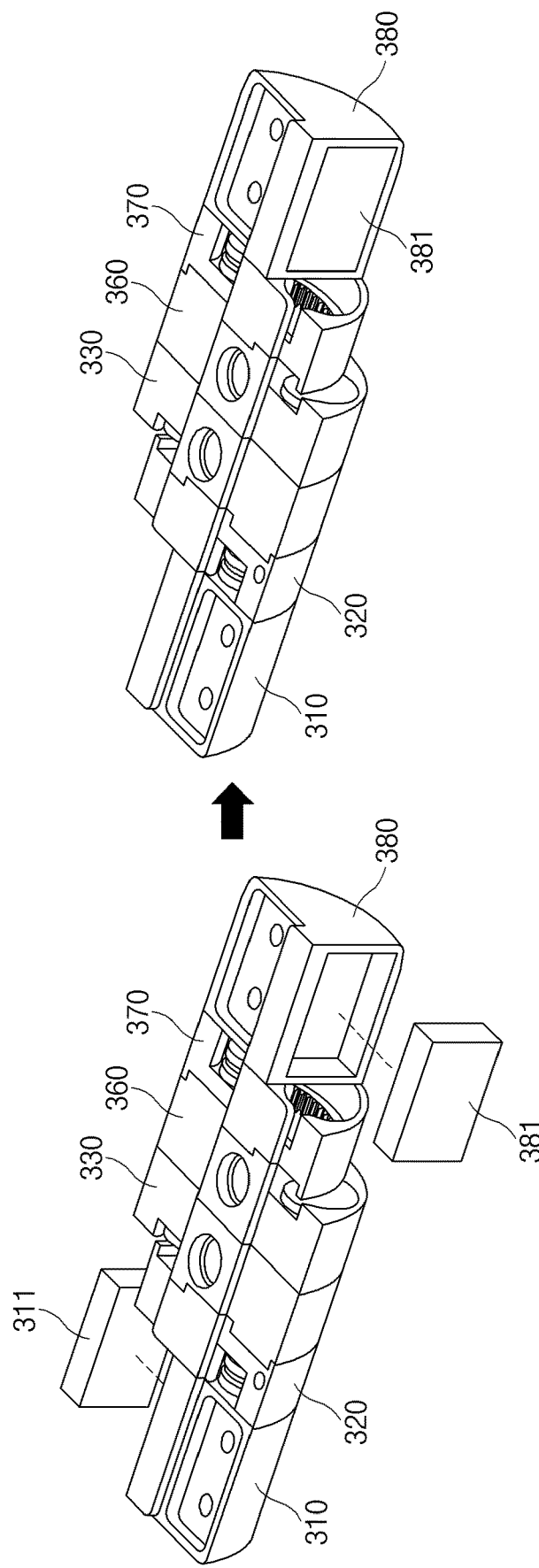
FIG. 12 is a view illustrating an example of a magnetic member of a hinge structure according to various embodiments of the disclosure.

FIG. 12 is a view illustrating an example of a magnetic member of a hinge structure according to various embodiments of the disclosure.

Referring to FIG. 12, as mentioned above, the hinge structure 300 may include a first bracket housing 310, a first inner bracket gear 320, a first center bracket 330, a second center bracket 360, a second inner bracket gear 370, and a second bracket housing 380. The main gears and the shaft gears may pass through the center brackets 330 and 360 for rotation of the first inner bracket gear 320 and the second inner bracket gear 370.

According to various embodiments, a first magnet member 311 may be disposed on one side of the first bracket housing 310. For example, with reference to the drawing, in a state in which a surface of the first bracket housing 310, on which coupling holes coupled to the second housing 120 are disposed, is disposed on the upper side, the first magnet member 311 may be disposed on a side of the first bracket housing 310, on which a curved part is not formed, for example opposite to another side on which a curved part is formed. The side of the first bracket housing 310 may include a positioning recess of a specific depth such that the first magnet member 311 may be positioned in and fixed to the recess. The above-mentioned first magnet member 311 may be inserted into (e.g., interference-fitted with) the positioning recess of the side of the first bracket housing 310 or may be fixed to the positioning recess of the side of the first bracket housing 310 through a separate bonding member.

According to various embodiments, a second magnet member 381 may be disposed on one side of the second bracket housing 380. For example, with reference to the drawing, in a state in which a surface of the second bracket housing 380, on which coupling holes coupled to the first housing 110 are disposed, is disposed on the upper side, the second magnet member 381 may be disposed on a side of the second bracket housing 380, on which a curved part is not formed, for example opposite to another side on which a curved part is formed. The side of the second bracket housing 380 may include a positioning recess of a specific depth such that the second magnet member 381 may be positioned in and fixed to the recess. The above-mentioned second magnet member 381 may be inserted into (e.g., interference-fitted with) the positioning recess of the side of the second bracket housing 380 or may be fixed to the positioning recess of the side of the second bracket housing 380 through a separate bonding member.

Figure 13:
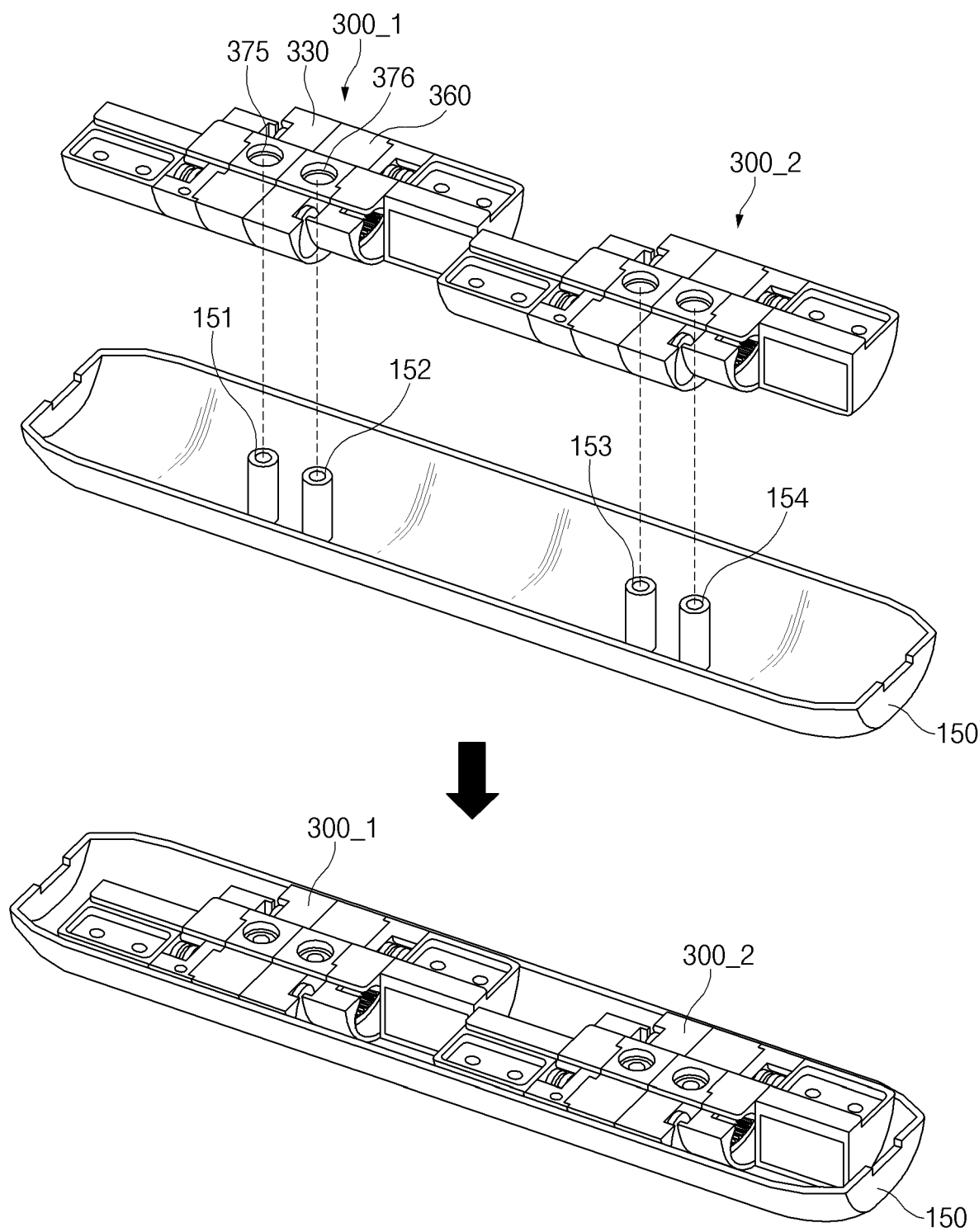
FIG. 13 is a view illustrating an example of coupling of a hinge structure and a hinge housing according to various embodiments of the disclosure.
Figure 14:
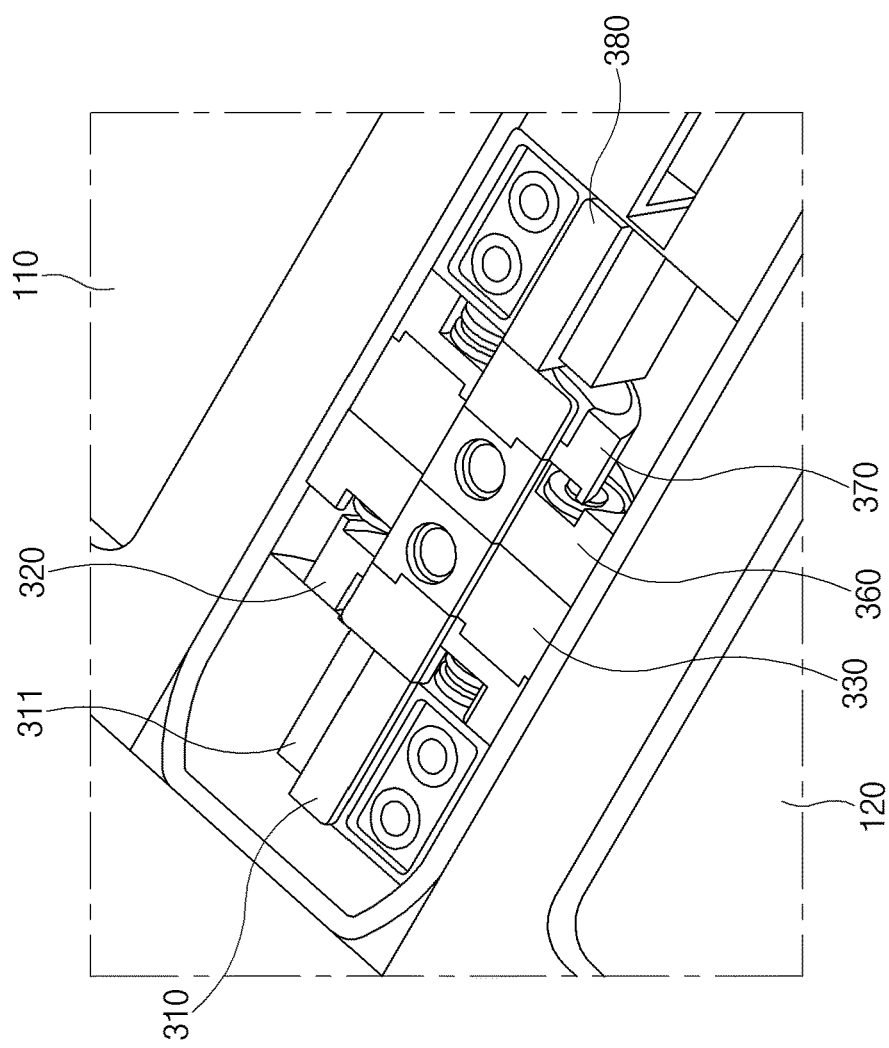
FIG. 14 is a view illustrating an example of coupling of a hinge structure, a hinge housing, and housings according to various embodiments of the disclosure.
Figure 14:
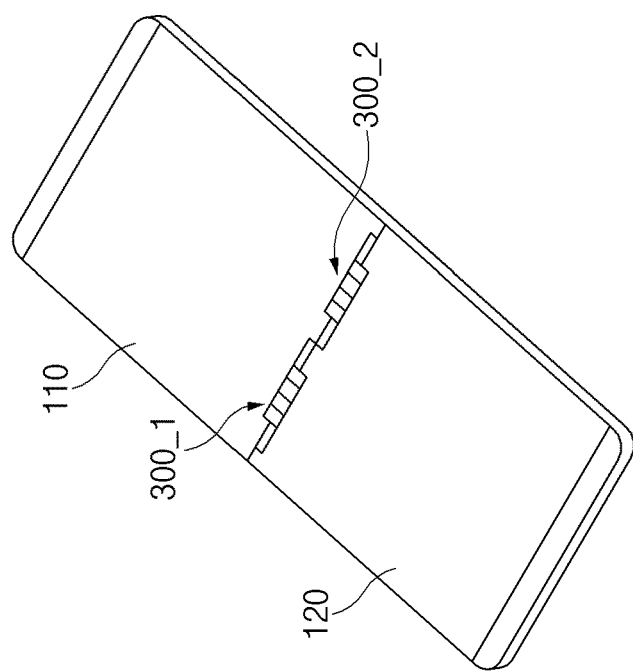

FIG. 13 is a view illustrating an example of coupling of a hinge structure and a hinge housing according to various embodiments of the disclosure. FIG. 14 is a view illustrating an example of coupling of a hinge structure, a hinge housing, and housings according to various embodiments of the disclosure.

Referring to FIGS. 13 and 14, the foldable flexible display device 100 may include a first hinge structure 300_1 and a second hinge structure 300_2. Although a form in which two hinge structures 300 are disposed has been exemplified in the illustrated drawings, the disclosure is not limited thereto. For example, the foldable flexible display device may employ only one hinge structure or three or more hinge structures if necessary. For example, the number of the hinge structures may be designed to increase or decrease in correspondence to the size of the foldable flexible display device.

According to various embodiments, a first through-hole 375 that passes from the center of a flat surface to the bottom surface of the first center bracket 330 may be provided in the first hinge structure 300_1. A first boss 151 provided in the hinge housing 150 may be inserted into the first through-hole 375.

According to various embodiments, a second through-hole 376 that passes from the center of a flat surface to the bottom surface of the second center bracket 360 may be provided in the first hinge structure 300_1. A second boss 152 provided in the hinge housing 150 may be inserted into the second through-hole 376.

According to various embodiments, the hinge housing 150 may include a housing body, and a first boss 151, a second boss 152, a third boss 153, and a fourth boss 154 disposed within the housing body. For example, the left and right peripheries of the housing body are blocked, an upper side of the housing body is opened, and an inside of the housing body is empty so that a longitudinal section of the housing body may have a semielliptical shape. Curved parts of the above-mentioned hinge structure 300 may be disposed on an inner surface of the housing body.

According to various embodiments, the first boss 151 and the second boss 152 may be disposed on one side of the housing body, on which the first boss 151 and the second boss 152 may be coupled to the first through-hole 375 provided in the first center bracket 330 of the hinge structure 300 and the second through-hole 376 provided in the second center bracket 360 of the hinge structure 300.

According to various embodiments, the second hinge structure 300_2 may have substantially the same form as the first hinge structure 300_1, which has been described above. If the center brackets included in the second hinge structure 300_2 are positioned in the hinge housing 150, the through-holes formed in the center brackets may be coupled to the third boss 153 and the fourth boss 154 of the hinge housing 150.

In the above description, the structure of the hinge housing 150 in which two hinge structures are disposed has been exemplified, but the disclosure is not limited thereto. For example, one or three or more hinge structures may be disposed in the hinge housing 150. As mentioned above, the number of the hinge structure may increase or decrease according to the size of the foldable flexible display device.

Figure 15:
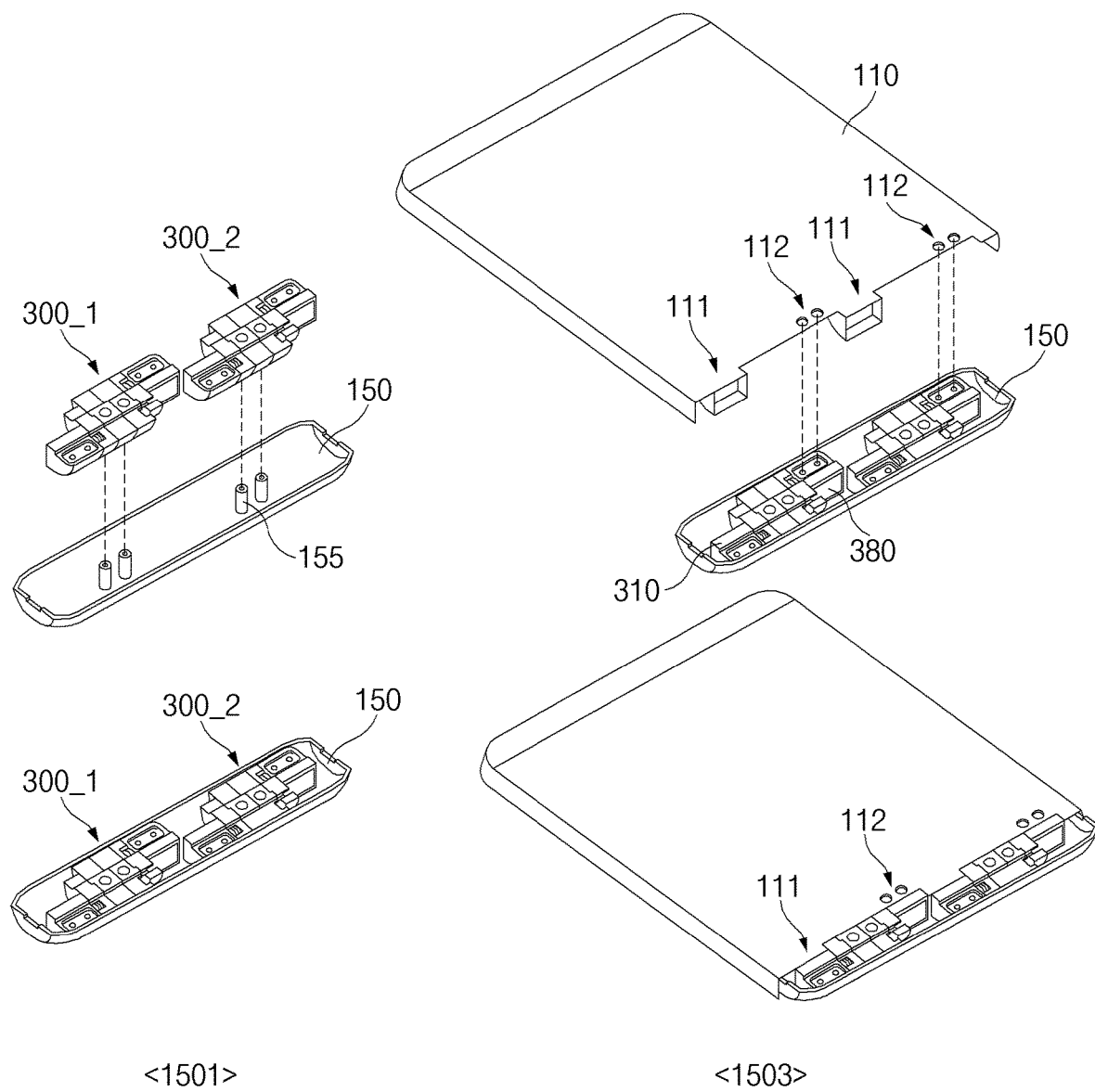
FIG. 15 is a view illustrating an example of a coupling process of parts of a hinge structure, a hinge housing, and housings according to various embodiments of the disclosure.

FIG. 15 is a view illustrating an example of a coupling process of parts of a hinge structure, a hinge housing, and housings according to various embodiments of the disclosure.

Referring to FIG. 15, as illustrated in state 1501, the first hinge structure 300_1 and the second hinge structure 300_2 may be fitted with (or inserted with) and fixed to of a boss 155 of the hinge housing 150.

According to various embodiments, as illustrated in state 1503, the first housing 110, for example, may be coupled to the hinge housing 150, into which the hinge structures 300_1 and 300_2 are inserted, based on at least one magnet coupling part 111 and a screw coupling part 112 provided at an end of one side (e.g., a periphery of a lower side) of the first housing 110. The magnet coupling part 111, for example, may be coupled to the magnet members (e.g., the first magnet member 311 of the first hinge structure) of the hinge structures disposed in the bracket housings 310 and 380. The screw coupling part 112, for example, may be aligned with the coupling holes provided in the bracket housings 310 and 380 of the hinge structure, and may be coupled to the bracket housings 310 and 380 by screws.

According to various embodiments, although not illustrated, the second housing 120 may include a magnet coupling part and a screw coupling part similarly to the first housing 110, and may be coupled to a magnet member of the hinge structure (e.g., the second magnet member 381 of the first hinge structure) and the bracket housings 310 and 380.

Figure 16:
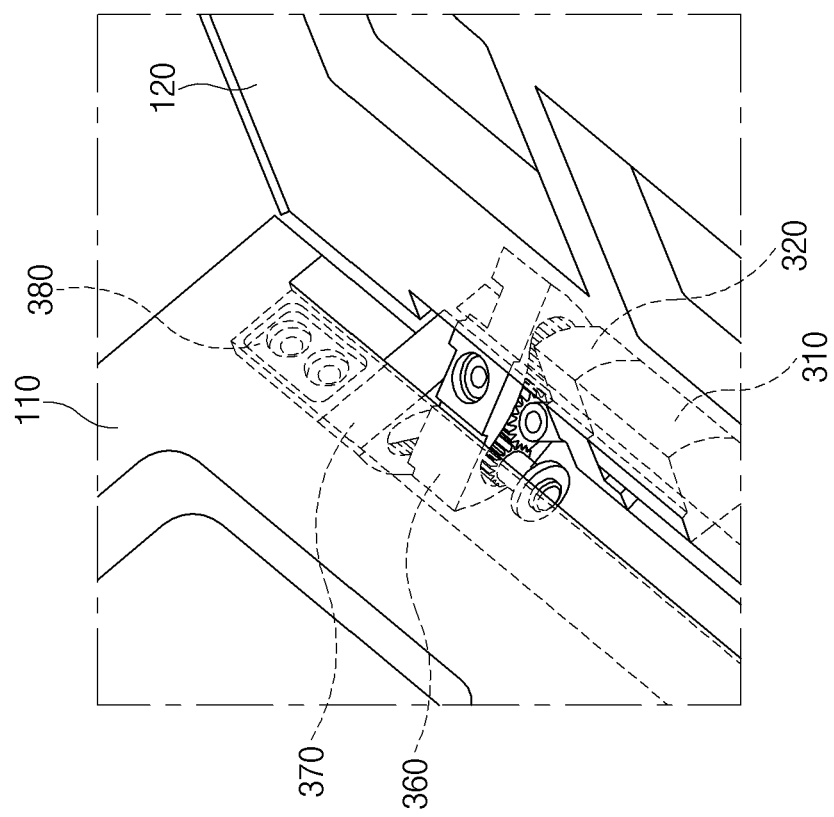
FIG. 16 is a view illustrating an example of a first folding angle state of a housing and a hinge structure according to various embodiments of the disclosure.
Figure 16:
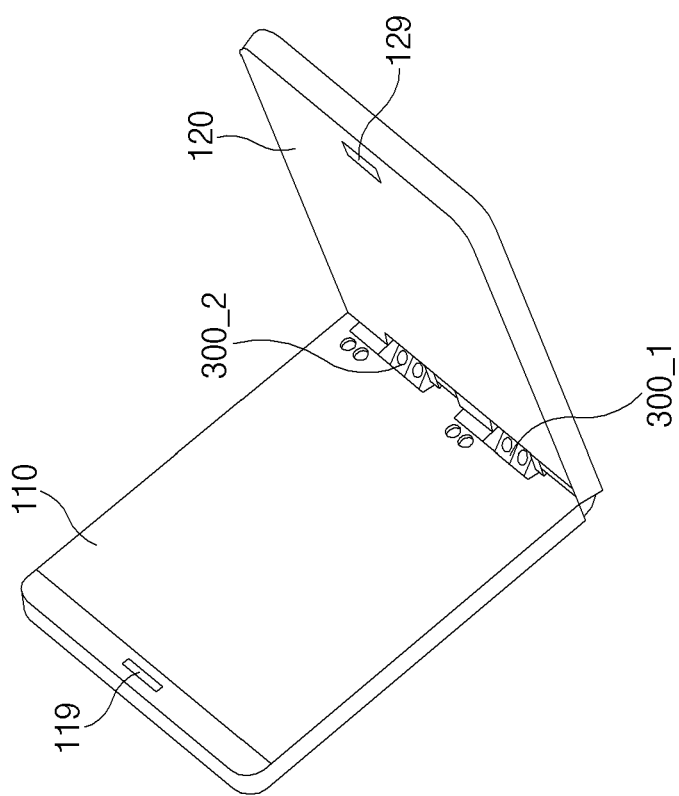

FIG. 16 is a view illustrating an example of a first folding angle state of a housing and a hinge structure according to various embodiments of the disclosure.

Referring to FIG. 16, as illustrated, in the foldable flexible display device 100, the first housing 110 and the second housing 120 may be in a state in which the first housing 110 and the second housing 120 are folded upwards at a first angle (e.g., 45 degrees) with reference to a state in which the first housing 110 and the second housing 120 are unfolded at 180 degrees. Accordingly, the angle defined by the first housing 110 and the second housing 120 may be a second angle (e.g., 90 degrees).

According to various embodiments, in a state in which the first housing 110 and the second housing 120 define the second angle, the first hinge structure 300_1 and the second hinge structure 300_2 may be in a folding state for achieving the second angle as illustrated. For example, the second bracket housing 380 connected to the first housing 110, and the second inner bracket gear 370 may be in a state in which the second bracket housing 380 and the second inner bracket gear 370 are rotated by the first angle clockwise with respect to a transverse center line of the second center bracket 360. In the second hinge structure 300_2, as the second bracket housing 380 and the second inner bracket gear 370 are rotated clockwise by the first angle, the second housing 120 may be rotated counterclockwise by the first angle. Accordingly, the first bracket housing 310 and the first inner bracket gear 320 connected to the second housing 120 may be rotated by the first angle with respect to the transverse center line of the first center bracket or the second center bracket 360.

According to various embodiments, as the first bracket housing 310 and the first inner bracket gear 320 connected to the second housing 120 are rotated counterclockwise by a specific angle, the first housing 110 attached to the first bracket housing 310 through magnet-coupling may be separated from the first bracket housing 310. According to various embodiments, while the first housing 110 and the second housing 120 are in flat states, an attractive force may be applied between the magnet member of the first bracket housing 310 and the magnet coupling part provided on one side of the first housing 110. Accordingly, although a force is not applied to completely unfold the first housing 110 and the second housing 120 flat, the first housing 110 and the second housing 120 may be automatically brought into flat states by the attractive force of the magnet member and the magnet coupling part.

According to various embodiments, the foldable flexible display device may further include a first magnetic force member 119 disposed on one side of an upper end of the first housing 110 and a second magnetic force member 129 disposed on one side of an upper end of the second housing 120.

According to various embodiments, the first magnetic force member 119 and the second magnetic force member 129 may act such that the first housing 110 and the second housing 120 pull each other by a force (e.g., an attractive force) of a magnetic force when surfaces of the first housing 110 and the second housing 120 nearly contact each other in a process of changing the state of the foldable flexible display device from an unfolding state to a folding state. Accordingly, the first magnetic force member 119 and the second magnetic force member 129 may give the user a feeling of a detention (a feeling as if the first housing 110 and the second housing 120 are stuck to each other while making a specific sound (e.g., a sound made when the first housing 110 and the second housing 120 are pulled by the magnetic force and then collide with each other) in a state in which an additional pressure is not applied). Further, the first magnetic force member 119 and the second magnetic force member 129 may pull each other in a folding state by the attractive force provided, the first housing 110 and the second housing 120 may be opened when a force of a specific intensity (a force of an intensity that is larger than a magnetic force that maintains a contact state of the first magnetic force member 119 and the second magnetic force member 129) is applied while the first housing 110 and the second housing 120 are prevented from being unfolded arbitrarily.

According to various embodiments, at least one of the first magnetic force member 119 or the second magnetic force member 129 may be a partial configuration of a Hall Effect integrated circuit (IC). In this case, in the foldable flexible display device 100, the state of the display 50 may be classified into an folding state or a unfolding state based on a sticking state or a separation state of the first magnetic force member 119 and the second magnetic force member 129, and the foldable flexible display device 100 may execute various functions corresponding to the state of the display 50.

According to various embodiments, the first magnetic force member 119 and the second magnetic force member 129 may protrude from surfaces of the housings 110 and 120 by specific heights. According to an embodiment, a total sum of the heights of the first magnetic force member 119 and the second magnetic force member 129 may correspond to a spacing distance between the first bracket housing 310 and the second bracket housing 380 when the first bracket housing 310 and the second bracket housing 380 are disposed perpendicularly to the center brackets 330 and 360. For example, a total sum of the heights of the first magnetic force member 119 and the second magnetic force member 129 may correspond to a spacing distance between the center of the first bracket housing 310 and the center of the second bracket housing 380 or a spacing distance between a tip end of an upper end of the first bracket housing 310 and a tip end of an upper end of the second bracket housing 380.

Accordingly, a gap of a folded part of the display 50 and a gap in a state in which an upper end and a lower end of the display 50 face each other may be similar or the same so that the display 50 may have a U shape in a folding state. Accordingly, stresses for the folded part of the display may be weaker than in a water drop shape.

Figure 17:
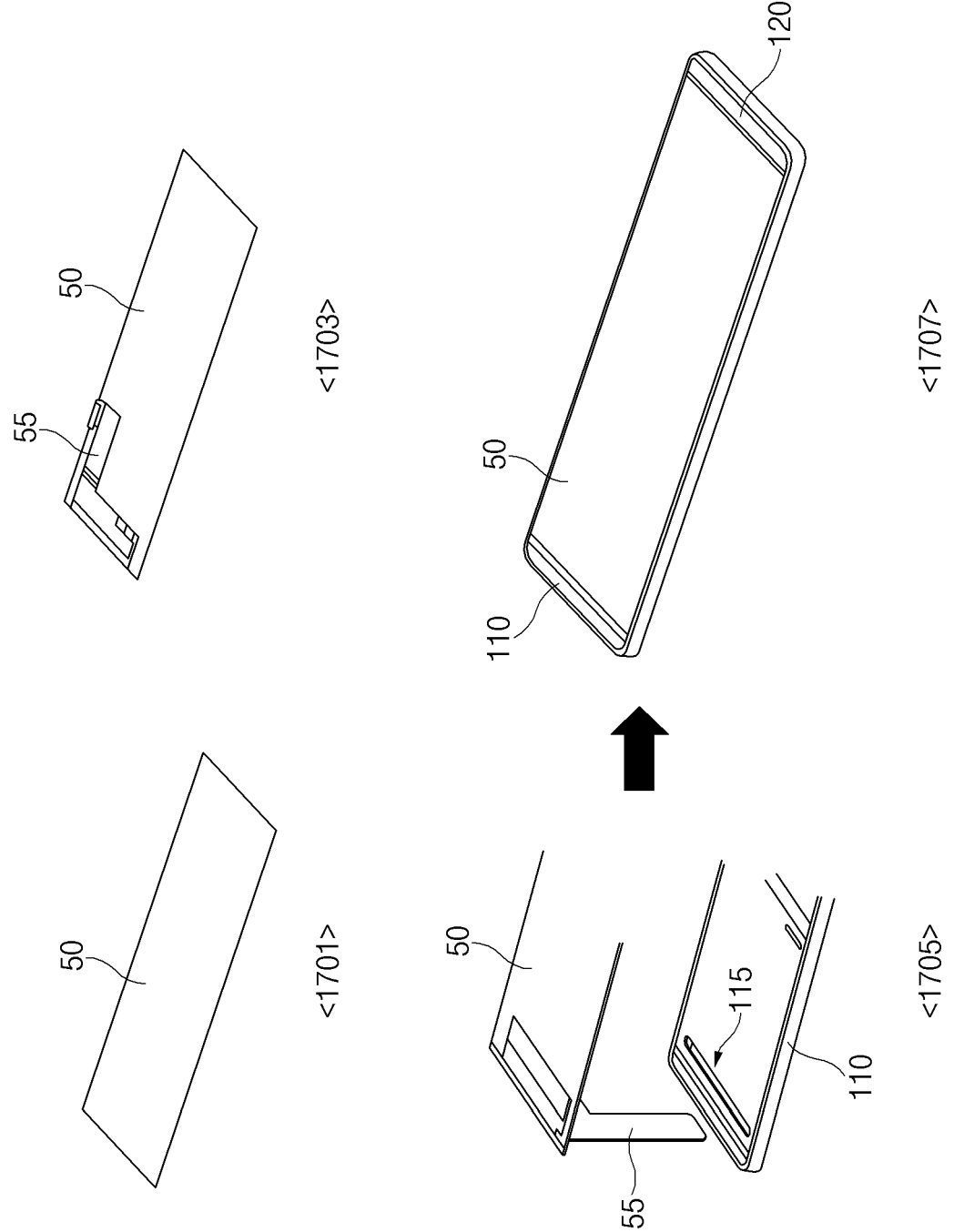
FIG. 17 is a view illustrating an example of a coupling form of a display and a housing of a foldable display device according to various embodiments of the disclosure.

FIG. 17 is a view illustrating an example of a coupling form of a display and a housing of a foldable display device according to various embodiments of the disclosure.

Referring to FIGS. 1 and 17, according to various embodiments, as illustrated, the display 50 may have a rectangular shape, a first direction length of which is relatively large as illustrated in state 1701 or 1703. The display 50 may output a screen related to an operation of the device on a front surface thereof as illustrated in state 1701, and a driver circuit 55 related to driving of the display 50 may be disposed on a rear surface of the display 50 as illustrated in state 1703.

The above-mentioned display 50 may be disposed on a rear surface of the first housing 110 through a circuit disposition hole 115 provided on one side of the first housing 110 as illustrated in state 1705. The driver circuit 55 disposed on the rear surface of the first housing 110 may be electrically connected to a printed circuit board related to an operation of the device. In this regard, the printed circuit board may be disposed on the rear surface of the first housing 110, and the first cover 130 may be disposed to cover the printed circuit board as illustrated in state 1705.

The display 50 may be fixed to a portion of a central area (e.g., a central area 52 of FIG. 1) of the front surface of the first housing 110 and at least a portion of an upper area of the front surface of the first housing 110, and may be fixed to a partial area (e.g., the central area 52 of FIG. 1) of the center of the front surface of the second housing 120 and at least a portion of a lower area of the front surface of the second housing 120 as illustrated in state 1707. A central area (e.g., the central area 52 of FIG. 1) of the display 50 may be stacked without being fixed to the first housing 110 and the second housing 120. The above-mentioned display 50 may be configured such that at least a portion of the display 50 is flexible. According to an embodiment, the display 50 may be configured such that a central area of the display 50 is flexible and the other areas of the display 50 are rigid. Alternatively, the display 50 may be configured such that the whole display 50 is flexible.

Figure 18:
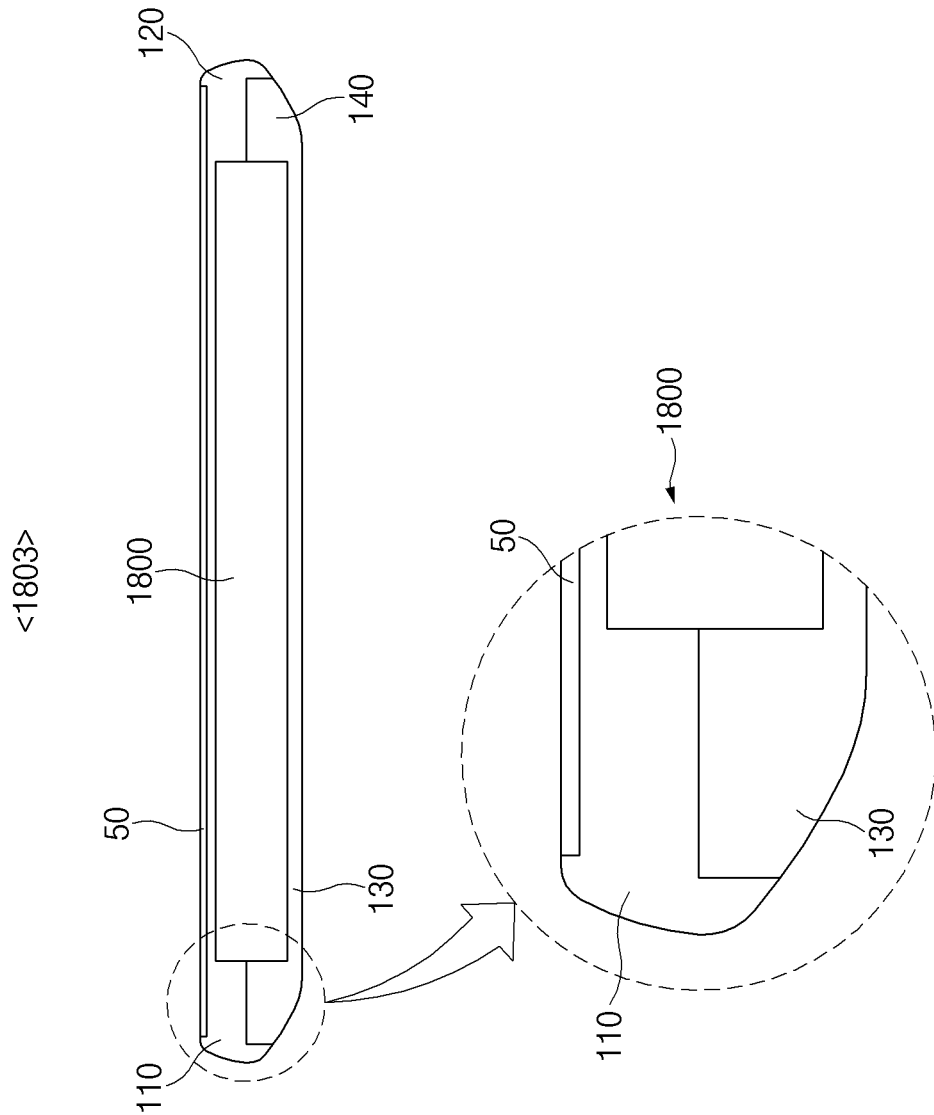
FIG. 18 is a view illustrating an example of a housing and a cover structure of a foldable display device according to various embodiments of the disclosure.
Figure 18:
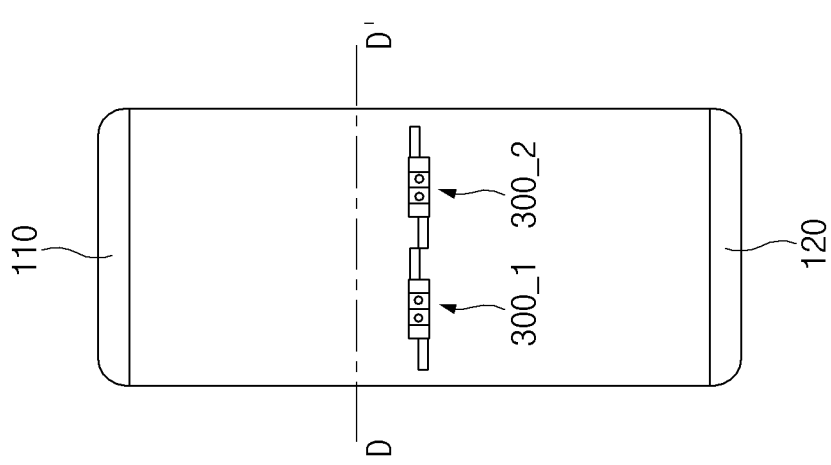

FIG. 18 is a view illustrating an example of a housing and a cover structure of a foldable display device according to various embodiments of the disclosure.

Referring to FIG. 18, according to various embodiments, in the foldable flexible display device 100, the first housing 110 and the second housing 120 may be successively disposed as illustrated in state 1801 according to a disposition form of the foldable flexible display device 100. Alternatively, as described above, the first housing 110 and the second housing 120 may be disposed to face each other. In the foldable flexible display device 100 in state 1801, the section of the foldable flexible display device 100 may be as illustrated in state 1803 when being cut away along cutting line D-D'. State 1801 represents a state in which the display 50 is removed from the housings 110 and 120, and the drawings of states 1803 and 1805 represent a section to which the display 50 is added.

According to various embodiments, as illustrated in states 1803 and 1805, the central portions of the front surfaces and the rear surfaces of the first housing 110 and the second housing 120 may be flat, and side walls protruding from the bottoms of the first housing 110 and the second housing 120 by specific heights may be disposed at peripheries of the front surface and the rear surface of the first housing 110 and the second housing 120. The side walls of the front surfaces of the first housing 110 and the second housing 120 may function to prevent the display 50 from deviating from the first housing 110 and the second housing 120, and to prevent the display 50 from being damaged by an external impact. The above-mentioned side walls of the front surfaces of the first housing 110 and the second housing 120, for example, may be bezels. The side walls of the rear surfaces of the first housing 110 and the second housing 120 may function as guards in which the first cover 130 and the second cover 140 may be positioned to be fixed.

According to various embodiments, the first housing 110 and the second housing 120, and the first cover 130 and the second cover 140 may define an interior cavity 1800 as illustrated in state 1803 in a coupling state. Electronic elements that are necessary for an operation of the device, for example, a printed circuit board and a battery, may be disposed in the interior cavity 1800 defined by the housings 110 and 120 and the covers 130 and 140. Additionally, as described above, a hinge housing and at least one hinge structure 300_1 and 300_2 may be disposed in a central area of the interior cavity 1800.

According to various embodiments, in the foldable flexible display device 100 having a display 50, a central area of which is foldable, a central portion of the hinge structure is constituted by the semielliptical center brackets 330 and 360 and the first main gear 341 and the second main gear 342 are disposed in areas that are biased to opposite peripheries of the semielliptical center brackets 330 and 360 so that the center brackets 330 and 360 and the main gears 341 and 342 may be rotated in opposite directions to form a folding angle of the display.

According to various embodiments, according to the disclosure, the display may be operated to be folded in a U shape while a bezel area is minimally realized, by disposing the center brackets, the main gears, and the bracket housings under the display. In the above-mentioned structure, the foldable flexible display device according to an embodiment, because the hinge housing 150 is disposed between the first housing 110 and the second housing 120 in a form of a single component, an external appearance of the hinge housing 150 may be exposed to the outside even in a folding state so that the foldable flexible display device may have a relatively appealing external appearance.

According to various embodiments, an electronic device (e.g., a foldable flexible display device) according to an embodiment may include a housing including a first housing structure (e.g., the first housing 110) and a second housing structure (e.g., the second housing 120), wherein the first housing structure includes a first surface and a second surface that is opposite to the first surface, wherein the second housing structure includes a third surface and a fourth surface that is opposite to the third surface, and wherein the first housing structure and the second housing structure are foldable with respect to each other, and the third surface faces the first surface in a folding state and the first surface and the third surface may face the same direction in an unfolding state, a hinge structure (e.g., the hinge structure 300) connecting a first peripheral part of the first housing structure to a second peripheral part of the second housing structure, and a flexible display layer (e.g., the display 50) extending across at least a portion of the first surface and at least a portion of the third surface and is foldable in the first peripheral part and the second peripheral part or an adjacent area of the first peripheral part and the second peripheral part, wherein the hinge structure includes a first shaft (e.g., the first main gear 341) including a first saw-toothed spur gear that rotates about a first axis that is parallel to the first surface, a second shaft (e.g., the second main gear 342) including a second saw-toothed spur gear that rotates about a second axis that is parallel to the first axis, a third saw-toothed spur gear engaged with the first saw-toothed spur gear to be rotatable, a fourth saw-toothed spur gear engaged with the second saw-toothed spur gear and the third saw-toothed spur gear to be rotatable, a first guide structure (e.g., the first inner bracket gear 320) fixed to the first housing structure, including a first curved opening (e.g., the curved hole of the inner bracket gear) having a first saw-toothed inner spur gear that is engaged with the first saw-toothed spur gear and is not engaged with any one of the second saw-toothed spur gear, the third saw-toothed spur gear, and the fourth saw-toothed spur gear, and rotated about a first imaginary axis that is parallel to the first axis, and a second guide structure (e.g., the second inner bracket gear 370) fixed to the second housing structure, including a second curved opening (e.g., the curved hole of the inner bracket gear) having a second saw-toothed inner spur gear that is engaged with the second saw-toothed spur gear and is not engaged with any one of the first saw-toothed spur gear, the third saw-toothed spur gear, and the fourth saw-toothed spur gear, and rotated about a second imaginary axis that is parallel to the first axis.

According to various embodiments, the first guide structure and the first shaft may be disposed at least a portion between the first surface and the second surface, and the second guide structure and the second shaft may be disposed at least a portion between the third surface and the fourth surface.

According to various embodiments, the first imaginary axis may be spaced apart from the first surface by an offset, and the second imaginary axis may be spaced apart from the third surface by an offset.

According to various embodiments, a foldable flexible display device according to an embodiment may include a display, a first housing supporting an upper area or an area of one side of the center of the display, a second housing supporting a lower area or an area of an opposite side (another side opposite to said one side) of the center of the display, and a hinge structure disposed between the first housing and the second housing to be coupled to the first housing and the second housing and disposed under the display, and the hinge structure may include a central body, a first main gear disposed to pass through a periphery of one side of the central body, a second main gear disposed to pass through a periphery of an opposite side (another side opposite to said one side of the central body) of the central body, a first inner bracket gear having a curved hole in the interior thereof, and an internal gear disposed around the hole and enmeshed with the first main gear, a second inner bracket gear having a curved hole in the interior thereof, and an internal gear disposed around the hole and enmeshed with the second main gear, a first bracket housing coupled to the first inner bracket gear and the second housing, and a second bracket housing coupled to the second inner bracket gear and the first housing.

Figure 19:
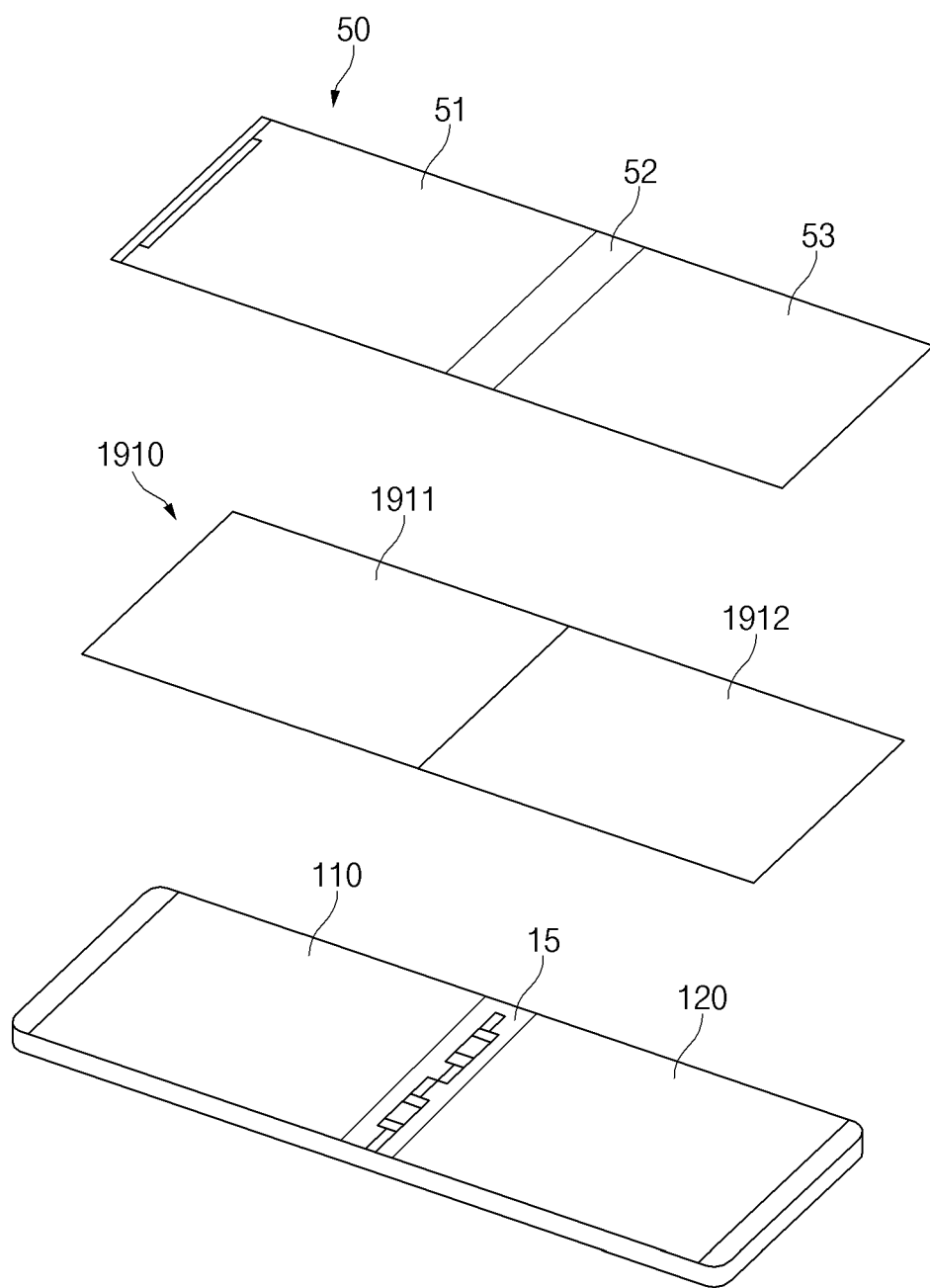
FIG. 19 is a view illustrating an example of a structure of an electronic device including a first plate according to various embodiments of the disclosure.

FIG. 19 is a view illustrating an example of a structure of an electronic device including a first plate according to various embodiments of the disclosure.

Referring to FIG. 19, the electronic device according to various embodiments may include a display 50, a first plate 1910, a first housing 110, and a second housing 120. As described above with reference to FIG. 1 and the like, the display 50 may include an upper area 51, a central area 52, and a lower area 53. The first plate 1910 may include a rigid plate of a specific strength or more to improve a surface quality of the display 50 (e.g., to improve flatness and to restrain wrinkles generated in the central area 52 of the display 50 due to repeated folding operations). Because the first plate 1910 is disposed on the first housing 110 and the second housing 120, at least a portion of the flexible display 50 may be restrained from having a defect, for example, bending or distortion, in a process of disposing the display 50 on the first housing 110 and the second housing 120.

The first plate 1910 may improve the flatness of the display 50 by a reducing operation that may partially generated on the first housing 110 and the second housing 120 on which various mechanisms are positioned. For example, when the display 50 is positioned in the hole areas or the recess areas of the housings 110 and 120, the corresponding areas (the recesses or holes or border portions thereof) may be lower than the peripheries thereof so that the flatness of the display 50 may become worse, and the first plate 1910 may function to reduce the operation.

The first plate 1910 may include an upper plate 1911 and a lower plate 1912. The upper plate 1911 may be fixed onto the first housing 110. In this regard, a bonding member having a specific width and a specific extent may be disposed on at least one surface between the upper plate 1911 and the first housing 110. An upper area 51 and a portion of a central area 52 of the display 50 may be positioned on the upper plate 1911. In relation to fixing of the upper area 51 of the display 50, a bonding member may be disposed between the upper plate 1911 and the upper area 51 of the display 50.

The lower plate 1912 may be fixed onto the second housing 120. In this regard, a bonding member having a specific width and a specific extent may be disposed on at least one surface between the lower plate 1912 and the second housing 120. A lower area 53 and a portion of a central area 52 of the display 50 may be positioned on the lower plate 1912. In relation to fixing of the lower area 53 of the display 50, a bonding member may be disposed between the lower plate 1912 and the lower area 53 of the display 50.

The upper plate 1911 and the lower plate 1912 may be separated from each other, and may be disposed to nearly contact each other.

For example, the upper plate 1911 and the lower plate 1912 are separately disposed, and the whole size of the upper plate 1911 and the lower plate 1912 may correspond to the whole size (e.g., the upper area 51, the central area 52, and the lower area 53) of the display 50. Accordingly, a partial area of a lower side of the upper plate 1911 may be disposed to cover a portion of the hinge area 15, and a partial area of an upper side of the lower plate 1912 may be disposed to cover the remaining portions of the hinge area 15. The partial area of the lower side of the upper plate 1911 disposed in the hinge area 15 and the partial area of the upper side of the lower plate 1912 disposed in the hinge area 15 may be disposed not to be bonded to the hinge area 15. Accordingly, while the electronic device is folded, the upper plate 1911 may rotate along the first housing 110 and the lower plate 1912 may rotate along the second housing 120.

Figure 20:
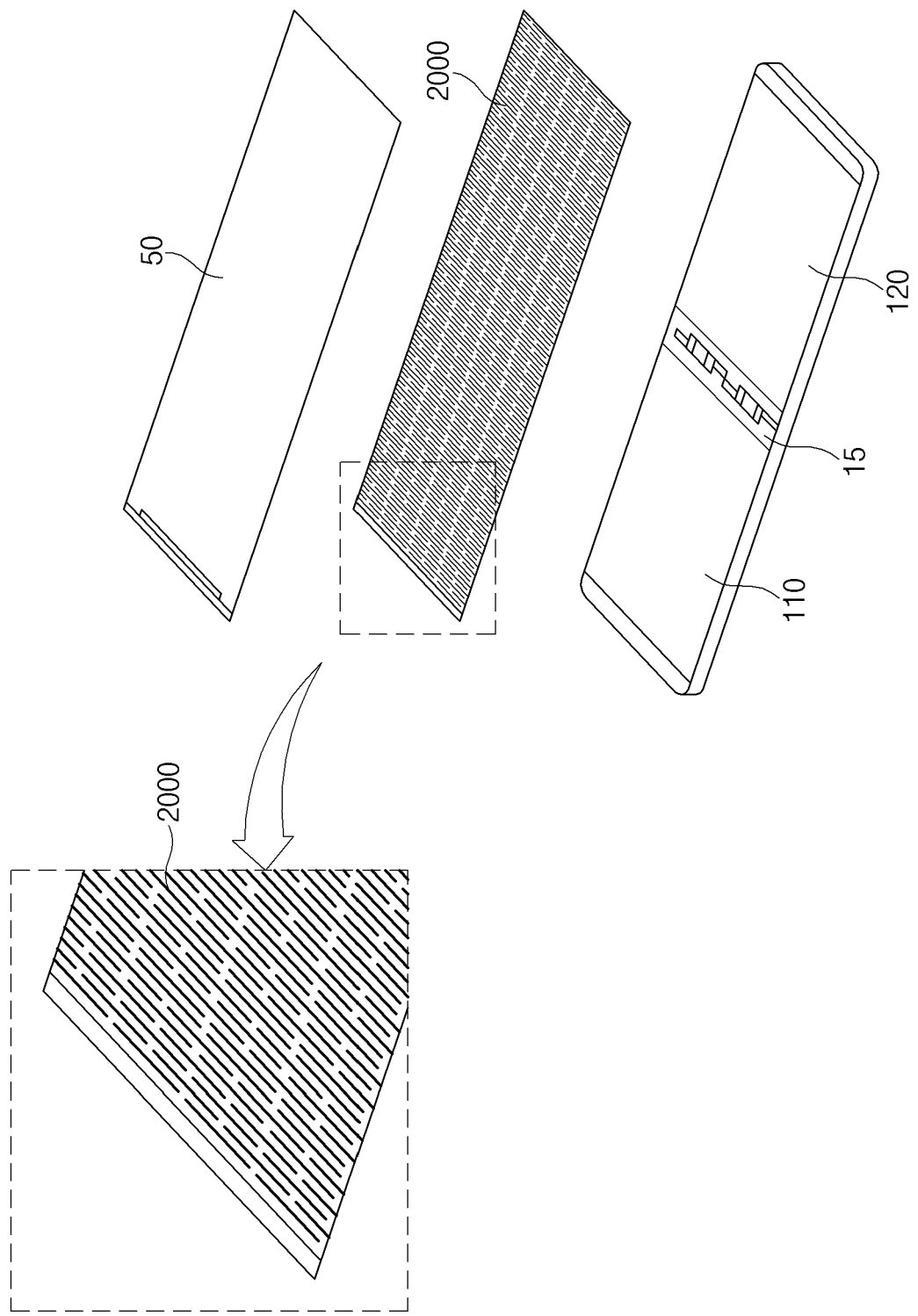
FIG. 20 is a view illustrating an example of a structure of an electronic device including a second plate according to various embodiments of the disclosure.

FIG. 20 is a view illustrating an example of a structure of an electronic device including a second plate according to various embodiments of the disclosure.

Referring to FIG. 20, the electronic device according to various embodiments may include a display 50, a second plate 2000, a first housing 110, and a second housing 120. A hinge area 15 in which a hinge structure is disposed may be provided between the first housing 110 and the second housing 120.

The second plate 2000 may have a specific pattern (e.g., a lattice pattern), and may have a size corresponding to the whole size of the display 50. At least a portion of the second plate 2000 may have a flexible structure such that the second plate 2000 may support a folding state of the display 50. For example, the second plate 2000 is formed of a metal (e.g., stainless steel) and has a thin thickness of a specific thickness or less, and as illustrated, may include a lattice pattern to make a folding operation easy and to achieve a structure that is robust to stress according to folding and unfolding operations.

Further, the second plate 2000 may have a special thickness or more to improve surface quality. The second plate 2000, for example, may include a lattice plate. When the lattice plate is disposed between the display 50, and the first housing 110, the hinge area 15, and the second housing 120, it may be attached to a front surface of the display 50. In this regard, a bonding member for fixing the display 50 to the second plate 2000 may be disposed on at least a portion of the front surface of the display 50 (including an entire peripheral area of the display 50). The second plate 2000 may be fixed onto the first housing 110 and the second housing 120. A separate bonding member is not disposed between the second plate 2000 and the hinge area 15, but may be disposed on the hinge area 15 such that the second plate 2000 is not fixed.

Figure 21:
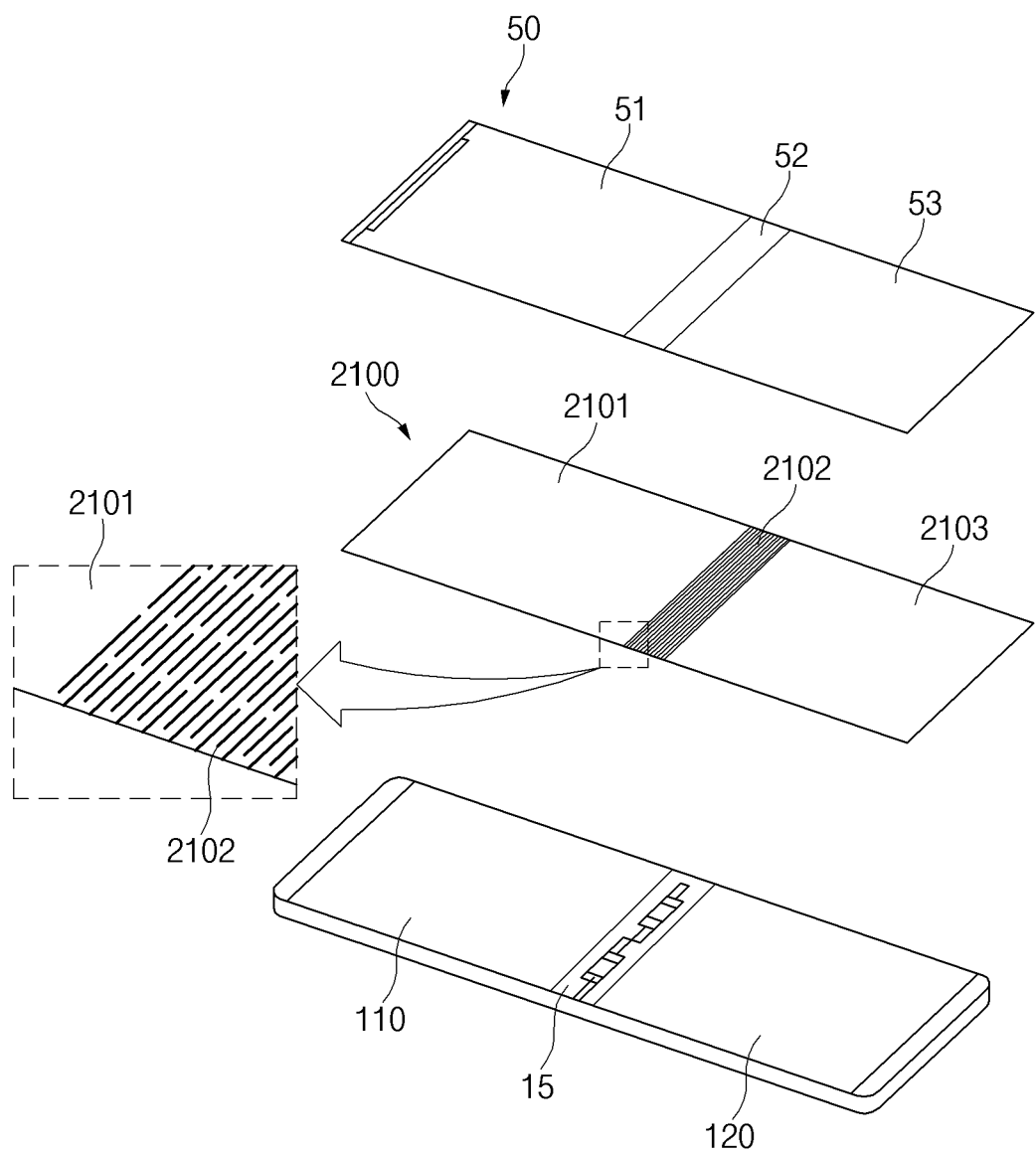
FIG. 21 is a view illustrating an example of a structure of an electronic device including a third plate according to various embodiments of the disclosure.

FIG. 21 is a view illustrating an example of a structure of an electronic device including a third plate according to various embodiments of the disclosure.

Referring to FIG. 21, the electronic device may include a display 50, a third plate 2100, a first housing 110, and a second housing 120, and a hinge area 15 may be disposed between the first housing 110 and the second housing 120.

The display 50 may include an upper area 51, a central area 52, and a lower area 53. The third plate 2100 may include an upper plate 2101, a lower plate 2103, and a middle plate 2102. The upper plate 2101 and the lower plate 2103 may be rigid plates. The middle plate 2102 may be a flexible plate as described in FIG. 20. The middle plate 2102 may have a size corresponding to the size of the central area 52 of the display 50. Alternatively, the middle plate 2102 may have a size corresponding to the size of the hinge area 15.

The upper plate 2101 of the third plate 2100 may be fixed onto the first housing 110. The lower plate 2103 may be fixed onto the second housing 120. In this regard, a bonding member may be disposed at least a part between the upper plate 2101 of the third plate 2100 and the first housing 110 and between the lower plate 2103 of the third plate 2100 and the second housing 120. The bonding member may be disposed between the upper plate 2101 and the upper area 51 of the display 50 such that the upper area 51 of the display 50 is fixed onto the upper plate 2101. The bonding member may be disposed between the lower plate 2103 and the lower area 53 of the display 50 such that the lower area 53 of the display 50 is fixed onto the lower plate 2103.

The middle plate 2102 may be fixed to the hinge area 15 through the bonding member, and may be prolonged during the hinge operations of the housings 110 and 120. The bonding member may be disposed between the middle plate 2102 and the central area 52 of the display 50, and the central area 52 of the display 50 may be fixed to the middle plate 2102. The intensity of the prolonging force (an extension degree) of the middle plate 2102 and the intensity of the prolonging force of the central area 52 of the display 50 may be the same or similar.

According to various embodiments, a separate bonding member is not disposed between the middle plate 2102 and the hinge area 15 so that the middle plate 2102 may not be fixed onto the hinge area 15. A separate bonding member is not disposed between the middle plate 2102 and the central area 52 of the display 50 so that the central area 52 of the display 50 may not be fixed to the middle plate 2102.

As mentioned above, according to various embodiments of the disclosure, the electronic device may employ at least one of the first to third plates 2101, 2102, and 2103 to flatten the stepped areas on the surfaces of the first housing 110 and the second housing 120, thereby improving the flatness of a surface of the display 50. Further, during folding and flat (unfolding) operations of the electronic device, the stress (or pressure) applied to the display 50 is distributed by the plate so that the display 50 may be restrained from being damaged or wrinkled.

In accordance with an aspect of the disclosure, there is provided a foldable flexible display device (or a foldable display device, or flexible display device) including a first housing, a second housing, a display disposed on the first housing and the second housing, a hinge structure coupled to one side of the first housing and one side of the second housing and disposed under the display, and a hinge housing surrounding the hinge structure, wherein the hinge structure includes center brackets having an semielliptical shape, a first inner bracket gear disposed to be rotatable along a first curve through a first main gear from peripheries of sides of the center brackets, and a second inner bracket gear disposed to be rotatable along a second curve through a second main gear from peripheries of opposite sides of the center brackets.

The foldable flexible display device may further include at least one shaft gear disposed between the first main gear and the second main gear.

The at least one shaft gear may include a first shaft gear contacting the first main gear such that rotational directions of the first main gear and the second main gear are opposite to each other, and a second shaft gear contacting the first shaft gear and the second main gear.

The center point of the first inner bracket gear may be spaced apart from the center points of the center brackets in a first direction by a first spacing distance, and the center point of the second inner bracket gear may be spaced apart from the center points of the center brackets in a second direction by a first spacing distance.

The thickness of the hinge housing may be smaller than the thickness of the first housing or the second housing.

The foldable flexible display device may further include a first bracket housing fixed to the first inner bracket gear and coupled to the second housing, and a second bracket housing fixed to the second inner bracket gear and coupled to the first housing.

The foldable flexible display device may further include a first magnet member disposed at a side of the first bracket housing and coupled to a side of the center of the second housing based on a magnetic force, and a second magnet member disposed at a side of the second bracket housing and coupled to a side of the center of the first housing based on a magnetic force.

The foldable flexible display device may further include at least one of a first magnetic member disposed on one side of an upper end of the first housing and a second magnet member disposed on one side of an upper end of the second housing, and a plate disposed between the first housing and the second housing and the display, having a size that corresponds to or is smaller than the size of the display, and having a specific thickness.

In accordance with an aspect of the disclosure, there is provided a foldable flexible display device including a display, a first housing supporting an upper area or an area of one side of the center of the display, a second housing supporting a lower area or an area of another side opposite to said one side of the center of the display, and a hinge structure disposed between the first housing and the second housing to be coupled to the first housing and the second housing and disposed under the display, wherein the hinge structure is configured such that an imaginary first rotation axis about which the first housing is rotated and an imaginary second rotation axis about which the second housing is rotated are located in a space that is spaced apart from a bottom surface of the display by a specific height.

The hinge structure may be operated to rotate the second housing by an angle by which the first housing is rotated in a first direction.

The hinge housing may be disposed under the display, may be disposed inside the first housing and the second housing in a state in which the first housing and the second housing are unfolded flat, and may be disposed such that at least a portion of the hinge housing is exposed to the outside in a state in which the first housing and the second housing are folded.

The hinge structure may include a central body, a first main gear disposed to pass through a periphery of one side of the central body, a second main gear disposed to pass through a periphery of another side opposite to said one said of the central body, a first inner bracket gear having a curved hole in the interior thereof, and an internal gear disposed around the hole and enmeshed with the first main gear, a second inner bracket gear having a curved hole in the interior thereof, and an internal gear disposed around the hole and enmeshed with the second main gear, a first bracket housing coupled to the first inner bracket gear and the second housing, and a second bracket housing coupled to the second inner bracket gear and the first housing, the curved hole of the first inner bracket gear may be configured such that the first inner bracket gear is rotatable within a first angle with respect to the central body, the curved hole of the second inner bracket gear may be configured such that the second inner bracket gear is rotatable within a second angle with respect to the central body, and the rotational directions of the first inner bracket gear and the second inner bracket gear may be opposite to each other.

The foldable flexible display device may further include a first magnetic force member disposed at one side of an upper end of the first housing, and a second magnetic force member disposed on one side of an upper end of the second housing and disposed at a location that faces the first magnetic force member in a state in which the first housing and the second housing are folded, and the first magnetic force member protrudes from a surface of an upper end of the first housing by a specific height and the second magnetic force member protrudes from a surface of an upper end of the second housing by a specific height.

A total sum of a protruding height of the first magnetic force member and a protruding height of the second magnetic force member may correspond to a spacing distance between one surface of the first inner bracket gear and one surface of the second inner bracket gear in a state in which the first housing and the second housing are folded.

Figure 22:
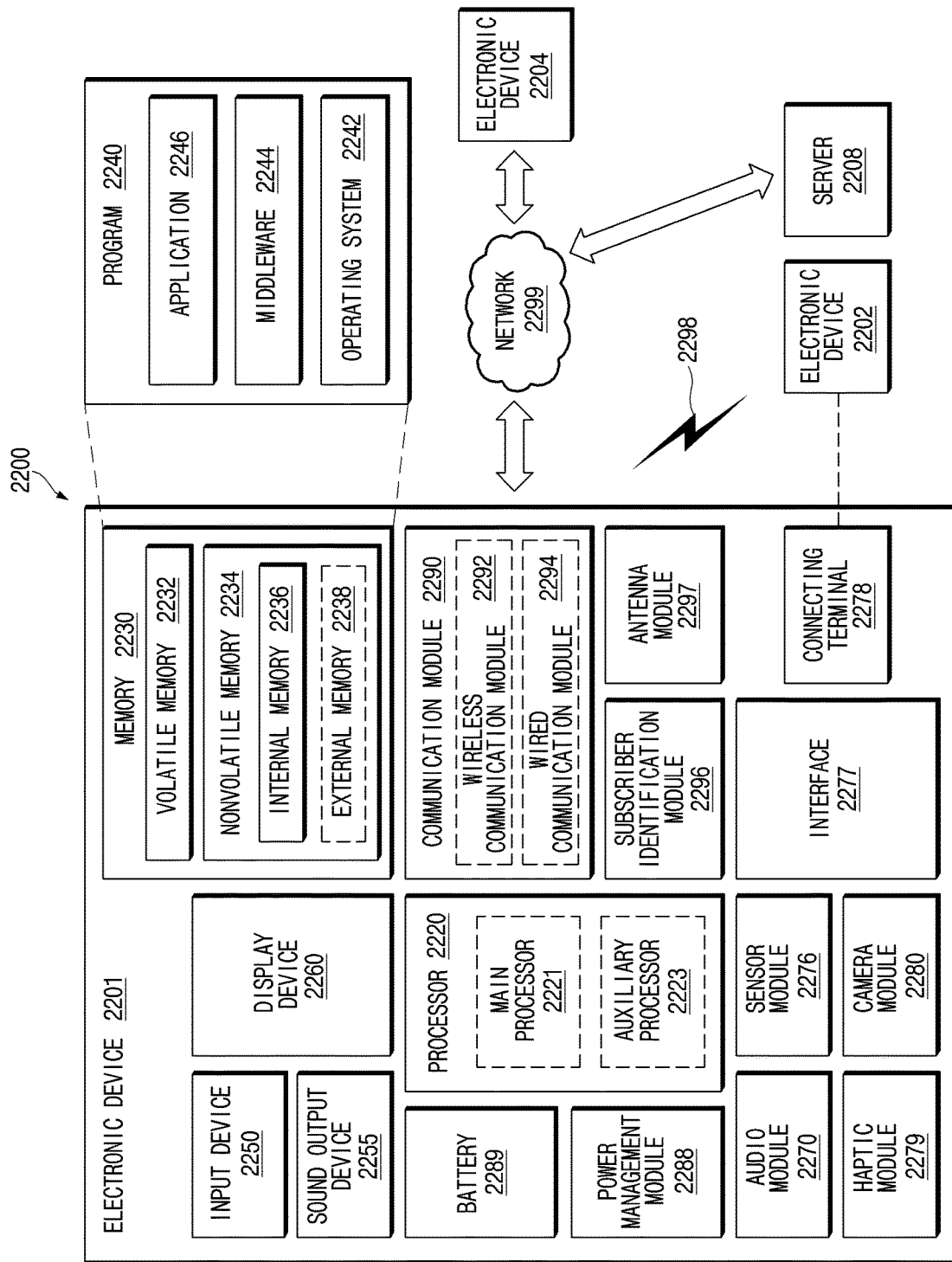
FIG. 22 is a block diagram of an electronic device in a network environment according to various embodiments of the disclosure.
Figure 23:
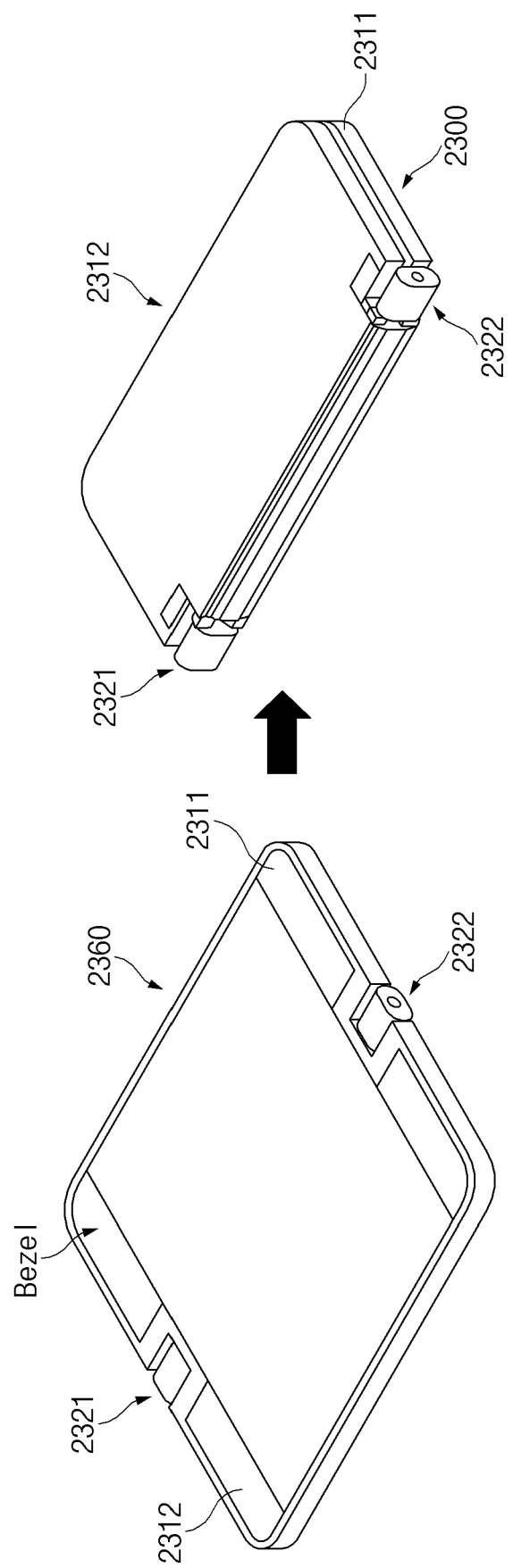
FIG. 23 is a view illustrating an example of a foldable electronic device according to the related art.

FIG. 22 is a block diagram illustrating an electronic device in a network environment according to various embodiments of the disclosure.

Referring to FIG. 22, an electronic device 2201 in a network environment 2200 may communicate with an electronic device 2202 via a first network 2298 (e.g., a short-range wireless communication network), or an electronic device 2204 or a server 2208 via a second network 2299 (e.g., a long-range wireless communication network). According to an embodiment, the electronic device 2201 may communicate with the electronic device 2204 via the server 2208. According to an embodiment, the electronic device 2201 may include a processor 2220, memory 2230, an input device 2250, a sound output device 2255, a display device 2260, an audio module 2270, a sensor module 2276, an interface 2277, a haptic module 2279, a camera module 2280, a power management module 2288, a battery 2289, a communication module 2290, a subscriber identification module (SIM) 2296, or an antenna module 2297. In some embodiments, at least one (e.g., the display device 2260 or the camera module 2280) of the components may be omitted from the electronic device 2201, or one or more other components may be added in the electronic device 2201. In some embodiments, some of the components may be implemented as single integrated circuitry. For example, the sensor module 2276 (e.g., a fingerprint sensor, an iris sensor, or a luminance sensor) may be implemented as embedded in the display device 2260 (e.g., a display).

The processor 2220 may execute, for example, software (e.g., a program 2240) to control at least one other component (e.g., a hardware or software component) of the electronic device 2201 coupled with the processor 2220, and may perform various data processing or computation. According to one embodiment, as at least part of the data processing or computation, the processor 2220 may load a command or data received from another component (e.g., the sensor module 2276 or the communication module 2290) in volatile memory 2232, process the command or the data stored in the volatile memory 2232, and store resulting data in non-volatile memory 2234. According to an embodiment, the processor 2220 may include a main processor 2221 (e.g., a CPU or an AP), and an auxiliary processor 2223 (e.g., a graphics processing unit (GPU), an image signal processor (ISP), a sensor hub processor, or a communication processor (CP)) that is operable independently from, or in conjunction with, the main processor 2221. Additionally or alternatively, the auxiliary processor 2223 may be adapted to consume less power than the main processor 2221, or to be specific to a specified function. The auxiliary processor 2223 may be implemented as separate from, or as part of the main processor 2221.

The auxiliary processor 2223 may control at least some of functions or states related to at least one component (e.g., the display device 2260, the sensor module 2276, or the communication module 2290) among the components of the electronic device 2201, instead of the main processor 2221 while the main processor 2221 is in an inactive (e.g., sleep) state, or together with the main processor 2221 while the main processor 2221 is in an active state (e.g., executing an application). According to an embodiment, the auxiliary processor 2223 (e.g., an ISP or a CP) may be implemented as part of another component (e.g., the camera module 2280 or the communication module 2290) functionally related to the auxiliary processor 2223.

The memory 2230 may store various data used by at least one component (e.g., the processor 2220 or the sensor module 2276) of the electronic device 2201. The various data may include, for example, software (e.g., the program 2240) and input data or output data for a command related thereto [d1]. The memory 2230 may include the volatile memory 2232 or the non-volatile memory 2234.

The program 2240 may be stored in the memory 2230 as software, and may include, for example, an operating system (OS) 2242, middleware 2244, or an application 2246.

The input device 2250 may receive a command or data to be used by other component (e.g., the processor 2220) of the electronic device 2201, from the outside (e.g., a user) of the electronic device 2201. The input device 2250 may include, for example, a microphone, a mouse, or a keyboard.

The sound output device 2255 may output sound signals to the outside of the electronic device 2201. The sound output device 2255 may include, for example, a speaker or a receiver. The speaker may be used for general purposes, such as playing multimedia or playing record, and the receiver may be used for an incoming call [d2] According to an embodiment, the receiver may be implemented as separate from, or as part of the speaker.

The display device 2260 may visually provide information to the outside (e.g., a user) of the electronic device 2201. The display device 2260 may include, for example, a display, a hologram device, or a projector and control circuitry to control a corresponding one of the display, hologram device, and projector. According to an embodiment, the display device 2260 may include touch circuitry adapted to detect a touch, or sensor circuitry (e.g., a pressure sensor) adapted to measure the intensity of force incurred by the touch.

The audio module 2270 may convert a sound into an electrical signal and vice versa. According to an embodiment, the audio module 2270 may obtain the sound via the input device 2250, or output the sound via the sound output device 2255 or a headphone of an external electronic device (e.g., an electronic device 2202) directly (e.g., wiredly) or wirelessly coupled with the electronic device 2201.

The sensor module 2276 may detect an operational state (e.g., power or temperature) of the electronic device 2201 or an environmental state (e.g., a state of a user) external to the electronic device 2201, and then generate an electrical signal or data value corresponding to the detected state. According to an embodiment, the sensor module 2276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2277 may support one or more specified protocols to be used for the electronic device 2201 to be coupled with the external electronic device (e.g., the electronic device 2202) directly (e.g., wiredly) or wirelessly. According to an embodiment, the interface 2277 may include, for example, a high definition multimedia interface (HDMI), a universal serial bus (USB) interface, a secure digital (SD) card interface, or an audio interface.

A connecting terminal 2278 may include a connector via which the electronic device 2201 may be physically connected with the external electronic device (e.g., the electronic device 2202). According to an embodiment, the connecting terminal 2278 may include, for example, a HDMI connector, a USB connector, a SD card connector, or an audio connector (e.g., a headphone connector).

The haptic module 2279 may convert an electrical signal into a mechanical stimulus (e.g., a vibration or a movement) or electrical stimulus which may be recognized by a user via his tactile sensation or kinesthetic sensation. According to an embodiment, the haptic module 2279 may include, for example, a motor, a piezoelectric element, or an electric stimulator.

The camera module 2280 may capture a still image or moving images. According to an embodiment, the camera module 2280 may include one or more lenses, image sensors, image signal processors, or flashes.

The power management module 2288 may manage power supplied to the electronic device 2201. According to one embodiment, the power management module 2288 may be implemented as at least part of, for example, a power management integrated circuit (PMIC).

The battery 2289 may supply power to at least one component of the electronic device 2201. According to an embodiment, the battery 2289 may include, for example, a primary cell which is not rechargeable, a secondary cell which is rechargeable, or a fuel cell.

The communication module 2290 may support establishing a direct (e.g., wired) communication channel or a wireless communication channel between the electronic device 2201 and the external electronic device (e.g., the electronic device 2202, the electronic device 2204, or the server 2208) and performing communication via the established communication channel. The communication module 2290 may include one or more CPs that are operable independently from the processor 2220 (e.g., the AP) and supports a direct (e.g., wired) communication or a wireless communication. According to an embodiment, the communication module 2290 may include a wireless communication module 2292 (e.g., a cellular communication module, a short-range wireless communication module, or a global navigation satellite system (GNSS) communication module) or a wired communication module 2294 (e.g., a local area network (LAN) communication module or a power line communication (PLC) module). A corresponding one of these communication modules may communicate with the external electronic device via the first network 2298 (e.g., a short-range communication network, such as Bluetooth™, wireless-fidelity (Wi-Fi) direct, or infrared data association (IrDA)) or the second network 2299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2292 may identify and authenticate the electronic device 2201 in a communication network, such as the first network 2298 or the second network 2299, using subscriber information (e.g., international mobile subscriber identity (IMSI)) stored in the SIM 2296.

The antenna module 2297 may transmit or receive a signal or power to or from the outside (e.g., the external electronic device) of the electronic device 2201. According to an embodiment, the antenna module 2297 may include one or more antennas, and, therefrom, at least one antenna appropriate for a communication scheme used in the communication network, such as the first network 2298 or the second network 2299, may be selected, for example, by the communication module 2290 (e.g., the wireless communication module 2292). The signal or the power may then be transmitted or received between the communication module 2290 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2201 and the external electronic device 2204 via the server 2208 coupled with the second network 2299. Each of the electronic devices 2202 and 2204 may be a device of a same type as, or a different type, from the electronic device 2201. According to an embodiment, all or some of operations to be executed at the electronic device 2201 may be executed at one or more of the external electronic devices 2202, 2204, or 2208. For example, if the electronic device 2201 should perform a function or a service automatically, or in response to a request from a user or another device, the electronic device 2201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2201. The electronic device 2201 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 2240) including one or more instructions that are stored in a storage medium (e.g., internal memory 2236 or external memory 2238) that is readable by a machine (e.g., the electronic device 2201). For example, a processor (e.g., the processor 2220) of the machine (e.g., the electronic device 2201) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 24:
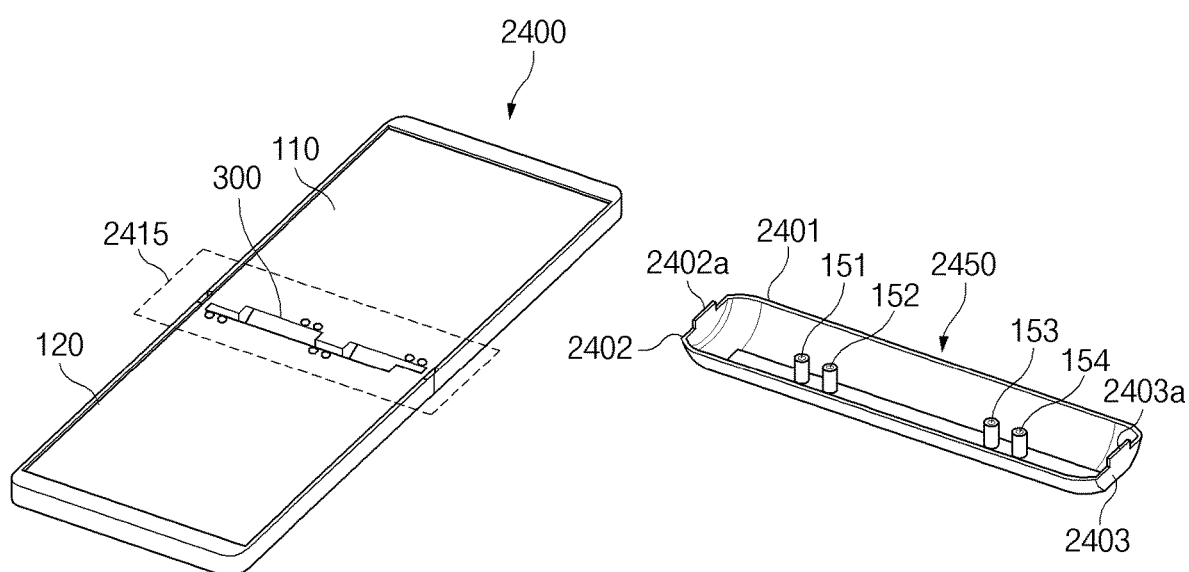
FIG. 24 is a view illustrating an example of a first type hinge housing of a foldable display device and a configuration of the foldable display device according to various embodiments of the disclosure.
Figure 25:
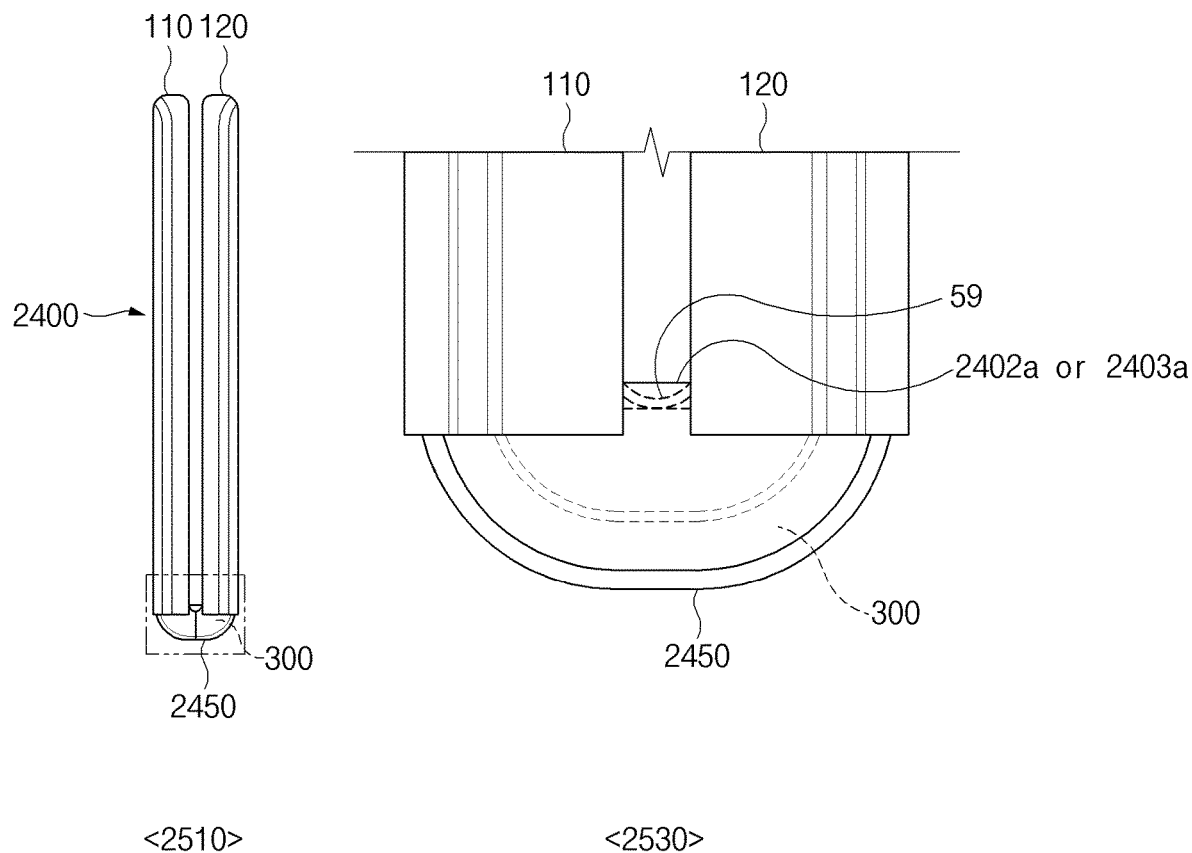
FIG. 25 is a view illustrating a folding state of a foldable display device including a first type hinge housing according to various embodiments of the disclosure.
Figure 26:
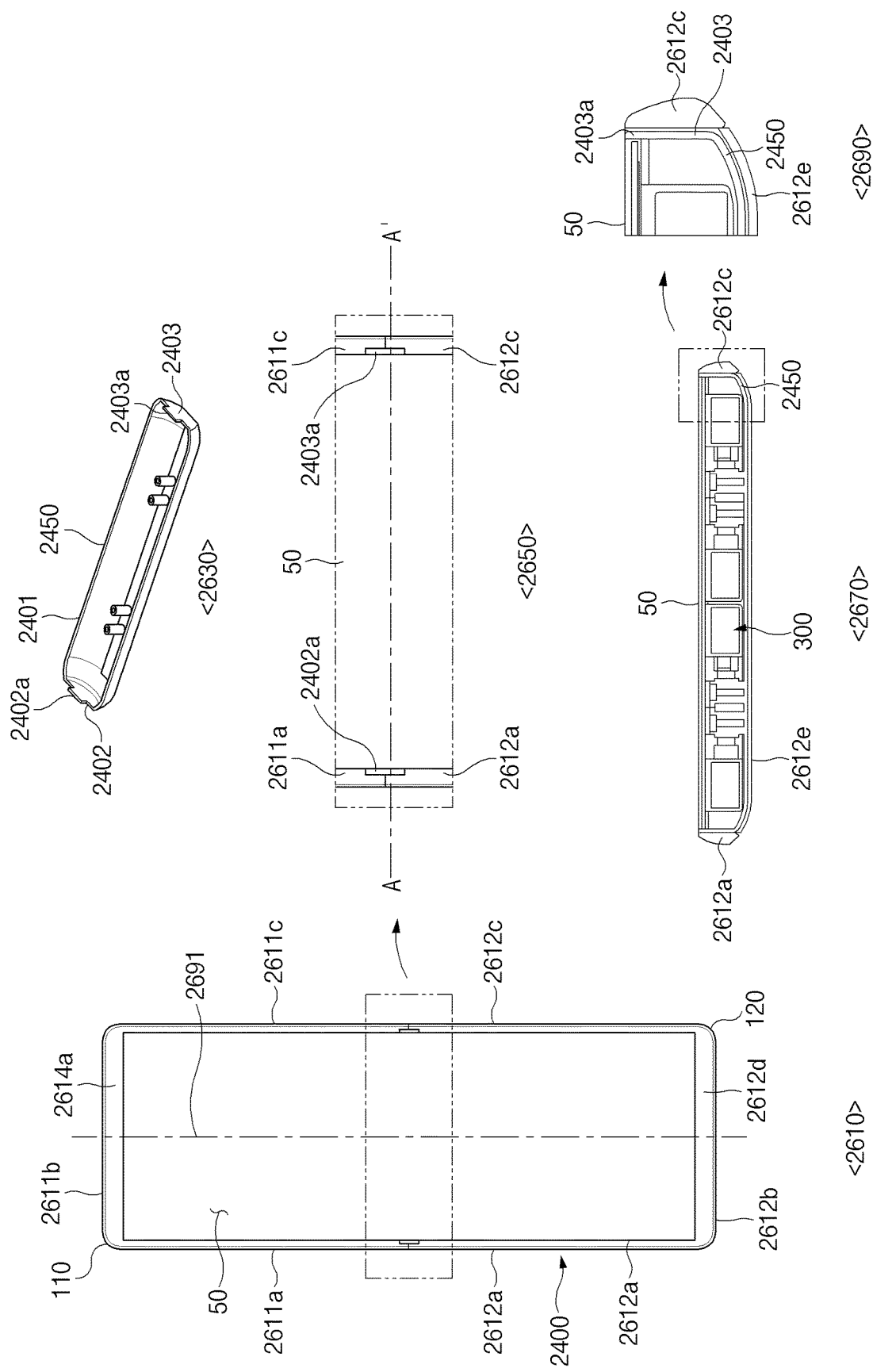
FIG. 26 is a view illustrating various states related to a central portion of a foldable display device including a first type hinge housing according to various embodiments of the disclosure.
Figure 27:
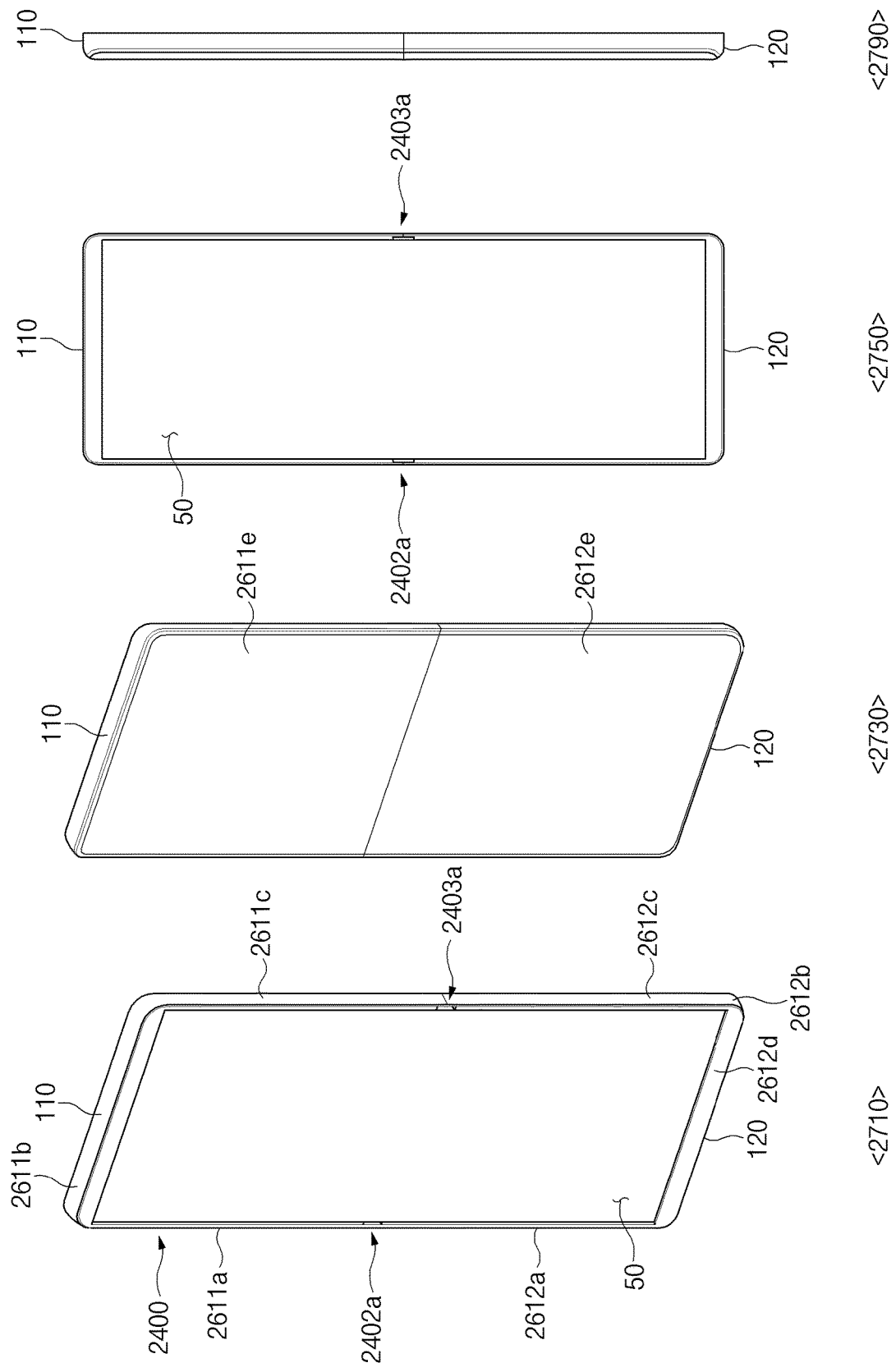
FIG. 27 is a view illustrating unfolding states for specific angles of a foldable display device including a first type hinge housing according to various embodiments of the disclosure.
Figure 28:
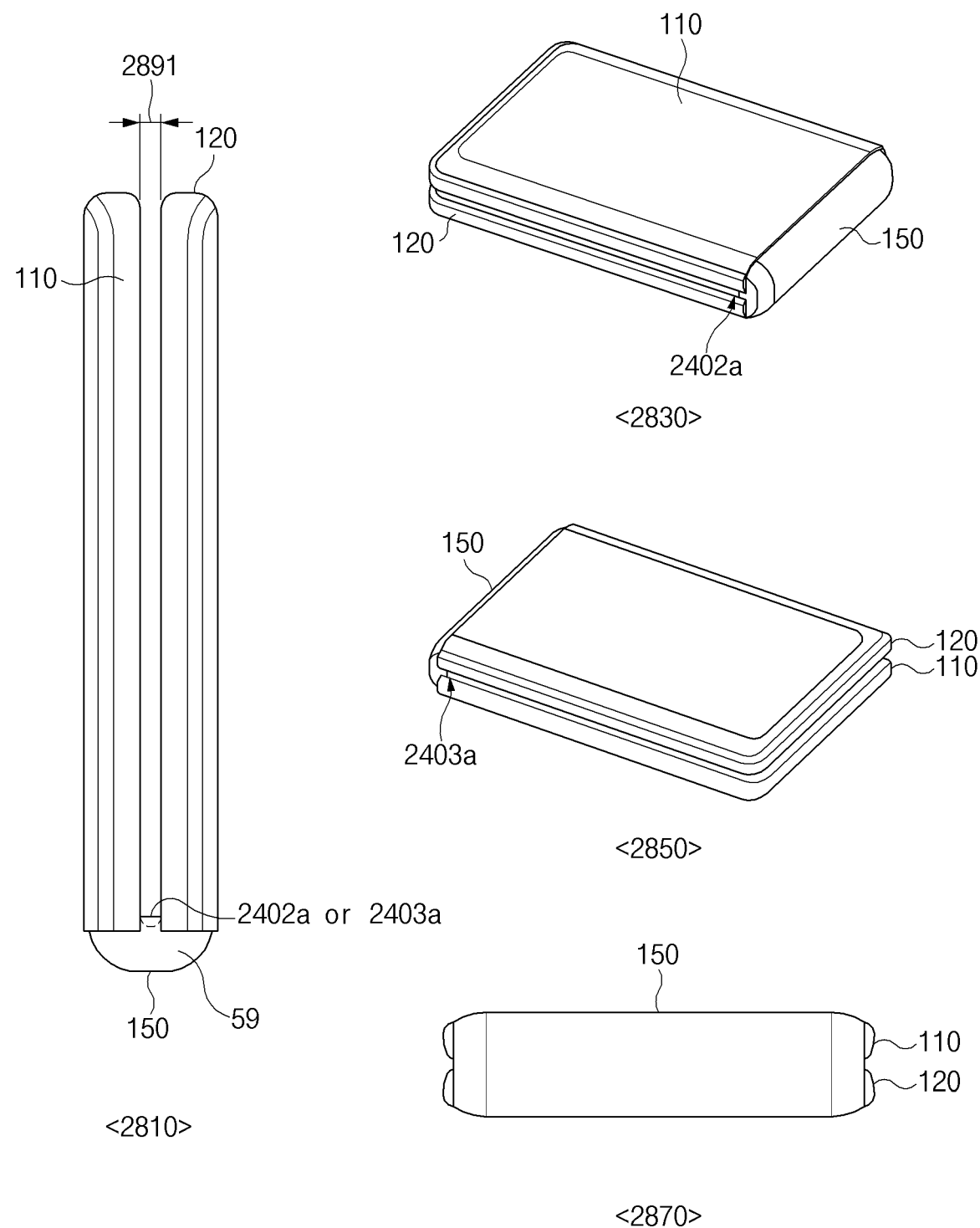
FIG. 28 is a view illustrating folding states for specific angles of a foldable display device including a first type hinge housing according to various embodiments of the disclosure.

FIG. 24 is a view illustrating an example of a first type hinge housing of a foldable display device and a configuration of the foldable display device according to various embodiments of the disclosure. FIG. 25 is a view illustrating a folding state of a foldable display device including a first type hinge housing according to various embodiments of the disclosure. FIG. 26 is a view illustrating various states related to a central portion of a foldable display device including a first type hinge housing according to various embodiments of the disclosure. FIG. 27 is a view illustrating unfolding states for specific angles of a foldable display device including a first type hinge housing according to various embodiments of the disclosure. FIG. 28 is a view illustrating folding states for specific angles of a foldable display device including a first type hinge housing according to various embodiments of the disclosure.

Referring to FIGS. 24, 25, 26, 27, and 28, as illustrated in states 2410 and 2430, the foldable flexible display device 2400 may include a first housing 110, a second housing 120, a hinge structure 300, a first type hinge housing 2450 disposed at a central portion 2415 of the device. According to various embodiments, as illustrated in FIG. 26, a display 50, at least a portion of which is flexible, may be disposed on front surfaces of the first housing 110 and the second housing 120 (e.g., upper surfaces of the housings 110 and 120 with reference to the drawing).

The first housing 110 and the second housing 120 may be folded based on the hinge structure 300 (e.g., folded in a direction in which the upper surface of the first housing 110 and the upper surface of the second housing 120 face each other). The hinge structure 300 may be inserted into the first type hinge housing 2450 of a half-pipe type. The hinge structure 300 may be coupled to bosses 151, 152, 153, and 154 while being inserted into the first type hinge housing 2450 to be fixed to the first type hinge housing 2450.

As illustrated in states 2410 and 2430, the first type hinge housing 2450 may be disposed at a central portion of the foldable flexible display device 2400. In a state in which the first housing 110 and the second housing 120 are unfolded, one side of the first type hinge housing 2450 may be inserted into a tip end of one side of the first housing 110 (e.g., a tip end of the first housing 110 that faces the second housing 120), and an opposite side of the first type hinge housing 2450 may be inserted into a tip end of one side of the second housing 120 (e.g., a tip end of the second housing 120 that faces the first housing 110). As illustrated in states 2510 and 2530 of FIG. 25, at least a portion of the first type hinge housing 2450 may be exposed to the outside in a state in which the first housing 110 and the second housing 120 are folded (e.g., a state in which an upper surface of the first housing 110 and an upper surface of the second housing 120 face each other).

The first type hinge housing 2450 may include a half-pipe shaped hinge housing body 2401, and bosses 151, 152, 153, and 154 may be disposed inside the first type hinge housing 2450. The first type hinge housing 2450 may include at least one of a first side wall 2402 that blocks a left opening of the hinge housing body 2401 and a second side wall 2403 that blocks a right opening of the hinge housing body 2401. The first side wall 2402 and the second side wall 2403, for example, may have a semielliptical shape. The first side wall 2402 and the second side wall 2403 may be disposed at locations that are symmetrical to the center of the hinge housing body 2401 at opposite two sides of the center.

The first type hinge housing 2450 may include at least one of a first shield 2402a protruding from an upper end of the first side wall 2402 by a specific height and a second shield 2403a protruding from an upper end of the second side wall 2403 by a specific height. The thickness of the first shield 2402a may be the same as that of the first side wall 2402. The width of the first shield 2402a may be smaller than that of the first side wall 2402. According to various embodiments, the first shield 2402a may have a width that is larger than a width of an aperture between the first housing 110 and the second housing 120 while the first housing 110 and the second housing 120 are folded. The first shield 2402a may have a height by which an area, in which the display 50 is exposed through an aperture of an area in which the first housing 110 and the second housing 120 face each other, may be covered in a state in which the display 50 positioned on the first housing 110 and the second housing 120 is folded. The second shield 2403a may have a size and a shape that are substantially the same as the first shield 2402a.

As illustrated in states 2510 and 2530, the first shield 2402a and the second shield 2403a may cover the display folding part 59 such that the display folding part 59 is not exposed to the outside in a state in which the upper surface of the first housing 110 and the upper surface of the second housing 120 face each other. The remaining portions of the display, except for the folding part 59, may be attached to the bottom surfaces of the first housing 110 and the second housing 120 so as not to be observed from the outside in a state in which the first housing 110 and the second housing 120 are folded.

Although it has been exemplified that the first shield 2402a and the second shield 2403a protrude from the side walls 2402 and 2403 in a rectangular boss shape, the disclosure is not limited thereto. For example, at least one of upper ends of the first shield 2402a and the second shield 2403a may have various shapes. For example, the various shapes may include a half-moon shape that is convex upwards (e.g., in a direction opposite to the bottom surface of the first type hinge housing 2450 on which the bosses 151, 152, 153 and 154 are positioned), a half-moon shape that is concave downwards (e.g., in a direction of the bottom surface of the first type hinge housing 2450 on which the bosses 151, 152, 153 and 154 are positioned), a convexo-concave shape, a diamond shape, and a polygonal shape.

Referring to FIGS. 26 and 27, as illustrated in state 2610, and states 2710 to 2790, the display 50 of the foldable flexible display device 2400 may be in an unfolding state. In this regard, the first housing 110 and the second housing 120 may be in an unfolding state, and the display 50 may be positioned on the upper surfaces of the first housing 110 and the second housing 120.

As illustrated in states 2610 and 2730, the first housing 110 may include a first side surface 2611a, a second side surface 2611b, a third side surface 2611c, a first upper surface 2614a, and a first rear surface 2611e.

The first side surface 2611a, for example, may be located on a left surface of the foldable flexible display device 2400, and in an unfolding state, one side of the first side surface 2611a (e.g., a tip end of a lower side of the first side surface 2611a disposed downwards with reference to state 2610 or 2710) may be disposed to face one surface of the fourth side surface 2612a of the second housing 120 (e.g., a tip end of an upper side of the fourth side surface 2612a disposed upwards with reference to state 2610 or 1710). An opposite side of the first side surface 2611a (e.g., a tip end of an upper side of the first side surface 2611a disposed upwards with reference to state 2610 or 2710) may be connected to one side of the second side surface 2611b. As illustrated in state 2730, a lower side of the first side surface 2611a (e.g., a lower surface of the first side surface 2611a when viewed from an upper surface of the display 50 of the foldable flexible display device 2400 towards the bottom surface of the display 50) may be connected to one side of the first rear surface 2611e. As illustrated in states 2710 to 2750, an upper side of the first side surface 2611a (e.g., an upper end that is opposite to the lower side of the first side surface 2611a) may be disposed to surround a periphery of the display 50. According to various embodiments, the upper side of the first side surface 2611a may protrude farther than an inner bottom surface of the first housing 110 by a specific height (e.g., a height that is larger than the thickness of the display 50).

The second side surface 2611b may be located on a side surface of an upper end of the foldable flexible display device 2400. As illustrated in state 2610 or 2710, the second side surface 2611b, for example, may be disposed between the first side surface 2611a and the third side surface 2611c. Accordingly, left and right ends of the second side surface 2611b may be connected to the first side surface 2611a and the third side surface 2611c while having specific angles (e.g., 90 degrees), respectively. According to various embodiments, one side of the second side surface 2611b (e.g., the upper surface of the second side surface 2611b) may be connected to one side of the first upper surface 2614a. An opposite side of the second side surface 2611b (e.g., a lower surface of the second side surface 2611b) may be connected to one side of the first rear surface 2611e.

The third side surface 2611c, for example, may be located on a right surface of the foldable flexible display device 2400, and in an unfolding state, one side of the third side surface 2611c (e.g., a tip end of a lower side of the third side surface 2611c disposed downwards with reference to state 2610 or 2710) may be disposed to face one surface of the sixth side surface 2612c of the second housing 120 (e.g., a tip end of an upper side of the sixth side surface 2612c disposed upwards with reference to state 2610 or 2710). As illustrated in state 2610, the third side surface 2611c may have a location and a shape that are symmetrical leftwards and rightwards to the first side surface 2611a with reference to an imaginary longitudinal center line 2691 of the foldable flexible display device 2400. In correspondence, the third side surface 2611c may be connected to another side opposite to the first side surfaces 2611a of the first rear surface 2611e, and an upper side of the third side surface 2611c may protrude farther than the bottom of the inside of the first housing 110 by a specific height (e.g., a height of the thickness of the display 50 or more). According to various embodiments, the heights of the upper side of the first side surface 2611a protruding from the bottom surface of the inside of the first housing 110 and the upper side of the third side surface 2611c may be the same as the thickness of the display 50.

As illustrated in states 2610 and 2710, left and right ends of the first upper surface 2614a are connected to an upper side of the first side surface 2611a and an upper side of the third side surface 2611c and an upper side of the first upper surface 2614a may be connected to an upper side of the second side surface 2611b. A lower side of the first upper surface 2614a may face one surface of the display 50. The first upper surface 2614a may be higher than the bottom surface of the inside of the first housing 110 by a specific height (e.g., a height of the thickness of the display 50 or more). According to various embodiments, the height by which the first upper surface 2614a protrudes from the bottom surface of the first housing 110 may be the same as the thickness of the display 50.

As illustrated in states 2710 or 2730, the left and right sides and the upper side of the first rear surface 2611e may be connected to the first side surface 2611a, the third side surface 2611c and the second side surface 2611b, and the lower side of the first side surface 2611a may be disposed to face the upper side of the fourth side surface 2612a of the second housing 120 in a folding state of the foldable flexible display device.

As illustrated in states 2610 or 2710, the second housing 120 may include a fourth side surface 2612a, a fifth side surface 2612b, a sixth side surface 2612c, a second upper surface 2612d, and a second rear surface 2612e. The second housing 120 may have a location, a size, and a shape that are symmetrical to the first housing 110 with reference to a central portion of the display 50. For example, left and right sides of the fifth side surface 2612b may be connected to sides of the fourth side surface 2612a and the sixth side surface 2612c, an upper side of the fifth side surface 2612b may be connected to one side of the second upper surface 2612d, and a lower side of the fifth side surface 2612b may be connected to one side of the second rear surface 2612e.

When viewed form the front surface of the drawing illustrated with reference to state 2750, the left and right peripheries of the first housing 110 and the second housing 120 may be formed to have a thin thickness that may be neglected. For example, the upper surface connected to the first side surface 2611a and the third side surface 2611c, and the fourth side surface 2612a and the sixth side surface 2612c may be very thin (e.g., bezel-less).

State 2630 illustrates the first type hinge housing 2450 disposed between the first housing 110 and the second housing 120, and may have substantially the same configuration as the first type hinge housing 2450 described in FIG. 24.

State 2650 corresponds to an enlarged view illustrating one end of a central portion of the foldable flexible display device 2400. A recess of a specific size may be provided between the first side surface 2611a and the fourth side surface 2612a. The first shield 2402a may be exposed to the outside through a recess formed between the first side surface 2611a and the fourth side surface 2612a. The first shield 2402a may be disposed to cover a left periphery of a central portion of the display 50.

As illustrated in state 2650, a recess of a specific size may be provided between the third side surface 2611c and the sixth side surface 2612c, and the second shield 2403a may be exposed to the outside through a recess formed between the third side surface 2611c and the sixth side surface 2612c. The second shield 2403a may be disposed to cover a right periphery of a central portion of the display 50.

State 2670 is a cutaway view taken along line A-A' of state 2650. The cutting is made to cross the central portion of the foldable flexible display device 2400 from an upper side that is rather biased to the lower end of the foldable flexible display device 2400. Accordingly, as illustrated, one sectional configuration of the foldable flexible display device 2400 may include a fourth side surface 2612a, a second rear surface 2612e, and a sixth side surface 2612c, and the first type hinge housing 2450 may be disposed inside the fourth side surface 2612a, the second rear surface 2612e, and the sixth side surface 2612c. The hinge structure 300 may be disposed at a central portion of the first type hinge housing 2450.

State 2690 corresponds to a view illustrating a portion of the right side of state 2670 in more detail. The display 50 may be disposed on the foldable flexible display device 2400, the sixth side surface 2612c may be disposed on the right side, and the second rear surface 2612e may be disposed on the lower side. The first type hinge housing 2450 may be disposed inside the sixth side surface 2612c and the second rear surface 2612e. The second side wall 2403 and the second shield 2403a may be disposed at a tip end of the right side of the first type hinge housing 2450, and the second shield 2403a may be disposed to cover a right periphery of a central portion of the display 50.

Referring to FIG. 28, as illustrated in state 2810, the foldable flexible display device 2400 may be in a folding state. For example, one surface of the first housing 110 and one surface of the second housing 120 may be disposed to face each other. The first type hinge housing 2450 may be disposed under the first housing 110 and the second housing 120, and in an unfolding state of the foldable flexible display device 2400, at least a portion of the first type hinge housing 2450 may be disposed between the housings 110 and 120. Accordingly, the first shield 2402a or the second shield 2403a may be disposed to cover at least a portion (e.g., an aperture formed in lower areas of the first housing 110 and the second housing 120) of an aperture 2891 formed between the first housing 110 and the second housing 120. Alternatively, the first shield 2402a or the second shield 2403a may be disposed to cover the folding part 59 of the display disposed inside the first shield 2402a or the second shield 2403a.

State 2830 corresponds to a view illustrating a state in which the first housing 110 is located on the upper side in a folding state of the first housing 110 and the second housing 120. In this state, the first shield 2402a may be disposed to cover a folding part (e.g., the folding part 59 of FIG. 25) in which the display is folded. State 2850 corresponds to a view illustrating a state in which the second housing 120 is located on the upper side in a folding state of the first housing 110 and the second housing 120. In this state, the second shield 2403a may be disposed to cover a folding part (e.g., the folding part 59 of FIG. 25) in which the display is folded. State 2870 corresponds to a view illustrating a state in which the first housing 110 and the second housing 120 is located on the front surface of the first type hinge housing 2450 in a folding state of the first housing 110 and the second housing 120.

Figure 29:
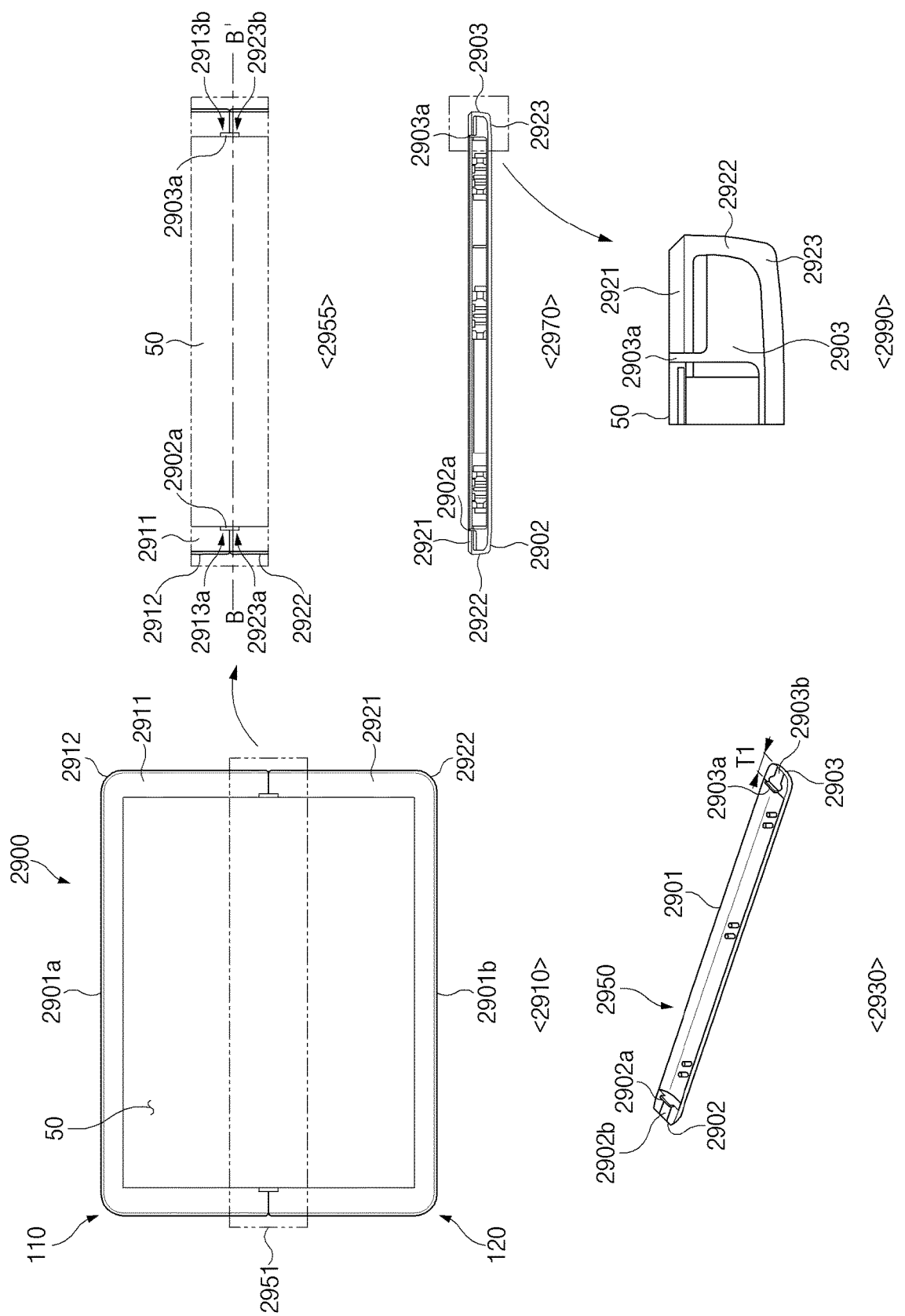
FIG. 29 is a view illustrating various states of a foldable display device including a second type hinge housing according to various embodiments of the disclosure.
Figure 30:
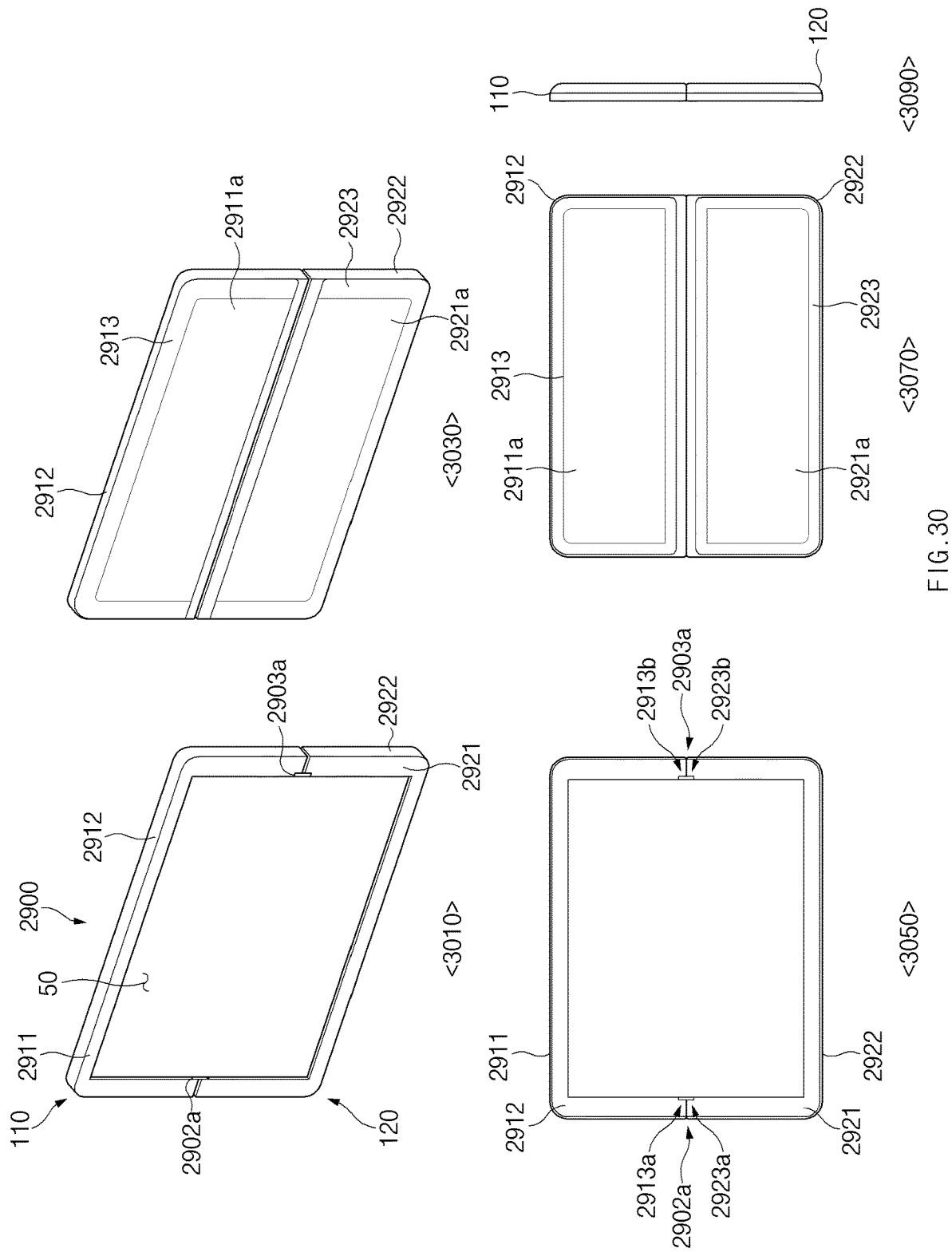
FIG. 30 is a view illustrating unfolding states for specific angles of a foldable display device including a second type hinge housing according to various embodiments of the disclosure.

FIG. 29 is a view illustrating various states of a foldable display device including a second type hinge housing according to various embodiments of the disclosure. FIG. 30 is a view illustrating unfolding states for specific angles of a foldable display device including a second type hinge housing according to various embodiments of the disclosure.

Referring to FIGS. 29 and 30, as illustrated in states 2910 to 3090, the display 50 of the foldable flexible display device 2900 may be in an unfolding state. State 2910 illustrates an example of a front view of an unfolding state of the foldable flexible display device 2900. State 2930 is a view illustrating an example of the second type hinge housing 2950. State 2955 corresponds to an enlarged view illustrating a central portion 2951 of the foldable flexible display device 2900. State 2970 corresponds to a view illustrating a section with reference to cutting line B-B' in state 2955. State 2990 corresponds to a view illustrating a portion of a right periphery of state 2970. State 3010 is a perspective view of a first angle (e.g., an angle at which the front surface of the foldable flexible display device 2900 is visible) of the foldable flexible display device 2900 in an unfolding state. State 3030 is a perspective view of a second angle (e.g., an angle at which the rear surface of the foldable flexible display device 2900 is visible) of the foldable flexible display device 2900 in an unfolding state. State 3050 corresponds to a front view of the foldable flexible display device 2900. State 3070 corresponds to a rear view of the foldable flexible display device 2900. State 3090 corresponds to a side view of the foldable flexible display device 2900.

The first housing 110 and the second housing 120 may be in an unfolding state as illustrated in FIG. 29 or 30, and the display 50 may be positioned on the upper surfaces of the first housing 110 and the second housing 120.

According to various embodiments, as illustrated in states 2910 or 3030 to 3090, the first housing 110 may include a first housing body 2911a and a first bezel 2901a (or a first sub-housing). The first bezel 2901a may be disposed to surround a periphery of the first housing 110. According to various embodiments, the first bezel 2901a may include a first upper bezel 2911 (or a first upper sub-housing), a first side bezel 2912 (or a first side sub-housing), and a first rear bezel 2913 (or a first rear sub-housing).

The first upper bezel 2911 may be disposed to surround a periphery of the upper surface of the body of the first housing 110, on which the display 50 is disposed. Alternatively, the first upper bezel 2911 may be disposed to surround three peripheries (e.g., left and right peripheries and an upper periphery with reference to the illustrated drawing) of the four peripheries of the upper surface of the first housing body 2911a.

The first side bezel 2912 may be disposed between the first upper bezel 2911 and the first rear bezel 2913, and may be disposed to surround three side surfaces (e.g., the left and right surfaces, and the upper surface with reference to the illustrated drawing) of the side surfaces of the first housing body 2911a. In an unfolding state, in an area in which the first housing body 2911a and the second housing body 2921a face each other, only the first rear bezel 2913 may be disposed and the upper bezel or the first side bezel may be omitted.

According to various embodiments, as illustrated in states 2910 or 3010 to 3090, the second housing 120 may include a second housing body 2921a and a second bezel 2901b (or a second sub-housing). The second bezel 2901b may include a second upper bezel 2921 (or a second upper sub-housing), a second side bezel 2922 (or a second side sub-housing), and a second rear bezel 2923 (or a second rear sub-housing). The second housing 120 may be disposed at a location that is symmetrical to the first housing 110 positioned on the upper side of the second housing 120, and may have a size and a shape that are similar to or the same as those of the first housing 110. For example, the second upper bezel 2921, the second side bezel 2922, and the second rear bezel 2923 may have locations that are symmetrical upwards and downwards to the first upper bezel 2911, the first side bezel 2912, and the first rear bezel 2913 with respect to the central portion 2951 of the foldable flexible display device 2900 and may have the same shapes and sizes as those of the first upper bezel 2911, the first side bezel 2912, and the first rear bezel 2913.

As illustrated in state 2930, the second type hinge housing 2950 may include a half-pipe shaped hinge housing body 2901, and a first periphery 2902 and a second periphery 2903 extending leftwards and rightwards from opposite ends of the hinge housing body 2901 by a specific length T1.

The first periphery 2902, for example, may include a first guide groove 2902b that guides a folding or unfolding operation of the first upper bezel 2911, and a first shield 2902a protruding upwards (e.g., in a direction in which the display 50 is located) farther than a section of the hinge housing body 2901 by a specific height. The first guide groove 2902b may be a pot-shaped groove having an empty space from a periphery to the inside thereof in relation to machining (e.g., CNC machining). The first shield 2902a may extend from a location of the hinge housing body 2901 by a specific height (e.g., a height of the thickness of the display 50 or more) in a direction that is perpendicular to the bottom surface of the hinge housing body 2901.

The second periphery 2903 may have a location, a size, and a shape that are symmetrical to the first periphery 2902. For example, the second periphery 2903 may include a second guide groove 2903b and a second shield 2903a. The second guide groove 2903b and the second shield 2903a may have a shape and a size that are the same as those of the first guide groove 2902b and the first shield 2902a.

As illustrated in state 2955, the first side bezel 2912 and the second side bezel 2922 may be disposed on a side surface of a periphery of the display 50, and the first upper bezel 2911 and the second upper bezel 2921 may be disposed on an upper surface of the periphery of the display 50 while having specific widths. The widths of the first upper bezel 2911 and the second upper bezel 2921 may be the same as or similar to the width T1 of the first periphery 2902 or the second periphery 2903.

As illustrated in states 2955 and 3050, the first shield 2902a and the second shield 2903a may be disposed on the left and right peripheries of the central portion of the display 50, respectively. In this regard, the first upper bezel 2911 may be provided with a first shield groove 2913a in which a portion of the first shield 2902a is disposed, and a second shield groove 2913b in which a portion of the second shield 2903a is disposed. The first shield groove 2913a and the second shield groove 2913b, for example, may have L shapes that are disposed in different directions. The second upper bezel 2921 may be provided with a third shield groove 2923a in which a portion of the first shield 2902a is disposed, and a fourth shield groove 2923b in which a portion of the second shield 2903a is disposed. The third shield groove 2923a and the fourth shield groove 2923b, for example, may have L shapes that are disposed in different directions.

As cutting line B-B' of state 2955 cuts a rather lower side of the central portion of the foldable flexible display device 2900, as illustrated in state 2970, the second upper bezel 2921, the second side bezel 2922, and the second rear bezel 2923 may appear. The first shield 2902a and the second shield 2903a may be disposed at locations that are spaced inwards apart from ends of the opposite peripheries 2902 and 2903 by a specific length, respectively.

As illustrated in state 2990, the second upper bezel 2921, the second side bezel 2922, and the second rear bezel 2923 are disposed to cover the second periphery 2903, and the second shield 2903a may protrude from the hinge housing body 2901 (or the upper surface of the second periphery 2903) by a specific height (e.g., the thickness of the display 50).

Figure 31:
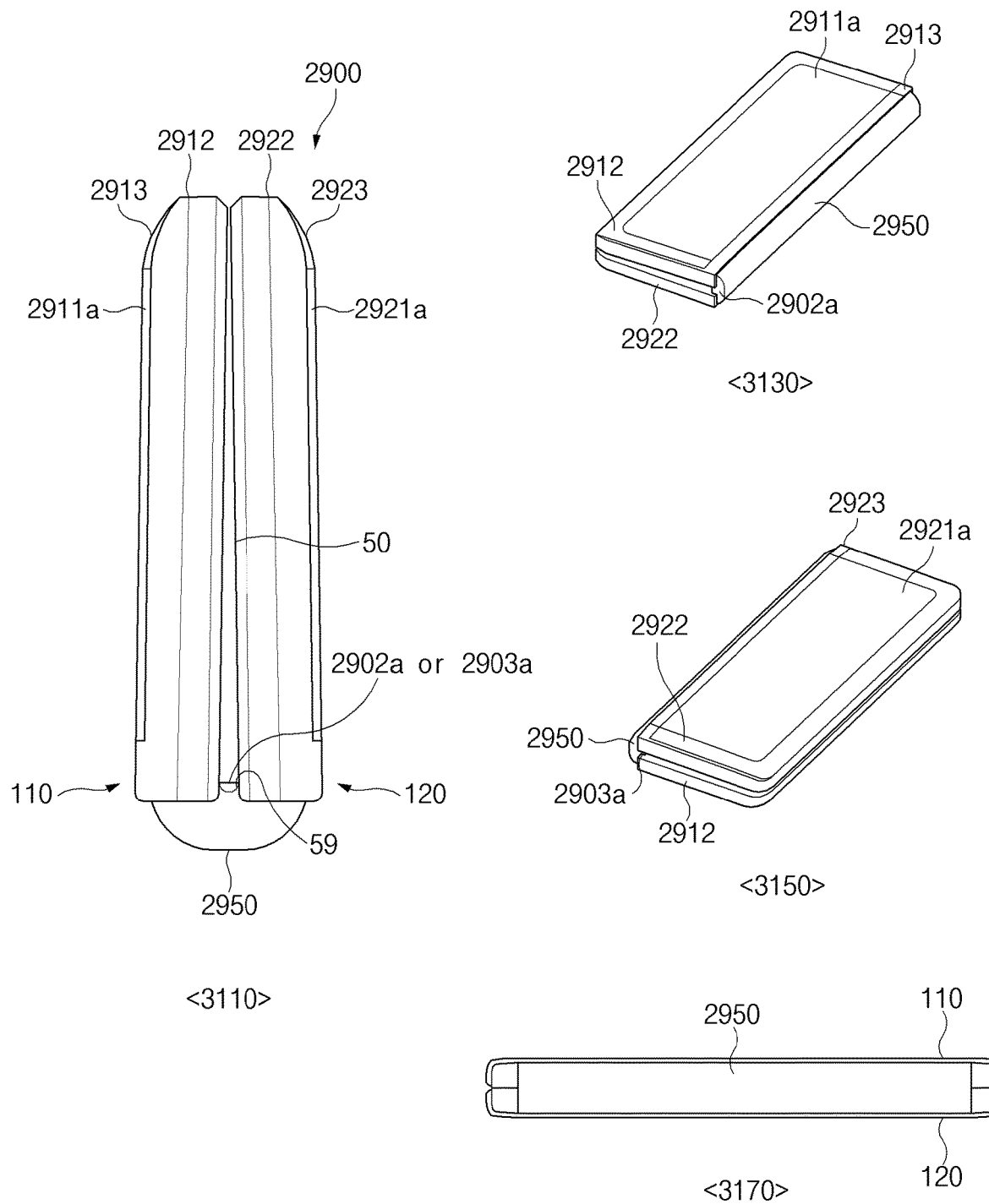
FIG. 31 is a view illustrating folding states for specific angles of a foldable display device including a second type hinge housing according to various embodiments of the disclosure.

FIG. 31 is a view illustrating folding states for specific angles of a foldable display device including a second type hinge housing according to various embodiments of the disclosure.

Referring to FIG. 31, as illustrated in state 3110, while the parts of the display 50 disposed on surfaces of the first housing 110 and the second housing 120 face each other, the foldable flexible display device 2900 may be in a folding state. When the foldable flexible display device 2900 is in a folding state, the first upper bezel 2911 that covers at least a portion of a periphery of an upper surface of the first housing body 2911a and the second upper bezel 2921 that covers at least a portion of a periphery of an upper surface of the second housing body 2921a may face each other. In the folding state, the first rear bezel 2913 and the second rear bezel 2923 may be disposed to face opposite directions. The first side bezel 2912 and the second side bezel 2922 may be disposed in parallel to each other with reference to a longitudinal direction of the illustrated drawing. As the first housing 110 and the second housing 120 face each other, at least a portion of the second type hinge housing 2950 may be disposed to be exposed to the outside.

The first shield 2902a or the second shield 2903a may be disposed to cover the folding part 59 of the display 50. Although it is illustrated in the drawings that the first housing body 2911a and the second housing body 2921a may be observed from sides, the disclosure is not limited thereto. For example, when the side surfaces of the first housing body 2911a and the second housing body 2921a are observed from the outside if the foldable flexible display device 2900 is in a folding state, at least a portion of the side surfaces of the first housing body 2911a and the second housing body 2921a may be covered by the first side bezel 2912 and the second side bezel 2922, or the first rear bezel 2913 or the second rear bezel 2923.

State 3130 illustrates the foldable flexible display device 2900 in a folding state, which is disposed to face the upper side with reference to the drawing in which the first housing body 2911a and the first rear bezel 2913 are illustrated. As illustrated, the first shield 2902a may be disposed to cover the folding part 59 of the display 50 from a side of the foldable flexible display device 2900.

State 3150 illustrates the foldable flexible display device 2900 in a folding state, which is disposed to face the upper side with reference to the drawing in which the second housing body 2921a and the second rear bezel 2923 are illustrated. As illustrated, the second shield 2903a may be disposed to cover the folding part 59 of the display 50 from a side of the foldable flexible display device 2900.

State 3170 illustrates a rear surface of the foldable flexible display device 2900 (e.g., a front surface of the second type hinge housing 2950) in a folding state, to which the second type hinge housing 2950 is applied. As illustrated, the foldable flexible display device 2900 in a folding state may be disposed such that an outer surface of the second type hinge housing 2950 is exposed to the outside while the first housing 110 and the second housing 120 are folded.

Figure 32:
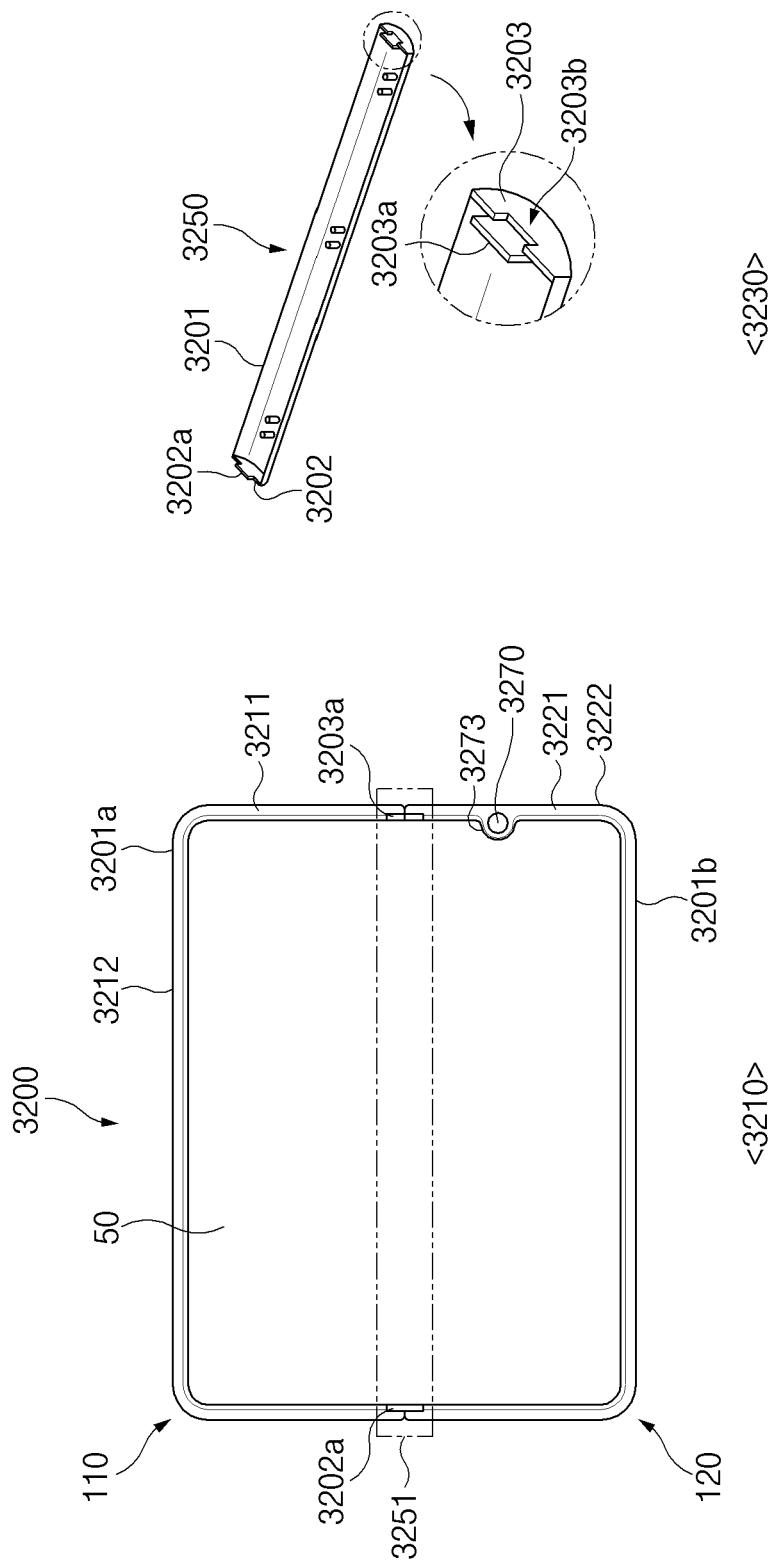
FIG. 32 is a view illustrating an example of a foldable display device including a third type hinge housing according to various embodiments of the disclosure.
Figure 33:
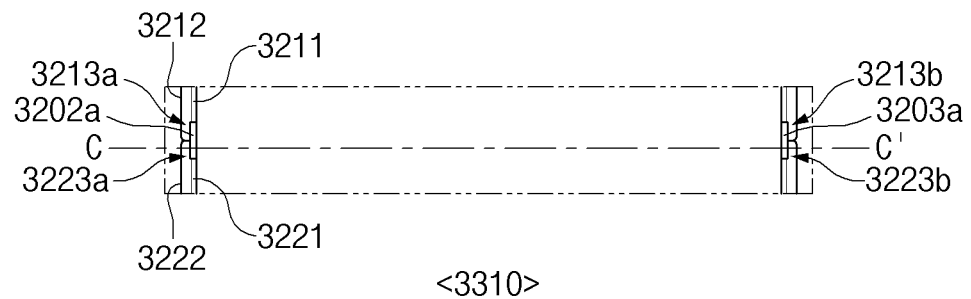
FIG. 33 is a view illustrating a central portion of a foldable display device including a second type hinge housing according to various embodiments of the disclosure.
Figure 33:
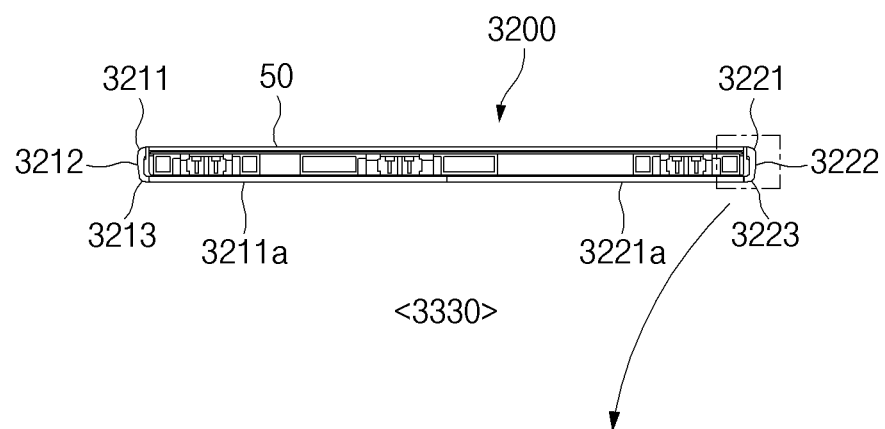
Figure 33:
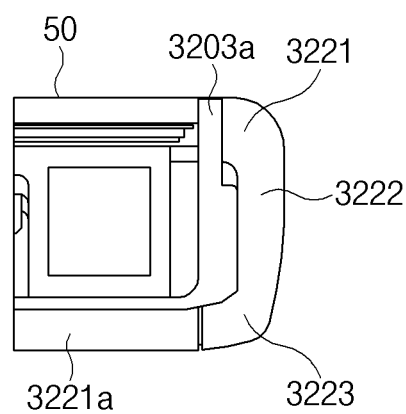
Figure 34:
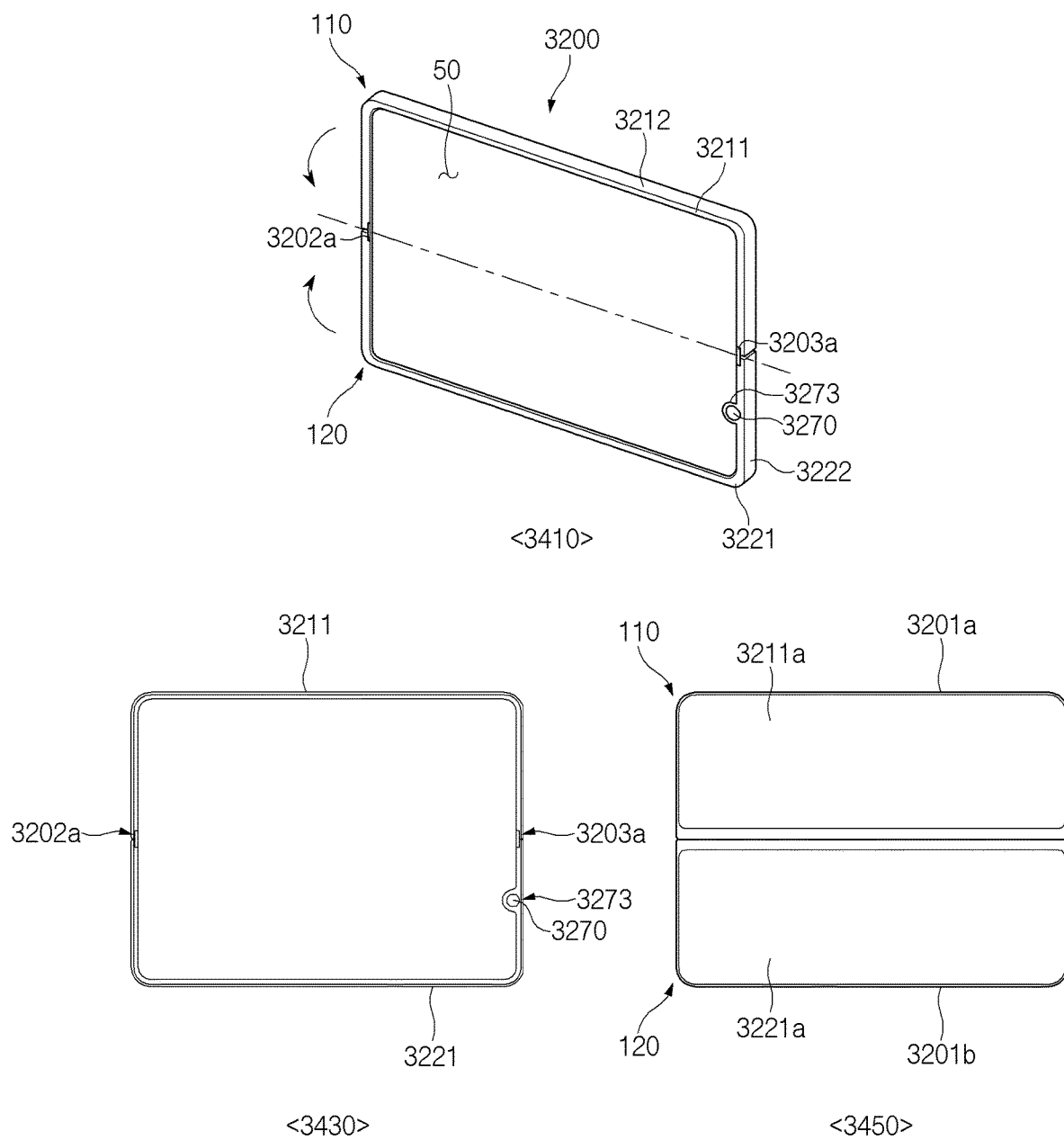
FIG. 34 is a view illustrating an unfolding state of a foldable display device including a second type hinge housing according to various embodiments of the disclosure.

FIG. 32 is a view illustrating an example of a foldable display device including a third type hinge housing according to various embodiments of the disclosure. FIG. 33 is a view illustrating a central portion of a foldable display device including a second type hinge housing according to various embodiments of the disclosure. FIG. 34 is a view illustrating an unfolding state of a foldable display device including a second type hinge housing according to various embodiments of the disclosure.

Referring to FIG. 32, state 3210 corresponds to a view illustrating a front surface of the foldable flexible display device 3200 in an unfolding state. State 3230 corresponds to a view illustrating an example of a third type hinge housing 3250 of the foldable flexible display device 3200. Referring to FIG. 33, state 3310 corresponds to an enlarged view illustrating an example of a central portion 3251 in state 3210. State 3330 corresponds to a view illustrating an example of a section taken along line C-C' in state 3310. State 3350 corresponds to a view illustrating a right periphery of state 3310. Referring to FIG. 34, state 3410 is a perspective view of a first angle (e.g., an angle at which the front surface of the foldable flexible display device 3200 is visible) of the foldable flexible display device 3200 in an unfolding state. State 3430 corresponds to a front view of the foldable flexible display device 3200. State 3450 corresponds to a rear view of the foldable flexible display device 3200.

Referring to FIGS. 32 to 34, the foldable flexible display device 3200 may have a state in which the first housing 110 and the second housing 120 are unfolded as illustrated in state 3210. Alternatively, according to various embodiments, as described above with reference to FIG. 31, the display 50 may be in a folding state in which a portion of the display 50 positioned on the first housing 110 and a portion of the display 50 positioned on the second housing 120 face each other.

According to various embodiments, as illustrated in state 3450 of FIG. 34, the first housing 110 may include a first housing body 3211a and a first bezel 3201a. The first bezel 3201a may be disposed to surround a periphery of the first housing 110. The first housing body 3211a may have a shape that is the same as or similar to that of the first housing body 2911a described with reference to FIG. 29 or 30. According to various embodiments, as illustrated in state 3330 of FIG. 33 or state 3450 of FIG. 34, the first bezel 3201a may include a first upper bezel 3211, a first side bezel 3212, and a first rear bezel 3213. The structure may be similar to or the same as the first bezel structure described with reference to FIGS. 29 and 30.

According to various embodiments, the remaining bezels (e.g., the first side bezel 3212 and the first rear bezel 3213) of the first bezel 3201a, except for the first upper bezel 3211, may be the same as or similar to the first side bezel 2912 and the first rear bezel 2913 described with reference to FIG. 29 or 30. The first upper bezel 3211 may have a thickness that is relatively thinner than the first upper bezel 2911 described with reference to FIG. 29 or 30.

As illustrated in state 3330 or 3450, the second housing 120 may include a second housing body 3221a and a second bezel 3201b. The second housing body 3221a and the remaining bezels (e.g., the second side bezel 3222 and the second rear bezel 3223) of the second bezel 3201b, except for the second upper bezel 3221, may have a shape that is the same as or similar to the first bezel 2901a, and the second side bezel 2922 and the second rear bezel 2923 described above with reference to FIG. 29 or 30.

As illustrated in state 3210, at least one camera housing 3273 may be disposed on one side of the second upper bezel 3221. The camera housing 3273, for example, may be disposed to surround a peripheral part of at least one camera 3270 disposed on one side. The camera housing 3273 may be used to defense a physical force or the like that is applied to the camera 3270.

State 3230 is a view illustrating an example of the third type hinge housing 3250. The third type hinge housing 3250 may be disposed at a central portion 3251 of the foldable flexible display device 3200, and may be disposed on the rear surface of the display 50. The third type hinge housing 3250 may include a half-pipe type hinge housing body 3201, and a first side wall 3202 and a second side wall 3203 provided at opposite ends of the hinge housing body 3201, and may include a first shield 3202a disposed inside the first side wall 3202 and a second shield 3203a disposed inside the second side wall 3203. The first shield 3202a and the second shield 3203a may protrude upwards farther than the upper surface of the hinge housing body 3201 by a specific height (e.g., a height of the thickness of the display or more). The first side wall 3202 and the second side wall 3203, for example, may be provided with a guide groove 3203b. The guide groove 3203b may guide sides of the first bezel 3201a and the second bezel 3201b while the foldable flexible display device 3200 performs a folding operation or an unfolding operation. Although only a shape in which the guide groove 3203b is disposed in the second side wall 3203 is illustrated in the drawing, a guide groove having the same shape may be provided in the first side wall 3202.

According to various embodiments, in an unfolding state of the foldable flexible display device 3200 as illustrated in state 3310, a first shield groove 3213a (e.g., a groove of the grooves obtained by cutting away a tip end of the first upper bezel 3211 in L shape, which is disposed on the left side) and a second shield groove 3213b (e.g., a groove provided at a right tip end of the first upper bezel 3211 in an inverse L shape) may be disposed on opposite sides of the first upper bezel 3211, which face the second upper bezel 3221. Similarly, a third shield groove 3223a and a fourth shield groove 3223b may be disposed on opposite sides of the second upper bezel 3221, which face the first upper bezel 3211. The first to fourth shield grooves 3213a, 3213b, 3223a, and 3223b may function to smoothly perform a folding or unfolding operation by preventing the bezel and the shields 3202a and 3203a from overlapping each other while the first housing 110 and the second housing 120 performs a folding or unfolding operation.

State 3330 corresponds to a sectional view taken along line C-C', and state 3350 corresponds to a view illustrating an example of one side of a right periphery in state 3330. The first upper bezel 3211 and the second upper bezel 3221 may be located at opposite peripheries of the display 50, and the first side bezel 3212 and the second side bezel 3222 may be located on a side surface of the foldable flexible display device 3200. For example, the first housing body 3211a and the second housing body 3221a may be disposed on the rear surface of the foldable flexible display device 3200, and the first rear bezel 3213 may be disposed at a left periphery of the first housing body 3211a. The second rear bezel 3233 may be disposed at a right periphery of the second housing body 3221a. The second shield 3203a may be disposed between the right periphery of the display 50 and the second upper bezel 3221. The height of the second shield 3203a, for example, may be larger than the thickness of the display 50. According to various embodiments, the upper surface of the second display 50 and the upper surface of the second shield 3203a may be successively disposed with respect to a transverse horizontal line. According to various embodiments, the upper surface of the display 50, and the upper surface of the second shield 3203a and the upper surface of the second upper bezel 3221 may be disposed to be substantially successive (or without a protuberance of a separate configuration).

Referring to FIG. 34, the first housing 110 and the second housing 120 may be disposed in the foldable flexible display device 3200, the display 50 may be disposed on the first housing 110 and the second housing 120, and the first housing 110 and the second housing 120 may be in a folding or unfolding state with reference to an imaginary transverse center line.

The first housing 110 may include a first housing body 3211a, a first upper bezel 3211, and a first side bezel 3212. Additionally or alternatively, the first housing 110 may further include a first rear bezel as described above with reference to FIG. 33. The second housing 120 may include a second housing body 3221a, a second upper bezel 3221, and a second side bezel 3222. Additionally or alternatively, the second housing 120 may further include a second rear bezel as described above with reference to FIG. 33. The first shield 3202a and the second shield 3203a may be disposed in areas corresponding to opposite peripheries of the central portion of the display 50. The camera housing 3273 may be disposed on one side of the second housing 120, and the camera 3270 may be disposed inside the camera housing 3273. The camera housing 3273 may protrude from one side of the second housing 120 toward the inside of the display 50.

Figure 35:
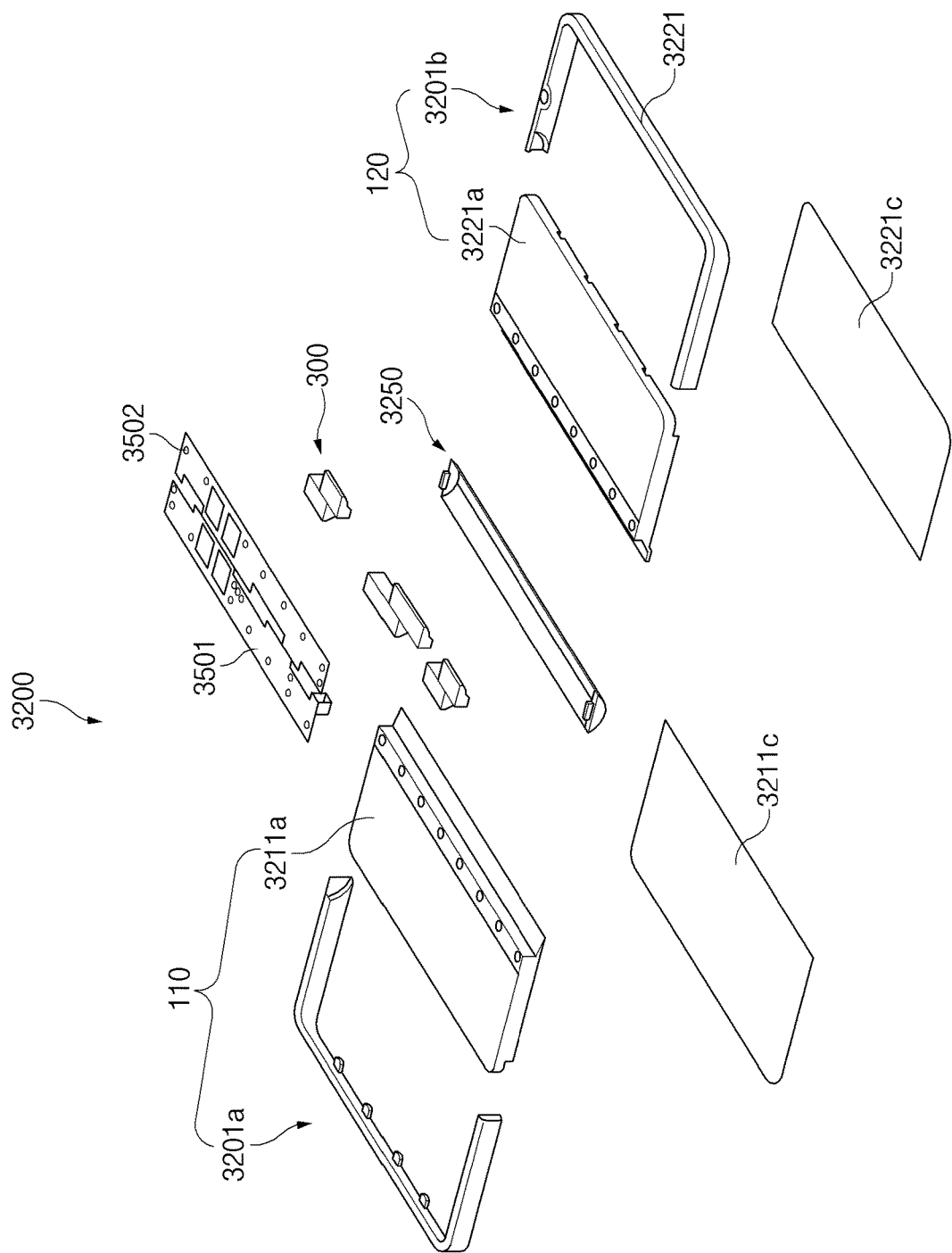
FIG. 35 is an exploded perspective view of a foldable display device including a third type hinge housing according to various embodiments of the disclosure.
Figure 36:
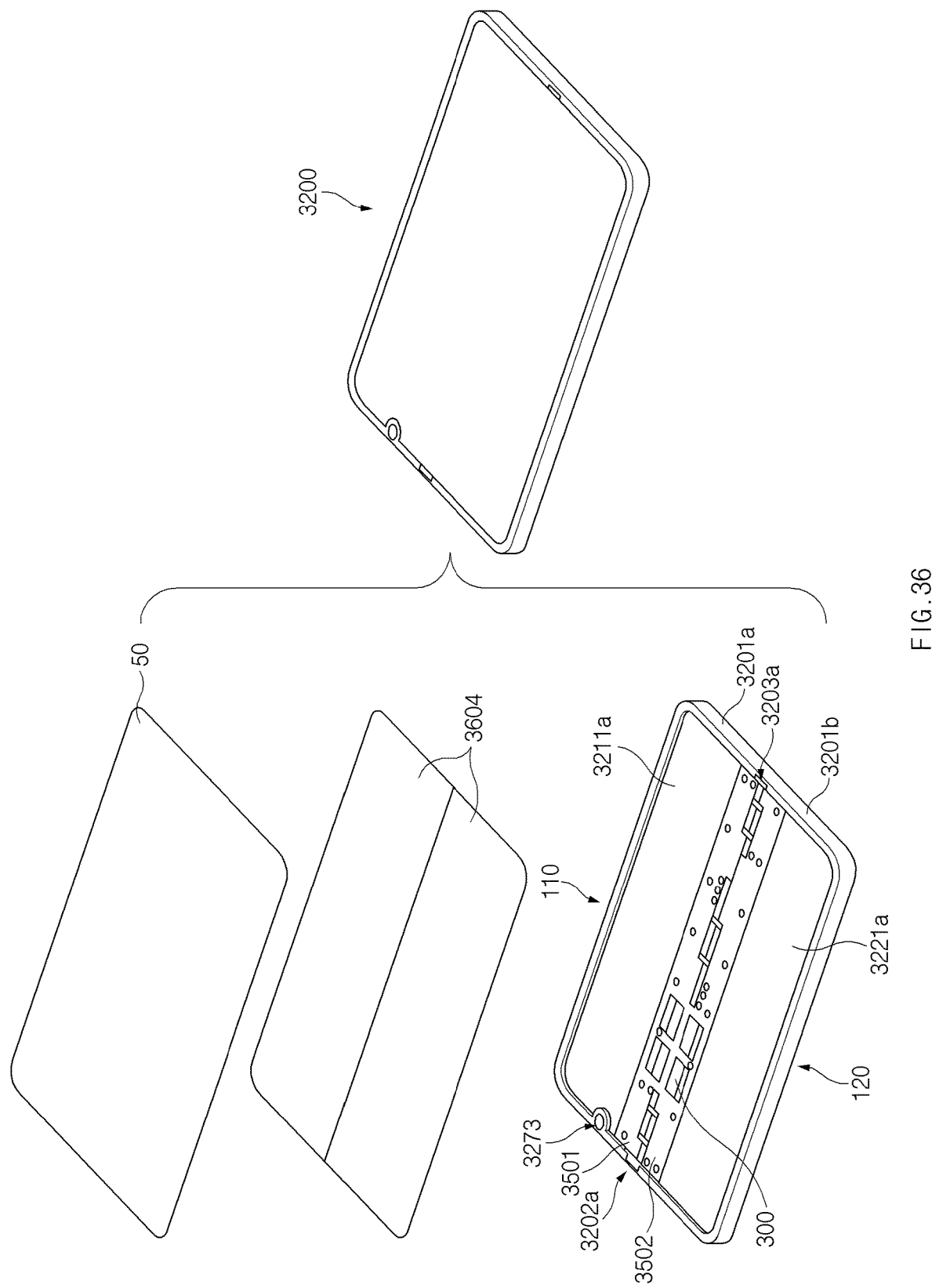
FIG. 36 is an exploded perspective view of a foldable display device including a third type hinge housing according to various embodiments of the disclosure.

FIG. 35 is an exploded perspective view of a foldable display device including a third type hinge housing applied according to various embodiments of the disclosure. FIG. 36 is an exploded perspective view of a foldable display device including third type hinge housing according to various embodiments of the disclosure.

Referring to FIGS. 35 and 36, the foldable flexible display device 3200 may include a first housing 110 and a second housing 120, a first rear plate 3211c and a second rear plate 3221c, a hinge housing 3250, a hinge structure 300, and hinge covers 3501 and 3502.

The first housing 110, for example, may include a first bezel 3201a and a first housing body 3211a. Alternatively, according to various embodiments, the first housing 110 may be formed only with a first housing body 3211a without using a configuration of a first bezel 3201a. The second housing 120, for example, may include a second bezel 3201b and a second housing body 3221a. According to various embodiments, the second housing 120 may be formed only with a second housing body 3221a without using a configuration of a second bezel 3201b. The first housing body 3211a and the second housing body 3221a may be coupled to each other by the hinge structure 300. The hinge structure 300 may be positioned inside the hinge housing 3250. The hinge covers 3501 and 3502 may be disposed to cover the upper surface of the hinge structure 300 positioned in the hinge housing 3250. The first rear plate 3211c may be fixed to the rear surface of the first housing body 3211a. The second rear plate 3221c may be fixed to the rear surface of the second housing body 3221a.

Referring to FIG. 36, as described with reference to FIG. 35, the foldable flexible display device 3200 may be disposed such that the hinge covers 3501 and 3502 cover the hinge housing in which the hinge structure 300 is positioned. The hinge covers 3501 and 3502 may include a first hinge cover 3501 located close to the first housing body 3211a and a second hinge cover 3502 located close to the second housing body 3221a.

According to various embodiments, the rear panel 3604 may be disposed between the display 50 and the housings 110 and 120. The rear panel 3604 may include a first rear panel 3604 disposed between an upper area of the display 50 and the first housing body 3211a, and a second rear panel 3604 disposed between a lower area of the display 50 and the second housing body 3221a. The first rear panel 3604 and the second rear panel 3604 may be separated from each other such that the first housing 110 and the second housing 120 may be in a folding or unfolding state. The rear panel 3604, for example, may include a heat dissipating plate that dissipates heat of the display 50, an impact absorbing layer (or an embossing layer or a cushion layer) that absorbs or disperses an external force, a bonding layer that fixes the display 50 onto the housings 110 and 120, and at least one of a reflective layer that increases the reflection efficiency of light generated by the display 50 or a black layer for improving visibility. Alternatively, according to various embodiments, the rear panel 3604 may include an electro-magnetic induction panel that supports an input by a stylus pen. Additionally or alternatively, at least one camera may be disposed on sides of the housings 110 and 120, and the foldable flexible display device 3200 may include at least one camera housing 3273 related to protection of the camera. One side of the bezel of the camera housing 3273 may be modified. The first shield 3202a and the second shield 3203a for preventing expose of the folding part of the display 50 may be disposed at opposite peripheries of the hinge housing, in which the hinge structure 300 is positioned.

Figure 37:
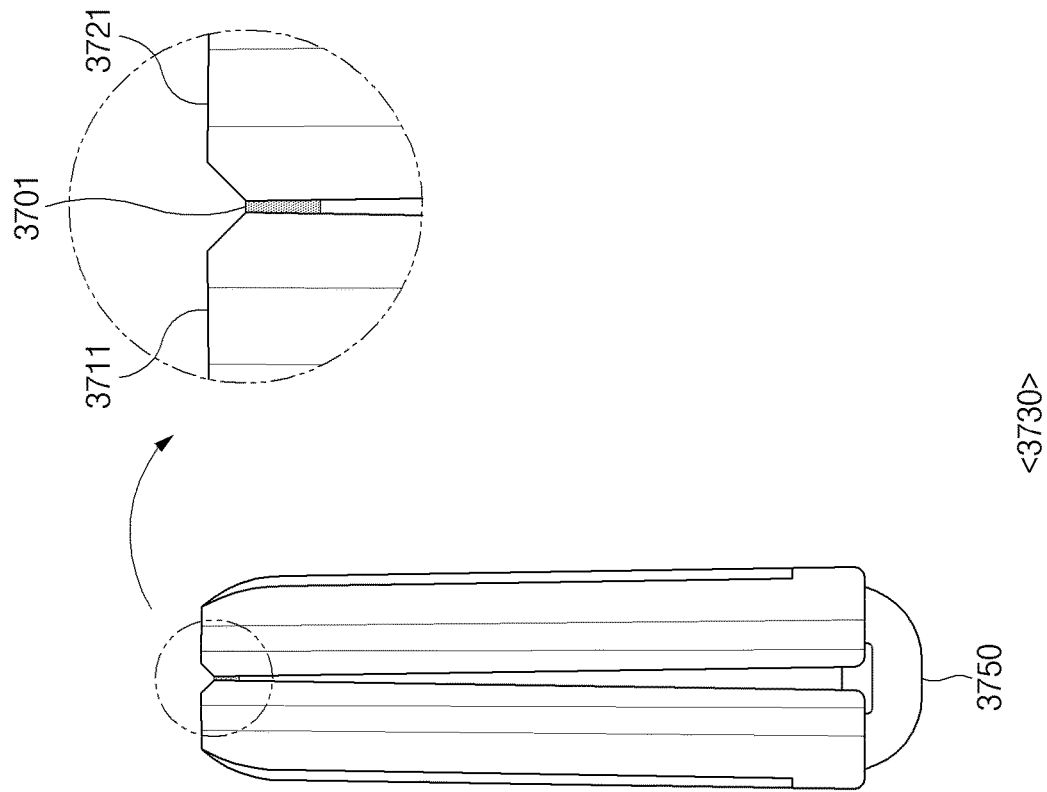
FIG. 37 is a view illustrating an example of a foldable display device including an impact absorbing part according to various embodiments of the disclosure.

FIG. 37 is a view illustrating an example of a foldable display device including an impact absorbing part according to various embodiments of the disclosure.

Referring to FIG. 37, the foldable flexible display device 3700 according to various embodiments may include a first housing 110 and a second housing 120, and may be in an unfolding state as illustrated in state 3710 or a folding state as illustrated in state 3730 with reference to a transverse line of the central portion of the foldable flexible display device 3700. The display 50 may be disposed on the first housing 110 and the second housing 120. At least one camera 3770 and at least one camera housing 3773 that surrounds the at least one camera 3770 may be disposed on at least one side of the first housing 110 and the second housing 120. The hinge housing 3750 may be disposed between the first housing 110 and the second housing 120. The hinge housing 3750 may be of any one type of the first type hinge housing, the second type hinge housing, or the third type hinge housing, which have been described above. The first shield 3702a or the second shield 3703a may be disposed at two peripheries opposite to each other (or locations corresponding to two peripheries opposite to each other, of the central portion of the display 50) of the hinge housing 3750. The first shield 3702a or the second shield 3703a may function to prevent the folding part of the display 50 from being exposed to the outside when the display 50 is in a folding state.

According to various embodiments, at least one of the first housing 110 or the second housing 120 may include a first bezel 3711 or a second bezel 3721. At least one cushion part 3701 may be disposed on one side of the first bezel 3711. According to various embodiments, the cushion part 3701 may be disposed on one side of the second bezel 3721 (e.g., at a location corresponding to the cushion part 3701 located on the first bezel 3711). Alternatively, the cushion part may be disposed in at least one of the first bezel 3711 or the second bezel 3721. The cushion part 3701 may absorb an impact when the first bezel 3711 and the second bezel 3721 contact each other while the first housing 110 and the second housing 120 are folded.

Figure 38:
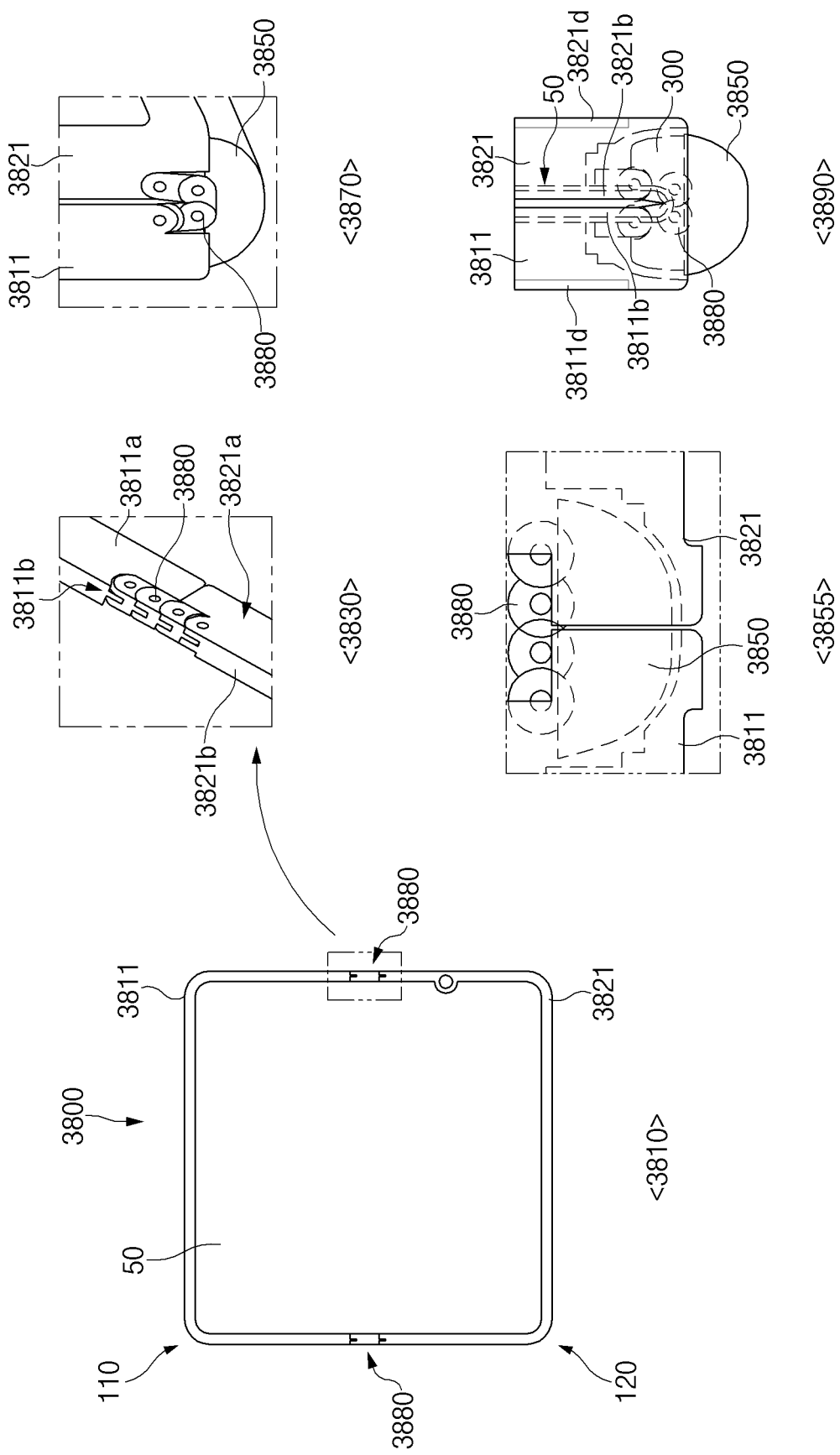
FIG. 38 is a view illustrating an example of a foldable display device having a shield structure according to various embodiments of the disclosure.

FIG. 38 is a view illustrating an example of a foldable display device having a shield structure according to various embodiments of the disclosure.

Referring to FIG. 38, state 3810 corresponds to a view illustrating a front surface of the foldable flexible display device 3800 in an unfolding state. State 3830 corresponds to a view illustrating an example of a right central portion of the foldable flexible display device 3800. State 3855 corresponds to a view illustrating an example of an area in which the shield 3880 of the foldable flexible display device 3800 in an unfolding state is disposed. State 3870 corresponds to an example of a perspective view illustrating a side surface of the foldable flexible display device 3800 in a folding state. State 3890 corresponds to a view illustrating an example of a side surface of the foldable flexible display device 3800 in a folding state.

Referring to FIG. 38, the foldable flexible display device 3800 according to an embodiment may include a first housing 110 and a second housing 120, and the first housing 110 may include a first bezel 3811 and a second bezel 3821. The first bezel 3811, for example, may include a first side bezel 3811a and a first upper bezel 3811b. The second bezel 3821, for example, may include a second side bezel 3821a and a second upper bezel 3821b. According to various embodiments, the first housing 110 may further include a first rear surface 3811d, and the second housing 120 may further include a second rear surface 3821d.

The foldable flexible display device 3800 may include a hinge housing 3850, in which a hinge structure 300 that connects the first housing 110 and the second housing 120 is positioned. The foldable flexible display device 3800 may include a shield 3880 that connects the first bezel 3811 and the second bezel 3821. One side of the shield 3880 may be connected to the first upper bezel 3811b, and the other side opposite to said one side of the shield 3880 may be connected to the second upper bezel 3821b. The shield 3880 may have a multi-joint structure including a plurality of joints. In a state in which the foldable flexible display device 3800 is unfolded as illustrated in state 3810, 3830, or 3855, a plurality of joints may be disposed in the shield 3880 in parallel. Here, a first joint of the plurality of joints may be fixed to one side of the first upper bezel 3811b, a second joint of the plurality of joints may be fixed to one side of the second upper bezel 3821b, and the remaining joints may be disposed between the first joint and the second joint. The first joint and the second joint which have been mentioned above, for example, may be fixed to the first side bezel 3811a and the second side bezel 3821a.

In a state in which the foldable flexible display device 3800 is folded as illustrated in state 3870 or 3890, the shield 3880 may be disposed such that at least one joint forms a specific angle (e.g., 90 degrees) with another joint. Although a multi joint structure to which four wheels are connected (e.g., the first wheel of the four wheels (or the first joint of the plurality of joints, which is located first) is connected to the first bezel, the last fourth wheel (or the fourth joint of the plurality of joints, which is located last) is connected to the second bezel, and the remaining wheels are connected to peripheral wheels through at least one link (or at least one joint)) has been exemplified in the illustrated drawing, the disclosure is not limited thereto. The number of the shields 3880 may vary according to the number of wheels. For example, the foldable flexible display device 3800 may have wheels (or joints), the number of which is smaller (e.g., three) or larger than (e.g., five or more) the current number of wheels (joints).

As illustrated in state 3870 or 3890, in a folding state of the foldable flexible display device 3800, the shield 3880 disposed between the first housing 110 and the second housing 120 may prevent the folding part of the display 50 from being exposed to the outside.

Figure 39:
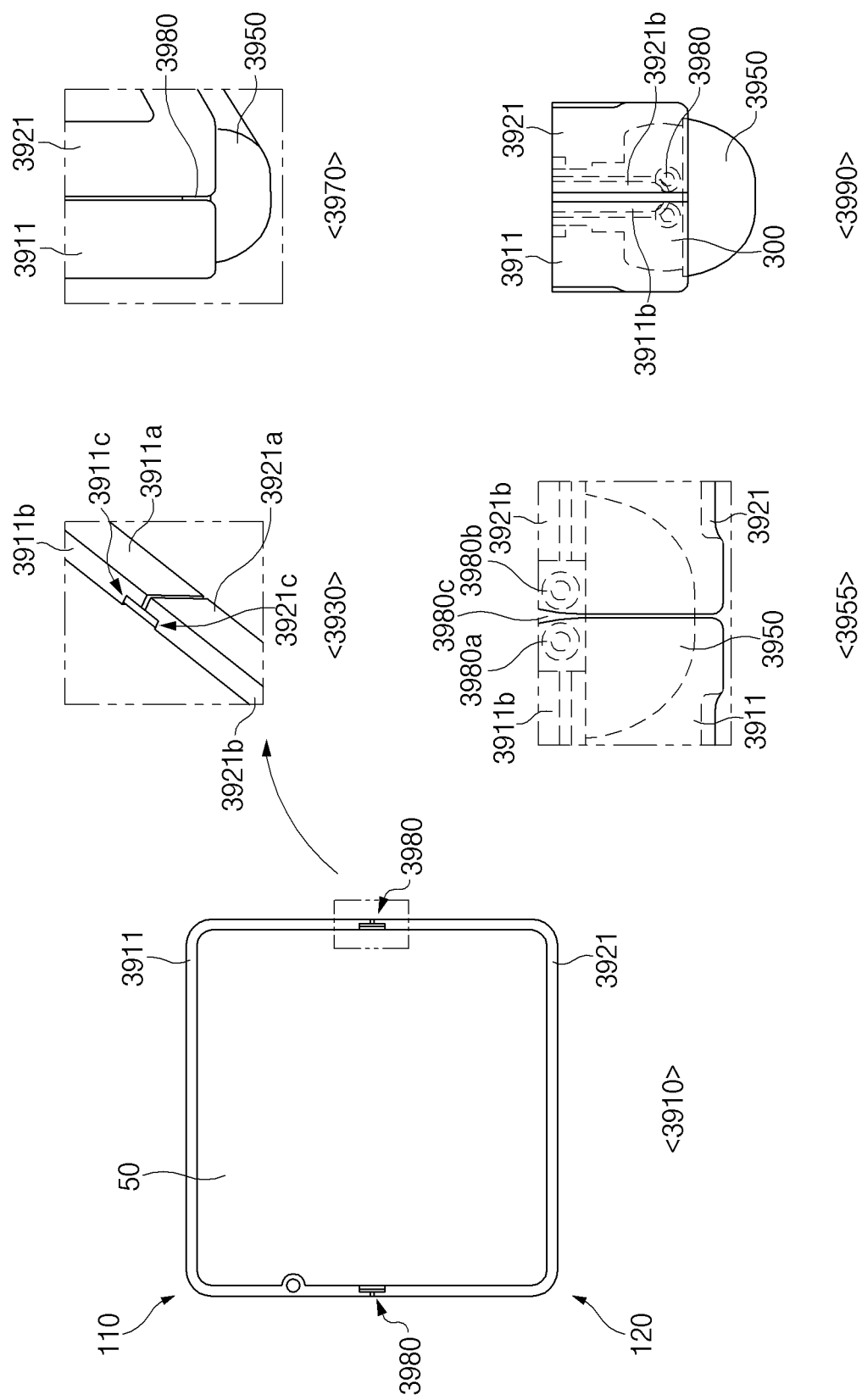
FIG. 39 is a view illustrating another example of a foldable display device having a shield structure according to various embodiments of the disclosure.

FIG. 39 is a view illustrating another example of a foldable display device having a shield structure according to various embodiments of the disclosure.

Referring to FIG. 39, state 3910 corresponds to a view illustrating a front surface of the foldable flexible display device 3900 in an unfolding state. State 3930 corresponds to a view illustrating an example of a right central portion of the foldable flexible display device 3900. State 3955 corresponds to a view illustrating an example of an area in which the shield 3980 of the foldable flexible display device 3900 in an unfolding state is disposed. State 3970 corresponds to an example of a perspective view illustrating a side surface of the foldable flexible display device 3900 in a folding state. State 3990 corresponds to a view illustrating an example of a side surface of the foldable flexible display device 3900 in a folding state.

Referring to FIG. 39, as illustrated in state 3910, the foldable flexible display device 3900 according to an embodiment may include a first housing 110 and a second housing 120, and a hinge housing 3950 in which a hinge structure 300 disposed between the first housing 110 and the second housing 120 is disposed. According to various embodiments, the first housing 110 or the second housing 120 may include a first bezel 3911 or a second bezel 3921. For example, as illustrated in state 3930, the first bezel 3911 may include a first side bezel 3911a and a first upper bezel 3911b, and the second bezel 3921 may include a second side bezel 3921a and a second upper bezel 3921b. A shield 3980 that connects one side of the first upper bezel 3911b and one side of the second upper bezel 3921b may be disposed in the foldable flexible display device 3900. The shield 3980, for example, may include a first shaft 3980a, to which the first upper bezel 3911b is connected to be hinge-operated, a second shaft 3980b, to which the second upper bezel 3921b is connected to be hinge-operated, and a panel 3980c that connects the first shaft 3980a and the second shaft 3980b. A first shield groove 3911c (e.g., a groove that is cut in L shape) may be formed on one side of the first upper bezel 3911b of the area in which the shield 3980 is disposed. Similarly, a second shield groove 3921c may be formed on one side of the second upper bezel 3921b that is adjacent to an area in which the shield 3980 is disposed.

The height of the panel 3980c may be the thickness of the display 50 or more. The shields 3980 may be disposed at opposite peripheries of the display 50 with respect to a central portion of the display 50. In the illustrated drawing, state 3910, 3930, and 3955 illustrate an unfolding state of the foldable flexible display device 3900. States 3970 and 3990 illustrate a folding state of the foldable flexible display device 3900. The shields 3980 may be disposed such that the folding part of the display 50 is not exposed to the outside in a folding state of the foldable flexible display device 3900.

Each of the elements (e.g., a module or a program) according to various embodiments may include a single or a plurality of entities, and some of the corresponding sub-elements may be omitted or another sub-element may be further included in various embodiments. Alternatively or additionally, some elements (e.g., a module or a program) may be integrated into one entity to perform functions performed by the corresponding elements before the integration in the same way or similarly. The operations performed by a module, a program module, or another element according to various embodiments may be executed sequentially, in parallel, repeatedly, or heuristically, or at least some operations may be executed in another sequence or may be omitted, or another operation may be added.

While the disclosure has been shown and described with reference to various embodiments thereof, it will be understood by those skilled in the art that various changes in form and details may be made therein without departing from the spirit and scope of the disclosure as defined by the claims and their equivalents.

What is claimed is:

1. A portable communication device comprising:
  a flexible display including a first portion and a second portion;
  a first housing disposed to support at least a part of the first portion of the flexible display;
  a second housing disposed to support at least a part of the second portion of the flexible display; and
  a hinge structure configured to couple the first housing to the second housing,
  wherein the hinge structure comprises:
    a first front bracket configured to couple to the first housing,
    a second front bracket configured to couple to the second housing,
    a first main gear configured to rotate about a first axis,
    a second main gear configured to rotate about a second axis,
    a first idle gear and a second idle gear disposed between the first main gear and the second main gear and configured to rotate while the first main gear and the second main gear rotate,
    a first rotational member configured to couple to the first front bracket and to rotate along a first rail about a third axis while the first main gear rotates about the first axis, and
    a second rotational member configured to couple to the second front bracket and to rotate along a second rail about a fourth axis while the second main gear rotates about the second axis, and
  wherein a shortest distance from the third axis to an upper surface of the flexible display is shorter than a shortest distance from the first axis to the upper surface of the flexible display, in a state that the first portion of the flexible display and the second portion of the flexible display are unfolded to be coplanar to each other.

2. The portable communication device of claim 1, wherein a distance between the third axis and the fourth axis is shorter than a distance between the first axis and the second axis.

3. The portable communication device of claim 1, further comprising:
  a conductive plate located between the flexible display and a housing including the first housing and the second housing,
  wherein the conductive plate includes a lattice pattern in a central area configured to be bent when the first housing and the second housing are folded.

4. The portable communication device of claim 1, wherein the hinge structure further comprises:
  at least one support bracket configured to accommodate at least a portion of the first main gear or at least a portion of the second main gear.

5. The portable communication device of claim 4, wherein the portion of the first rotational member is configured to rotate about the third axis such that the first rotational member is disposed to be substantially perpendicular to the at least one support bracket when the first housing and the second housing are folded.

6. The portable communication device of claim 4, wherein the at least one support bracket comprises a first support bracket configured to accommodate at least a portion of the first main gear and a second support bracket configured to accommodate at least a portion of the second main gear.

7. The portable communication device of claim 6, wherein the first front bracket and the first rotational member are disposed symmetrically with the second front bracket and the second rotational member with respect to the first support bracket and the second support bracket.

8. The portable communication device of claim 6, wherein the first rotational member is disposed symmetrically with the second rotational member with respect to the first support bracket and the second support bracket.

9. The portable communication device of claim 6, wherein the first front bracket is disposed symmetrically with the second front bracket with respect to the first support bracket and the second support bracket.

10. The portable communication device of claim 4, wherein a side of the first rotational member is coupled with a side of the first front bracket, and
wherein a side of the second rotational member is coupled with a side of the second front bracket.

11. The portable communication device of claim 1, further comprising:
a first shaft formed in the first main gear configured to engage with the first idle gear; and
a second shaft formed in the second main gear configured to engage with the second idle gear,
wherein the first shaft is configured to engage with the second shaft through the first idle gear and the second idle gear.

12. The portable communication device of claim 1, wherein the first rotational member is configured to rotate clockwise while the second rotational member rotates counterclockwise.

13. The portable communication device of claim 1, further comprising:
a hinge housing in which at least a portion of the hinge structure is seated.

14. The portable communication device of claim 13, wherein at least a portion of the hinge housing, which is exposed when the flexible display is folded, is hidden by the first housing and the second housing when the flexible display is unfolded.

15. A portable communication device comprising:
a housing including a first housing portion and a second housing portion;
a flexible display accommodated in the first housing portion and the second housing portion, the flexible display including a folding portion configured to be folded according to the housing being folded;
a conductive plate disposed between the flexible display and the housing, and including a patterned area configured to be folded according to the folding portion of the flexible display being folded; and
a hinge structure disposed between the conductive plate and the housing, and coupled with the first housing portion and the second housing portion, the hinge structure including:

a plurality of gears including a first gear and a second gear disposed such that the first gear is configured to rotate about a first axis, and that the second gear is configured to rotate about a second axis;
a plurality of rotational members including a first rotational member and a second rotational member disposed such that the first rotational member is configured to rotate about a third axis while the first gear rotates, and that the second rotational member is configured to rotate about a fourth axis while the second gear rotates; and
a plurality of connecting members including a first connecting member and a second connecting member, the first connecting member coupled with the first rotational member and the first housing portion, and the second connecting member coupled with the second rotational member and the second housing portion,
wherein the plurality of gears include a third gear and a fourth gear disposed between the first gear and the second gear, the third gear configured to rotate about a fifth axis while the first gear rotates about the first axis, and the fourth gear configured to rotate about a sixth axis while the second gear rotates about the second axis.

16. The portable communication device of claim 15, wherein the hinge structure includes a supporting bracket including a rail portion along which a portion of the first rotational member is to rotate about the third axis while the first gear rotates about the first axis.

17. The portable communication device of claim 16, wherein the portion of the first rotational member is configured to rotate about the third axis such that the first rotational member is disposed to be substantially perpendicular to the supporting bracket when the housing is folded.

18. The portable communication device of claim 15, wherein the first gear is configured to engage with the second gear through the third gear and the fourth gear.

19. The portable communication device of claim 15, wherein a first shortest distance between the third axis and the fourth axis is shorter than a second shortest distance between the first axis and the second axis, or
wherein a first shortest distance from the third axis to an upper surface of the flexible display is shorter than a second shortest distance from the first axis to the upper surface of the flexible display, in a state that the first housing portion and the second housing portion are unfolded to be coplanar to each other.

20. The portable communication device of claim 15, wherein the first rotational member is configured to rotate clockwise while the second rotational member rotates counterclockwise.

21. The portable communication device of claim 15, further comprising:
a hinge housing in which at least a portion of the hinge structure is seated.

22. The portable communication device of claim 21, wherein at least a portion of the hinge housing, which is exposed when the flexible display is folded, is hidden by the first housing portion and the second housing portion when the flexible display is unfolded.

* * * * *